US009892996B2

(12) United States Patent
Kimura

(10) Patent No.: US 9,892,996 B2
(45) Date of Patent: Feb. 13, 2018

(54) SEMICONDUCTOR DEVICE, SEMICONDUCTOR DEVICE MANUFACTURING METHOD AND SEMICONDUCTOR DEVICE MOUNTING STRUCTURE

(71) Applicant: ROHM CO., LTD., Kyoto (JP)

(72) Inventor: Akihiro Kimura, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 0 days.

(21) Appl. No.: 15/265,176

(22) Filed: Sep. 14, 2016

(65) Prior Publication Data

US 2017/0005031 A1 Jan. 5, 2017

Related U.S. Application Data

(63) Continuation of application No. 14/549,920, filed on Nov. 21, 2014, now Pat. No. 9,484,336, which is a (Continued)

(30) Foreign Application Priority Data

Sep. 8, 2011 (JP) ................................ 2011-195828
Sep. 8, 2011 (JP) ................................ 2011-195829
(Continued)

(51) Int. Cl.
*H01L 23/495* (2006.01)
*H01L 23/373* (2006.01)
(Continued)

(52) U.S. Cl.
CPC .... *H01L 23/49541* (2013.01); *H01L 21/4853* (2013.01); *H01L 21/4882* (2013.01);
(Continued)

(58) Field of Classification Search
CPC ............... H01L 23/293; H01L 23/3121; H01L 23/3142; H01L 23/3157; H01L 23/373;
(Continued)

(56) References Cited

U.S. PATENT DOCUMENTS 5,041,902 A * 8/1991 McShane ............. H01L 23/367 257/706
5,216,283 A * 6/1993 Lin ......................... H01L 23/10 257/708

(Continued)

FOREIGN PATENT DOCUMENTS

JP 1997-153571 6/1997
JP 2002-83915 3/2002

(Continued)

OTHER PUBLICATIONS

Office Action, issued in the corresponding Japanese Patent application No. 2012-142779, dated Apr. 26, 2016, 4 pages.

(Continued)

*Primary Examiner* — Peniel M Gumedzoe
(74) *Attorney, Agent, or Firm* — Hamre, Schumann, Mueller & Larson, P.C.

(57) ABSTRACT

A semiconductor device includes a plurality of die pad sections, a plurality of semiconductor chips, each of which is arranged in each of the die pad sections, a resin encapsulation portion having a recess portion for exposing at least a portion of the die pad sections, the resin encapsulation portion configured to cover the die pad sections and the semiconductor chips, and a heat radiation layer arranged in the recess portion. The heat radiation layer includes an elastic layer exposed toward a direction in which the recess portion is opened. The heat radiation layer directly faces at least a portion of the die pad sections. The elastic layer
(Continued)

overlaps with at least a portion of the die pad sections when seen in a thickness direction of the heat radiation layer.

13 Claims, 57 Drawing Sheets

Related U.S. Application Data continuation of application No. 13/606,581, filed on Sep. 7, 2012, now Pat. No. 8,921,999.

(30) Foreign Application Priority Data

Sep. 8, 2011 (JP) ................................ 2011-195830
Jun. 26, 2012 (JP) ................................ 2012-142779

(51) Int. Cl.

| | |
|---|---|
| ***H01L 23/31*** | (2006.01) |
| ***H01L 21/48*** | (2006.01) |
| ***H01L 21/56*** | (2006.01) |
| ***H01L 23/433*** | (2006.01) |
| ***H01L 23/29*** | (2006.01) |
| ***H01L 27/02*** | (2006.01) |
| *H01L 23/00* | (2006.01) |

(52) U.S. Cl.

CPC .......... *H01L 21/561* (2013.01); *H01L 21/565* (2013.01); *H01L 23/293* (2013.01); *H01L 23/3121* (2013.01); *H01L 23/3142* (2013.01); *H01L 23/3157* (2013.01); *H01L 23/373* (2013.01); *H01L 23/3731* (2013.01); *H01L 23/4334* (2013.01); *H01L 23/49503* (2013.01); *H01L 23/49555* (2013.01); *H01L 23/49568* (2013.01); *H01L 23/49575* (2013.01); *H01L 23/49589* (2013.01); *H01L 27/0211* (2013.01); *H01L 24/73* (2013.01); *H01L 2224/32245* (2013.01); *H01L 2224/48091* (2013.01); *H01L 2224/48137* (2013.01); *H01L 2224/48247* (2013.01); *H01L 2224/73265* (2013.01); *H01L 2924/13055* (2013.01); *H01L 2924/181* (2013.01)

(58) Field of Classification Search

CPC ............. H01L 23/3731; H01L 23/4334; H01L 23/4853; H01L 23/4882; H01L 23/49541; H01L 23/49503; H01L 23/49555; H01L 23/49568; H01L 23/49575; H01L 23/49589; H01L 23/561; H01L 23/565; H01L 27/0211

See application file for complete search history.

(56) References Cited

U.S. PATENT DOCUMENTS

| | | | | |
|---|---|---|---|---|
| 5,440,169 | A * | 8/1995 | Tomita | H01L 23/3107 257/667 |
| 5,814,878 | A * | 9/1998 | Hirakawa | H01L 21/565 257/667 |
| 6,979,909 | B2 | 12/2005 | Shinohara | |
| 2001/0048148 | A1* | 12/2001 | Koyama | H01L 23/49562 257/666 |
| 2001/0052639 | A1 | 12/2001 | Jeon et al. | |
| 2008/0036057 | A1* | 2/2008 | Chou | H01L 23/3107 257/676 |
| 2008/0283978 | A1* | 11/2008 | Aripin | H01L 23/4334 257/670 |
| 2012/0080297 | A1 | 4/2012 | Takeuchi et al. | |
| 2012/0236503 | A1 | 9/2012 | Asada et al. | |

FOREIGN PATENT DOCUMENTS

| | | |
|---|---|---|
| JP | 2003-168769 | 6/2003 |
| JP | 2007-311483 | 11/2007 |
| JP | 2008-101227 | 5/2008 |
| JP | 2009-105389 | 5/2009 |
| JP | 2009-302526 | 12/2009 |
| JP | 2010-272556 | 12/2010 |

OTHER PUBLICATIONS

Japanese Office Action, issued in the corresponding Japanese patent application No. 2016-250437, dated Oct. 24, 2017, 23 pages.

* cited by examiner

SEMICONDUCTOR DEVICE, SEMICONDUCTOR DEVICE MANUFACTURING METHOD AND SEMICONDUCTOR DEVICE MOUNTING STRUCTURE

CROSS-REFERENCE TO RELATED APPLICATIONS

This application is a Continuation of application Ser. No. 14/549,920, filed Nov. 21, 2014, which is a Continuation of application Ser. No. 13/606,581, filed Sep. 7, 2012 (now U.S. Pat. No. 8,921,999, issued Dec. 30, 2014), which is based upon and claims the benefit of priority from Japanese Patent Application Nos. 2011-195828, 2011-195829 and 2011-195830, filed on Sep. 8, 2011 and 2012-142779, filed on Jun. 26, 2012, the entire contents of which are incorporated herein by reference.

TECHNICAL FIELD

The present disclosure relates to a semiconductor device, a semiconductor device manufacturing method, a semiconductor device mounting structure and a power semiconductor device.

BACKGROUND

Various types of semiconductor devices are known. One of a semiconductor device is a device called an IPM (Intelligent Power Module). This semiconductor device includes a plurality of semiconductor chips, a plurality of die pad portions, a heat radiation plate, a joining layer and an encapsulating resin. The semiconductor chips are respectively arranged in the die pad portions. The die pad portions are joined to the heat radiation plate through the joining layer. The encapsulating resin covers the semiconductor chips, the die pad portions, the heat radiation plate and the joining layer. An IPM semiconductor device is known in the art.

Some semiconductor devices are mounted on a substrate (circuit substrate). When an IPM semiconductor device is mounted on a substrate, the heat radiation plate directly faces a relatively large radiator existing outside the semiconductor device. In order to assure good heat transfer between the heat radiation plate and the radiator, heat radiating grease is often interposed between the heat radiation plate and the radiator. Therefore, each time the semiconductor device is mounted on the substrate, it is necessary to apply the heat radiating grease on the heat radiation plate or the radiator. This poses an impediment in efficiently mounting the semiconductor device.

It is costly to come by an adhesive agent that will become the joining layer in the semiconductor device. In a manufacturing process of the semiconductor device, the die pad portions and the heat radiation plate are joined together prior to forming a resin encapsulation portion. Forming the resin encapsulation portion and joining the die pad portions and the heat radiation plate together are performed independently of each other. This hampers manufacturing efficiency of the semiconductor device.

Different sorts of semiconductor devices are known in the art. As one example of the different semiconductor devices, a semiconductor device including a semiconductor chip, a die pad portion, an encapsulating resin and a heat sink is available. The semiconductor chip is arranged in the die pad portion. The heat sink is adhesively joined to the opposite surface of the die pad portion from the surface on which the semiconductor chip is arranged. The encapsulating resin covers the semiconductor chip, the die pad portion and the heat sink. The heat sink and the adhesive agent used in manufacturing the semiconductor device are relatively expensive. This makes it difficult to sufficiently reduce the manufacturing cost of the semiconductor device.

In a related art, an integrated circuit device (a semiconductor device) is configured to cover a lead frame with a resin having a high heat radiation property. In this related art, a heat sink is not joined to a die pad portion by an adhesive agent. This makes it possible to reduce the cost involved in providing a heat sink and an adhesive agent.

More specifically, the integrated circuit device disclosed in the related art includes a lead frame, a power element and a resin. The power element is mounted on the lead frame. The resin includes a low stress resin and a high heat radiation resin. The low stress resin covers the power element and the lead frame. The high heat radiation resin covers the opposite surface of the lead frame from the surface on which the power element is arranged. In the integrated circuit device disclosed in the related art, an attempt is made to prevent exfoliation of the high heat radiation resin from the low stress resin. However, if the high-heat radiating resin and the lead frame are not strongly joined together, the high-heat radiating resin may be separated from the lead frame even though the high-heat radiating resin and the low stress resin are firmly bonded together.

SUMMARY

The present disclosure provides some embodiments of a semiconductor device capable of being efficiently mounted on a substrate.

The present disclosure provides some embodiments of a semiconductor device manufacturing method capable of reducing manufacturing cost and assuring efficient manufacture of the semiconductor device.

The present disclosure provides some embodiments of a semiconductor device capable of suppressing exfoliation of a resin encapsulation portion and performing superior heat dissipation.

According to one aspect of the present disclosure, there is provided a semiconductor device, including a plurality of die pad sections, a plurality of semiconductor chips, a resin encapsulation portion, and a heat radiation layer. Each of semiconductor chips is arranged in each of the die pad sections. The resin encapsulation portion has a recess portion for exposing at least a portion of the die pad sections and is configured to cover the die pad sections and the semiconductor chips. The heat radiation layer is insulating and arranged in the recess portion. The heat radiation layer includes an elastic layer exposed toward a direction in which the recess portion is opened, and directly faces at least a portion of the die pad sections. The elastic layer overlaps with at least a portion of the die pad sections when seen in a thickness direction of the heat radiation layer.

In one embodiment of the present disclosure, the resin encapsulation portion may include a resin bottom surface. The recess portion may be depressed from the resin bottom surface. The heat radiation layer may have a section protruding beyond the resin bottom surface.

In some embodiments, the recess portion may have a recess bottom surface from which the die pad sections are exposed, and the recess bottom surface may make direct contact with the heat radiation layer.

All the die pad sections may make direct contact with the heat radiation layer.

In some embodiments, the recess portion may have a recess side surface surrounding the heat radiation layer, and the recess side surface may be spaced apart from the heat radiation layer with a gap left therebetween.

In some embodiments, each of the die pad sections may have a die pad rear surface with which the heat radiation layer makes direct contact, and the die pad rear surface may be an irregular surface.

In some embodiments, the recess bottom surface may make direct contact with the heat radiation layer, and the recess bottom surface may be an irregular surface.

In some embodiments, the heat radiation layer may overlap with all the die pad sections when seen in the thickness direction of the heat radiation layer.

In some embodiments, the heat radiation layer may be formed of only the elastic layer.

In some embodiments, the elastic layer may make contact with all the die pad sections.

In some embodiments, the Young's modulus of the elastic layer may be smaller than the Young's modulus of the resin encapsulation portion.

In some embodiments, the thickness of the heat radiation layer may be from 50 μm to 500 μm.

According to another aspect of the present disclosure, there is provided a semiconductor device manufacturing method. The semiconductor device manufacturing method includes preparing a plurality of semiconductor chips and a lead frame having a plurality of die pad sections, arranging each of the semiconductor chips in each of the die pad sections, forming a resin encapsulation portion covering the die pad sections and the semiconductor chips, and forming a heat radiation layer directly facing at least a portion of the die pad sections. Here, the heat radiation layer includes an elastic layer. A recess portion is formed when forming the resin encapsulation portion. The heat radiation layer is formed in the recess portion and the elastic layer is exposed from the recess portion when forming the heat radiation layer.

In some embodiments, the resin encapsulation portion may have a resin bottom surface. The recess portion may be depressed from the resin bottom surface. The heat radiation layer may protrude from the resin bottom surface when forming the heat radiation layer.

In some embodiments, the recess portion may have a recess side surface. The heat radiation layer may be spaced apart from the recess side surface with a gap left therebetween when forming the heat radiation layer.

In some embodiments, the method may further include performing a blasting process to the die pad sections after forming the resin encapsulation portion and before forming the heat radiation layer.

In some embodiments, the recess portion may have a recess bottom surface from which the die pad sections are exposed. The recess bottom surface may be subjected to the blasting process when performing the blasting process.

In some embodiments, the Young's modulus of the elastic layer may be smaller than the Young's modulus of the resin encapsulation portion.

In some embodiments, a heat radiation sheet may be embedded into the recess portion when forming the heat radiation layer.

According to still another aspect of the present disclosure, there is provided a semiconductor device mounting structure, including the semiconductor device provided by the above aspect of the present disclosure, a substrate to which the semiconductor device is mounted, and a heat radiator fixed to the substrate. In this configuration, the heat radiation member makes direct contact with the elastic layer.

According to yet another aspect of the present disclosure, there is provided a power semiconductor device, including a plurality of die pad sections, a plurality of power chips, and a LSI chip, a resin encapsulation portion, and a heat radiation layer. In this configuration, each of the power chips is arranged in each of the die pad sections and is provided with a heat generating portion. The LSI chip is configured to control the power chips. The resin encapsulation portion has a recess portion for exposing at least a portion of the die pad sections, and is configured to cover the die pad sections and the power chips. The heat radiation layer is insulating and is arranged in the recess portion. The heat radiation layer includes an elastic layer exposed toward a direction in which the recess portion is opened, and directly faces at least a portion of the die pad sections. The elastic layer overlaps with at least a portion of the die pad sections when seen in a thickness direction of the heat radiation layer.

According to yet another aspect of the present disclosure, there is provided a semiconductor device manufacturing method. The semiconductor device manufacturing method includes preparing a semiconductor chip, a heat radiation plate and a lead frame having a die pad section, joining the semiconductor chip to the die pad section, setting the heat radiation plate to directly face the die pad section, and forming a resin encapsulation portion that covers the semiconductor chip, the heat radiation plate and the die pad section. Here, the heat radiation plate and the die pad section are joined by the resin encapsulation portion when forming the resin encapsulation portion.

In some embodiments, the die pad section may have a die pad major surface and a die pad rear surface. The semiconductor chip may be joined to the die pad major surface when joining the semiconductor chip. The heat radiation plate may be turned to directly face the die pad rear surface when setting the heat radiation plate to directly face the die pad section.

In some embodiments, the heat radiation plate may be exposed from the resin encapsulation portion when forming the resin encapsulation portion.

In some embodiments, the method may further include preparing a first mold and a second mold. Forming the resin encapsulation portion may include enclosing the heat radiation plate, the die pad section and the semiconductor chip with the first mold and the second mold, and after enclosing the heat radiation plate, injecting a resin material into a space surrounded by the first mold and the second mold. Here, the heat radiation plate and the die pad section may not be bonded to each other when the resin material is injected.

In some embodiments, the first mold may have a recess portion. Forming the resin encapsulation portion may include, before enclosing the heat radiation plate, arranging the heat radiation plate in the recess portion.

According to yet another aspect of the present disclosure, there is provided a semiconductor device, including a die pad section, a semiconductor chip joined to the die pad section, a heat radiation plate spaced apart from the die pad section, and a resin encapsulation portion configured to cover at least semiconductor-chip-side regions of the die pad section, the semiconductor chip and the heat radiation plate. In this configuration, the resin encapsulation portion includes an intermediate section existing between the heat radiation plate and the die pad section, and the intermediate section makes direct contact with the heat radiation plate and the die pad section.

According to yet another aspect of the present disclosure, there is provided a semiconductor device, including a die pad section, a semiconductor chip joined to the die pad section, a heat radiation plate making direct contact with the die pad section, and an resin encapsulation portion configured to cover at least semiconductor-chip-side regions of the die pad section, the semiconductor chip and the heat radiation plate.

In some embodiments, the die pad section may have a die pad major surface and a die pad rear surface, and the semiconductor chip may be joined to the die pad major surface. The heat radiation plate may have a major surface directly facing the die pad rear surface.

In some embodiments, the heat radiation plate may have a rear surface facing toward the direction opposite the major surface of the heat radiation plate. The rear surface of the heat radiation plate may be exposed from the resin encapsulation portion.

In some embodiments, the resin encapsulation portion may have a resin bottom surface facing toward the same direction as the facing direction of the rear surface of the heat radiation plate. The heat radiation plate may have a section protruding in a direction facing the rear surface of the heat radiation plate beyond the resin bottom surface.

In some embodiments, the heat radiation plate may include a dropout prevention unit protruding from the rear surface of the heat radiation plate when seen in a thickness direction of the die pad section. The dropout prevention unit may be positioned at the facing direction of the major surface of the heat radiation plate with respect to the resin encapsulation portion.

In some embodiments, the heat radiation plate may have a side surface perpendicular to the rear surface of the heat radiation plate.

In some embodiments, the heat radiation plate may be made of an electrically conductive material.

In some embodiments, the electrically conductive material may be aluminum, copper, copper alloy or iron.

In some embodiments, the semiconductor device may further include a spacer existing between the die pad section and the heat radiation plate, the spacer made of an insulating material.

In some embodiments, the heat radiation plate may be made of an insulating material.

In some embodiments, the insulating material may be ceramic.

In some embodiments, the ceramic may be alumina, aluminum nitride or silicon nitride.

In some embodiments, the heat radiation plate may include a concave-convex section or a groove formed in a peripheral portion of the major surface of the heat radiation plate.

In some embodiments, the semiconductor device may further include a joining layer existing between the semiconductor chip and the die pad section to join the semiconductor chip and the die pad section together.

According to still another aspect of the present disclosure, there is provided a semiconductor device mounting structure, including the semiconductor device provided by the above aspect of the present disclosure, a substrate to which the semiconductor device is mounted, and a heat radiation member which is fixed with respect to the substrate and configured to directly face the heat radiation plate.

According to yet another aspect of the present disclosure, there is provided an IPM semiconductor device. The IPM semiconductor includes the semiconductor chip as a power chip. The IPM semiconductor device further includes an LSI chip configured to control the power chip. In this configuration, the heat radiation plate is arranged at a rear surface side of the die pad section to which the power chip is mounted.

According to yet another aspect of the present disclosure, there is provided a semiconductor device, including an electrically conductive die pad section having a die pad major surface and a die pad rear surface, both of which face toward the opposite directions from each other, a semiconductor chip arranged in the die pad major surface, a first resin encapsulation portion covering the die pad major surface and the semiconductor chip, and a second resin encapsulation portion making direct contact with the first resin encapsulation portion. The second resin encapsulation portion has a resin bottom surface exposed toward a direction toward which the die pad rear surface faces. The resin bottom surface overlaps with the die pad section when seen in a thickness direction of the die pad section. The die pad rear surface has a concave-convex section with which the second resin encapsulation portion makes direct contact.

In some embodiments, the heat conductivity of a material making up the second resin encapsulation portion may be larger than the heat conductivity of a material making up the first resin encapsulation portion.

In some embodiments, the semiconductor device may further include a plurality of heat radiating fillers dispersed in the second resin encapsulation portion, In some embodiments, the heat conductivity of a material making up the heat radiating fillers may be larger than the heat conductivity of a material making up the second resin encapsulation portion.

In some embodiments, the heat radiating fillers may be pulverized fillers.

In some embodiments, the pulverized fillers may be made of alumina, silicon dioxide or boron nitride.

In some embodiments, the semiconductor device may further include a plurality of low-thermal-expansion fillers dispersed in the first resin encapsulation portion.

In some embodiments, the thermal expansion coefficient of a material making up the low-thermal-expansion fillers may be smaller than the thermal expansion coefficient of a material making up the first resin encapsulation portion.

In some embodiments, the low-thermal-expansion fillers may be spherical fillers.

In some embodiments, the spherical fillers may be made of silicon dioxide.

In some embodiments, the first resin encapsulation portion may have a first resin surface with which the second resin encapsulation portion makes direct contact. The first resin surface may have a concave-convex section.

In some embodiments, the first resin surface may be flush with the die pad rear surface.

In some embodiments, the first resin surface may be positioned between the die pad rear surface and the die pad major surface in the thickness direction of the die pad section.

In some embodiments, the first resin encapsulation portion may include a protrusion section extending into the second resin encapsulation portion.

In some embodiments, the second resin encapsulation portion may overlap with the entire die pad section when seen in the thickness direction of the die pad section.

In some embodiments, the first resin encapsulation portion may have a resin major surface facing the same direction as the die pad major surface faces. The resin major surface may overlap with the die pad section when seen in the thickness direction of the die pad section.

In some embodiments, the first resin encapsulation portion may have a resin side surface surrounding the semiconductor chip. The resin side surface may be inclined with respect to the resin major surface so as to form an obtuse angle with the resin major surface.

In some embodiments, the resin bottom surface may be 100 μm to 250 μm spaced apart from the die pad rear surface.

In some embodiments, the heat conductivity of the second resin encapsulation portion may be from 2 W/mK to 5 W/mK.

In some embodiments, the second resin encapsulation portion may have a resin wall surface shaped to surround the die pad section when seen in the thickness direction of the die pad section. The resin wall surface may be inclined with respect to the resin bottom surface so as to form an obtuse angle with the resin bottom surface.

According to yet another aspect of the present disclosure, there is provided a semiconductor device mounting structure, including the semiconductor device provided by the above aspect of the present disclosure, a substrate to which the semiconductor device is mounted, and a heat radiator directly facing the resin bottom surface.

According to yet another aspect of the present disclosure, there is provided a semiconductor device manufacturing method. The semiconductor device manufacturing method includes preparing a semiconductor chip and a die pad section having a die pad major surface and a die pad rear surface, arranging the semiconductor chip in the die pad major surface, forming a first resin encapsulation portion covering the die pad major surface and the semiconductor chip, forming a concave-convex section on the die pad rear surface, and forming a second resin encapsulation portion covering the concave-convex section of the die pad rear surface.

In some embodiments, the die pad rear surface may be subjected to a blasting process when forming the concave-convex section.

In some embodiments, forming the concave-convex section may be performed after forming the first resin encapsulation portion. Forming the second resin encapsulation portion may be performed after forming the concave-convex section.

In some embodiments, the method may further include performing the blasting process to the first resin encapsulation portion at the same time when the die pad rear surface is subjected to a blasting process.

According to yet another aspect of the present disclosure, there is provided a power semiconductor device, including a power chip having a heat generating portion, an LSI chip configured to control the power chip, the power chip and the LSI chip encapsulated by a resin, a first resin encapsulation portion covering the power chip and the LSI chip, and a second resin encapsulation portion making direct contact with the first resin encapsulation portion. The first resin encapsulation portion and the second resin encapsulation portion are provided with contact surfaces having concave-convex sections rougher than surfaces exposed to the outside.

Other features and advantages of the present disclosure will become more apparent from the following detailed description given in conjunction with the accompanying drawings.

DETAILED DESCRIPTION

Certain embodiments of the present disclosure will now be described in detail with reference to the drawings.

First Embodiment

Figure 1:
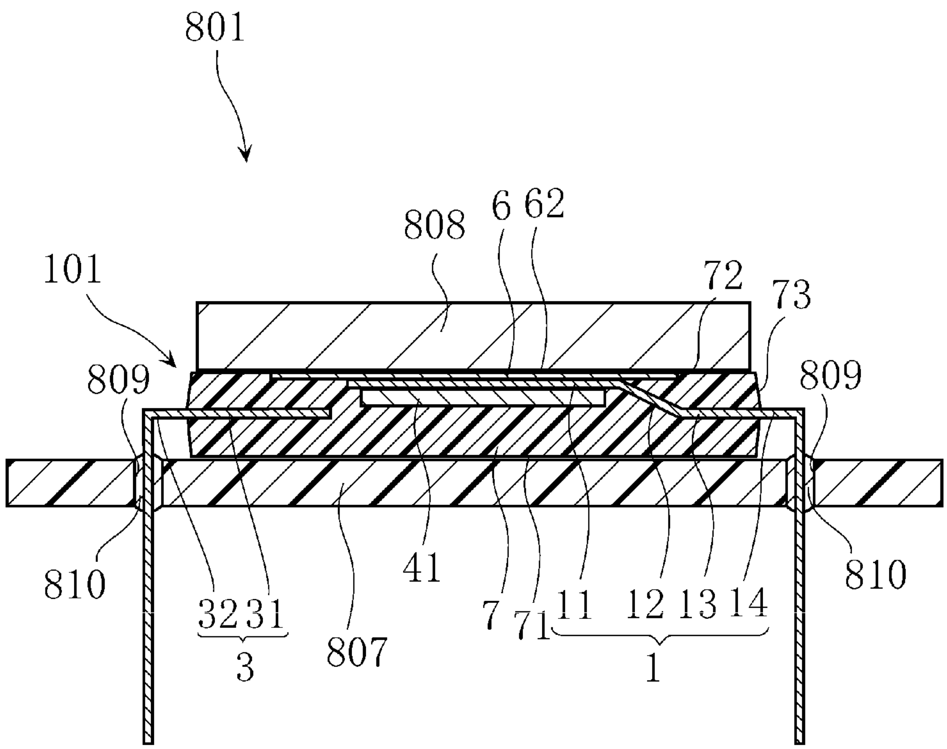
FIG. 1 is a section view illustrating a mounting structure of a semiconductor device according to a first embodiment of the present disclosure.
Figure 1:
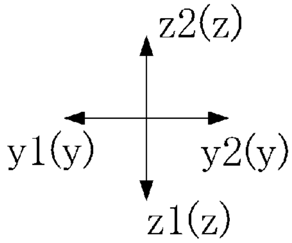

FIG. 1 is a section view illustrating a mounting structure of a semiconductor device according to a first embodiment of the present disclosure.

The mounting structure 801 of the semiconductor device shown in FIG. 1 includes a semiconductor device 101, a substrate 807 and a heat radiation member 808.

A plurality of electronic parts is mounted on the substrate 807. The substrate 807 is made of an insulating material. A wiring pattern not shown is formed in the substrate 807. A plurality of holes 809 is formed in the substrate 807. The heat radiation member 808 is made of a material having relatively high heat conductivity, e.g., a metal such as aluminum. The heat radiation member 808 is fixed with respect to the substrate 807 by a support member not shown. The semiconductor device 101 is mounted on the substrate 807. In the present embodiment, the semiconductor device 101 is an article called an IPM (Intelligent Power Module). The semiconductor device 101 has applications in, e.g., an air conditioner or a motor control device.

Figure 2:
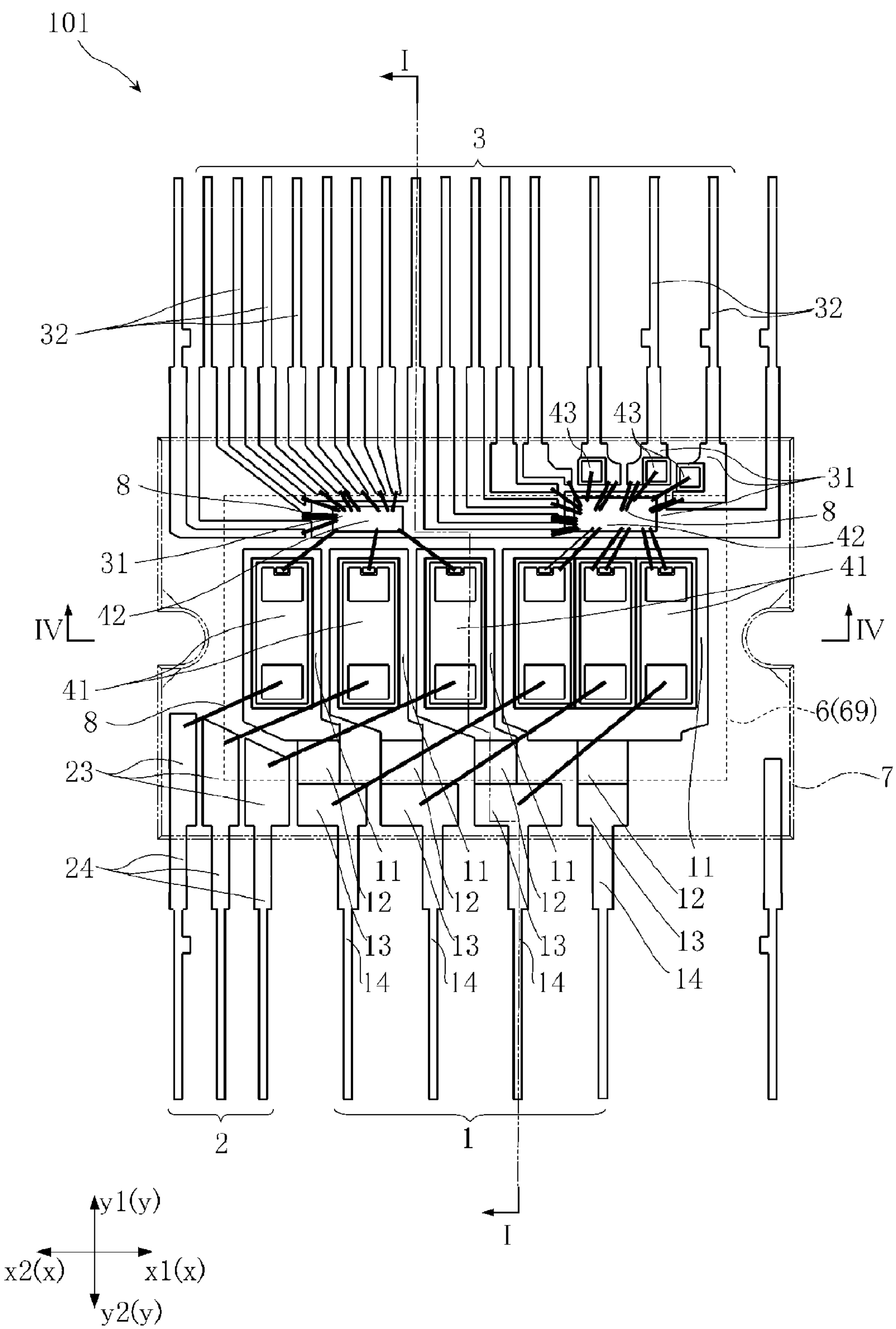
FIG. 2 is a (partially cut away) plan view of the semiconductor device according to the first embodiment of the present disclosure prior to bending the leads.
Figure 3:
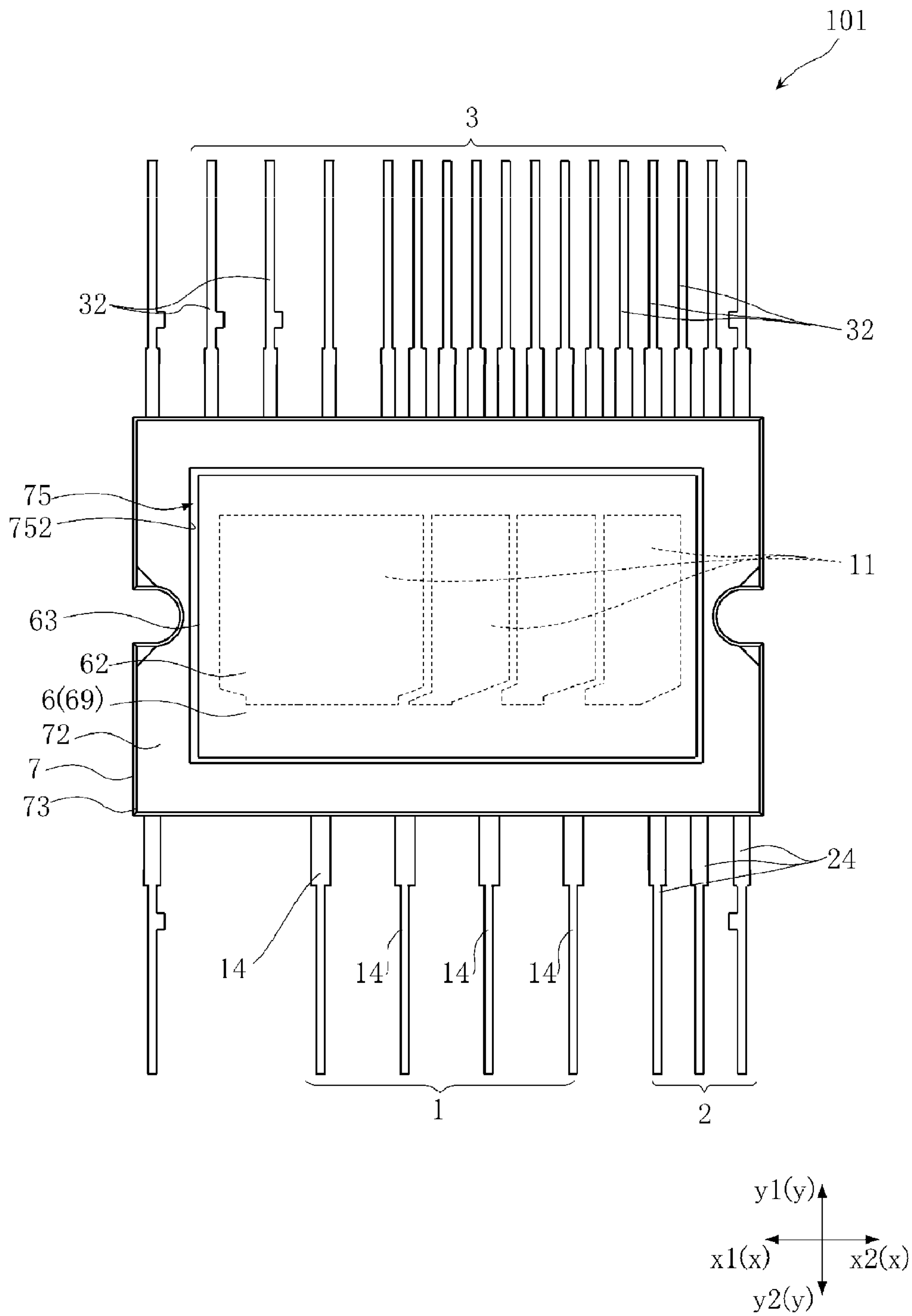
FIG. 3 is a bottom view of the semiconductor device according to the first embodiment of the present disclosure prior to bending the leads.
Figure 4:
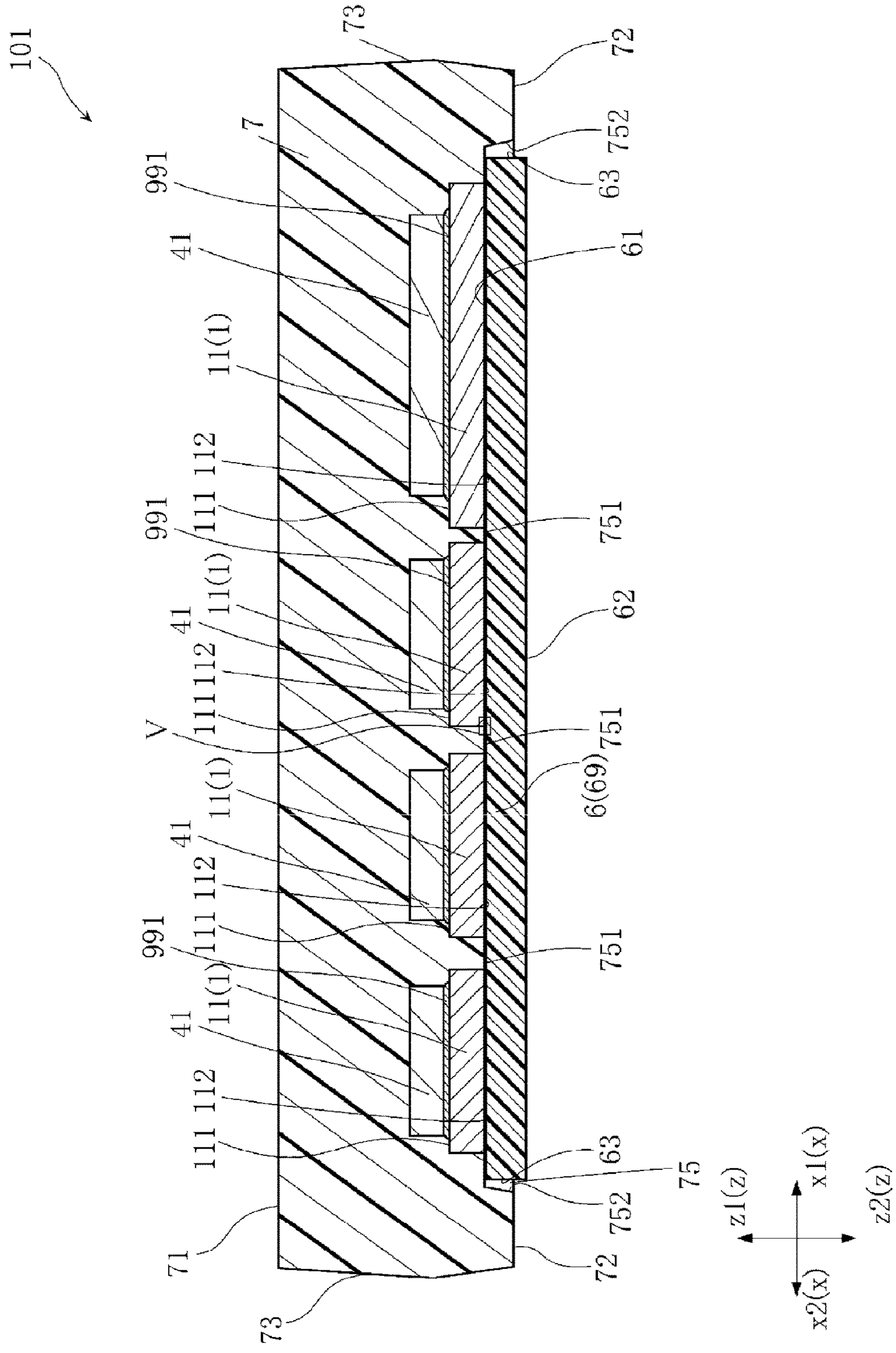
FIG. 4 is a section view taken along line Iv-Iv in FIG. 2.
Figure 5:
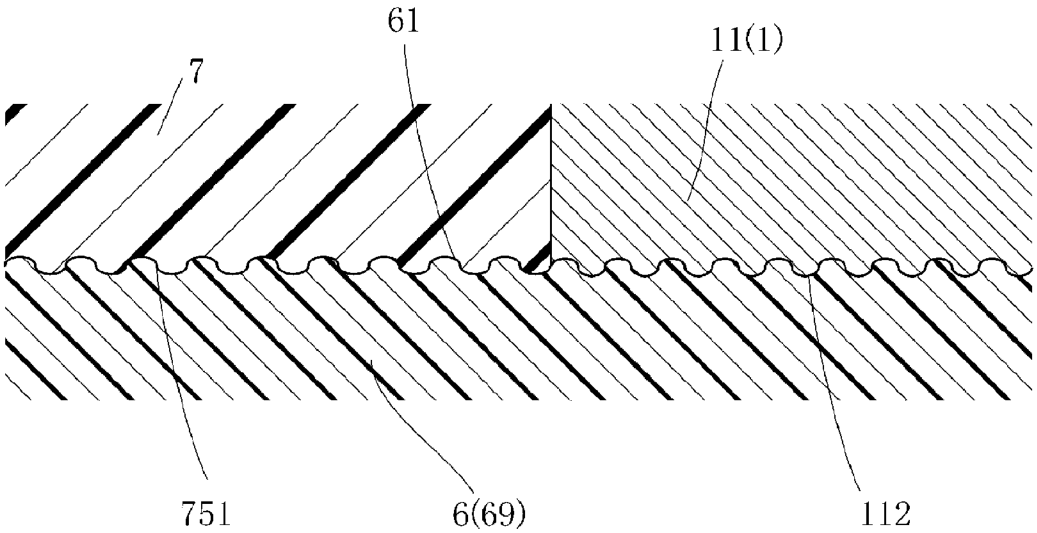
FIG. 5 is a partially enlarged view of the region V in FIG. 4.

FIG. 2 is a (partially cut away) plan view of the semiconductor device according to the first embodiment of the present disclosure prior to bending the leads. FIG. 3 is a bottom view of the semiconductor device according to the first embodiment of the present disclosure prior to bending the leads. FIG. 4 is a section view taken along line IV-IV in FIG. 2. FIG. 5 is a partially enlarged view of the region V in FIG. 4. FIG. 1 corresponds to the cross section taken along line I-I in FIG. 2. In FIG. 4, the respective components are schematically shown for the sake of understanding.

The semiconductor device 101 shown in these figures includes a plurality of first electrode portions 1, a plurality of second electrode portions 2, a plurality of third electrode portions 3, a plurality of semiconductor chips 41 and 42, a plurality of passive chips 43, a heat radiation layer 6, a resin encapsulation portion 7 and wires 8. In FIG. 2, the heat radiation layer 6 is indicated by a dotted line and the resin encapsulation portion 7 is indicated by an imaginary line.

The resin encapsulation portion 7 covers the first electrode portions 1, the second electrode portions 2, the third electrode portions 3, the semiconductor chips 41 and 42 and the passive chips 43. The resin encapsulation portion 7 is made of, e.g., a black epoxy resin. As shown in FIGS. 3 and 4, the resin encapsulation portion 7 has a resin major surface 71, a resin bottom surface 72 and a resin side surface 73.

The resin major surface 71 is a smooth surface facing in the direction z1 and extending along the x-y plane. The resin bottom surface 72 is a smooth surface facing in the direction z2 opposite to the direction z1 and extending along the x-y plane. The resin side surface 73 is shaped to surround the semiconductor chips 41 and 42 and the passive chips 43 when seen in an x-y plane view. The resin side surface 73 is joined to the resin major surface 71 and the resin bottom surface 72.

As shown in FIG. 4, a recess portion 75 is formed in the resin encapsulation portion 7. The recess portion 75 is depressed from the resin bottom surface 72. The recess portion 75 has a recess bottom surface 751 and a recess side surface 752. The recess bottom surface 751 is shaped to extend along the x-y plane. In the present embodiment, as shown in FIG. 5, the recess bottom surface 751 is an irregular surface having a fine concave-convex shape. The recess bottom surface 751 is converted to the irregular surface by subjecting the resin encapsulation portion 7 to a blasting process (to be described later). The height difference of the recess bottom surface 751 is in some embodiments, e.g., from 0.1 μm to 1 μm.

The recess side surface 752 is joined to the recess bottom surface 751 and the resin bottom surface 72. The recess side surface 752 is formed into a taper shape and is inclined with respect to the z direction. The recess side surface 752 is inclined with respect to the z direction such that, as the recess side surface 752 extends in the direction z2, the recess side surface 752 goes away from the recess bottom surface 751 when seen in an x-y plane view.

As shown in FIG. 2, the semiconductor chips 41 and 42 and the passive chips 43 have a rectangular shape when seen in a plan view. The semiconductor chips 41 are, e.g., power chips such as an IGBT, a MOS and a diode. The semiconductor chips 42 are, e.g., LSI chips such as a control IC. The passive chips 43 are, e.g., passives such as a resistor and a capacitor.

The first electrode portions 1, the second electrode portions 2 and the third electrode portions 3 shown in FIGS. 2 through 4 are all made of an electrically conductive material. The electrically conductive material may be, e.g., copper. The electrode portion shown in the right lower region in FIG. 2 is connected to the ground.

Each of the first electrode portions 1 (four first electrode portions 1 in the present embodiment) includes a die pad section 11 (see FIGS. 1, 2 and 4), a connecting section 12 (see FIGS. 1 and 2), a wire bonding section 13 (see FIGS. 1 and 2) and a lead 14 (see FIGS. 1 through 3). The first electrode portions 1 are spaced apart from one another in the x direction.

Each of the die pad sections 11 is formed into a plate-like shape to extend along the x-y plane. Each of the semiconductor chips 41 is arranged in each of the die pad sections 11. As shown in FIG. 4, a joining layer 991 exists between each of the die pad sections 11 and each of the semiconductor chips 41. The joining layer 991 is made of an electrically conductive material. The electrically conductive material is, e.g., a solder or a silver paste. The solder is relatively high in heat conductivity. If the solder is used as the joining layer 991, it becomes possible to efficiently transfer heat from each of the semiconductor chips 41 to each of the die pad sections 11. The die pad sections 11 are all exposed from the recess bottom surface 751.

Each of the die pad sections 11 has a die pad major surface 111 and a die pad rear surface 112. The die pad major surface 111 faces in the direction z1. The die pad rear surface 112 faces in the direction z2. That is to say, the die pad major surface 111 and the die pad rear surface 112 face in opposite directions from each other. Each of the semiconductor chips 41 is arranged in the die pad major surface 111. The joining layer 991 exists between the die pad major surface 111 and each of the semiconductor chips 41. The die pad rear surface 112 is positioned in the same position as the recess bottom surface 751 in the thickness direction of the die pad sections 11 (in the z direction). The die pad rear surface 112 may be positioned at the open side of the recess portion 75 with respect to the recess bottom surface 751. In the present embodiment, as shown in FIG. 5, the die pad rear surface 112 is an irregular surface having a fine concave-convex shape. The die pad rear surface 112 is converted to the irregular surface by performing a blasting process to the die pad sections 11 (to be described later). The height difference of the die pad rear surface 112 (the height difference between the top and bottom ends of the concave portions) is in some embodiments, e.g., from 0.01 μm to 1 μm.

As shown in FIG. 2, each of the connecting sections 12 is positioned between each of the die pad sections 11 and each of the wire bonding sections 13 and is joined to each of the die pad sections 11 and each of the wire bonding sections 13. As shown in FIG. 1, each of the connecting sections 12 is shaped to extend along a surface inclined with respect to the x-y plane. Each of the connecting sections 12 is inclined with respect to the x-y plane such that each of the connecting sections 12 extends in the direction z1 as it goes away from each of the die pad sections 11.

Each of the wire bonding sections 13 shown in FIGS. 1 and 2 is shaped to extend along the x-y plane. Each of the wire bonding sections 13 is positioned in the z1 direction with respect to each of the die pad sections 11 in the z direction. The wires 8 are bonded to each of the wire bonding sections 13 and each of the semiconductor chips 41, whereby each of the wire bonding sections 13 and each of the semiconductor chips 41 are electrically connected to each other. Each of the leads 14 is joined to each of the wire bonding sections 13. Each of the leads 14 extends along the y direction. Each of the leads 14 has a section protruding from the resin side surface 73 of the resin encapsulation portion 7. In the present embodiment, the leads 14 are used for an insertion-mounting purpose. As shown in FIG. 1, when the semiconductor device 101 is mounted on the substrate 807, each of the leads 14 is bent and inserted into each of the holes 809. A solder layer 810 fills each of the holes 809 in order to fix the leads 14 to the substrate 807.

As shown in FIG. 2, each of the second electrode portions 2 (three second electrode portions 2 in the present embodiment) includes a wire bonding section 23 and a lead 24. The second electrode portions 2 are spaced apart from one another in the x direction.

Each of the wire bonding sections 23 is shaped to extend along the x-y plane. Each of the wire bonding sections 23 is positioned in the z1 direction with respect to each of the die pad sections 11 in the z direction. The wires 8 are bonded to each of the wire bonding sections 23 and each of the semiconductor chips 41, whereby each of the wire bonding sections 23 and each of the semiconductor chips 41 are electrically connected to each other. Each of the leads 24 is joined to each of the wire bonding sections 23. Each of the leads 24 extends along the y direction. Each of the leads 24 has a section protruding from the resin side surface 73 of the resin encapsulation portion 7. In the present embodiment, the leads 24 are used for an insertion-mounting purpose. While not shown in the drawings, just like the leads 14, each of the leads 24 is inserted into each of the holes 809 when the semiconductor device 101 is mounted on the substrate 807.

The third electrode portions 3 shown in FIGS. 1 and 2 include a plurality of control die pad sections 31 and a plurality of leads 32. The control die pad sections 31 and the leads 32 are all arranged in the same position in the z direction. The semiconductor chips 42 or the passive chips 43 are arranged in the respective control die pad sections 31. Joining layers (not shown) exist between the control die pad sections 31 and the semiconductor chips 42, and between the control die pad sections 31 and the passive chips 43. The rear surfaces of the control die pad sections 31 may not face the heat radiation layer 6 and may not be exposed.

Each of the leads 32 has a section protruding from the resin side surface 73 of the resin encapsulation portion 7. In the present embodiment, the leads 32 are used for the insertion-mounting purpose. As shown in FIG. 1, the leads 32 are inserted into the holes 809 when the semiconductor device 101 is mounted on the substrate 807. As described above with respect to the leads 14, a solder layer 810 fills the holes 809 in order to fix the leads 32 to the substrate 807. The wires 8 are bonded to each of the leads 32 and each of the semiconductor chips 42, whereby each of the leads 32 and each of the semiconductor chips 42 are electrically connected to each other. The wires 8 are also bonded to each of the semiconductor chips 42 and each of the passive chips 43.

The heat radiation layer 6 has an insulating property. As shown in FIG. 4, the heat radiation layer 6 is arranged in the recess portion 75 of the resin encapsulation portion 7. The heat radiation layer 6 is surrounded by the recess side surface 752. In the present embodiment, the heat radiation layer 6 is formed into a plate-like shape to extend along the x-y plane. The heat radiation layer 6 makes direct contact with the die pad sections 11 on which the semiconductor chips 41 are mounted. More specifically, the heat radiation layer 6 makes direct contact with the die pad rear surfaces 112 of the die pad sections 11. The heat radiation layer 6 makes direct contact with the recess bottom surface 751. On the other hand, the heat radiation layer 6 is spaced apart from the recess side surface 752 (at least a portion of the recess side surface 752). In the present embodiment, the heat radiation layer 6 has a section protruding from the resin bottom surface 72.

The heat radiation layer 6 is provided to rapidly dissipate the heat generated in the semiconductor chips 41 to the outside of the semiconductor device 101. In order to rapidly dissipate the heat generated in the semiconductor chips 41 outside of the semiconductor device 101, it is preferred in some embodiments to have the heat conductivity of the material making up the heat radiation layer 6 become larger. The heat radiation layer 6 may be made of a material higher in heat conductivity than the material of which the resin encapsulation portion 7 is made. The heat radiation layer 6 directly faces all the die pad sections 11. As shown in FIG. 3, the heat radiation layer 6 overlaps with all the respective die pad sections 11 when seen in an x-y plane view (when seen in the thickness direction of the heat radiation layer 6).

The heat radiation layer 6 is called a heat radiation sheet (or a high-heat-conductivity sheet). The heat radiation layer 6 includes an elastic layer 69. The elastic layer 69 is made of an insulating material. In the present embodiment, the heat radiation layer 6 is formed of only the elastic layer 69. The elastic layer 69 is exposed in the direction (the direction z2) in which the recess portion 75 is opened. As shown in FIG. 3, the elastic layer 69 overlaps with all the die pad sections 11 when seen in the thickness direction z of the heat radiation layer 6 (when seen in an x-y plane view). The elastic layer 69 is a layer made of a material having a relatively small Young's modulus. The Young's modulus of the elastic layer 69 in some embodiments may be smaller than the Young's modulus of the resin encapsulation portion 7. The heat radiation layer 6 is, e.g., a relatively soft sheet available before a thermosetting resin sheet is cured. The elastic layer 69 is made of, e.g., an epoxy-based resin. The elastic layer 69 may be made of a silicon rubber. Unlike the present embodiment, the heat radiation layer 6 may be configured to include a base material and adhesive layers applied on the opposite surfaces of the base material. In that case, the adhesive layer makes up the elastic layer. Unlike the present embodiment, the heat radiation layer 6 may be formed by applying an insulating paste on the recess portion 75.

As shown in FIGS. 3 and 4, the heat radiation layer 6 has a major surface 61, a rear surface 62 and a side surface 63. The major surface 61 faces in the direction z1. When seen in an x-y plane view, the major surface 61 overlaps with the die pad rear surface 112 of each of the die pad sections 11 and the recess bottom surface 751. The major surface 61 of the heat radiation layer 6 makes direct contact with the die pad rear surface 112 and the recess bottom surface 751. As described above with reference to FIG. 5, the die pad rear surface 112 and the recess bottom surface 751 are irregular surfaces. For that reason, the major surface 61 making direct contact with the die pad rear surface 112 and the recess bottom surface 751 is also formed of an irregular surface. The rear surface 62 faces in the direction z2 opposite to the direction in which the major surface 61 faces. The rear surface 62 is not covered by the resin encapsulation portion 7 and is exposed. The side surface 63 faces in the direction perpendicular to the direction z, i.e., the thickness direction of the heat radiation layer 6. The side surface 63 of the heat radiation layer 6 is spaced apart from the recess side surface 752 (at least a portion of the recess side surface 752). This is to make sure that, as set forth later, the heat radiation sheet as the heat radiation layer 6 is easily embedded into the recess portion 75 after formation of the resin encapsulation portion 7. In the present embodiment, the heat radiation layer 6 is formed of only the elastic layer 69. Therefore, the major surface 61, the rear surface 62 and the side surface 63 of the heat radiation layer 6 are all made up of the elastic layer 69.

Figure 10:
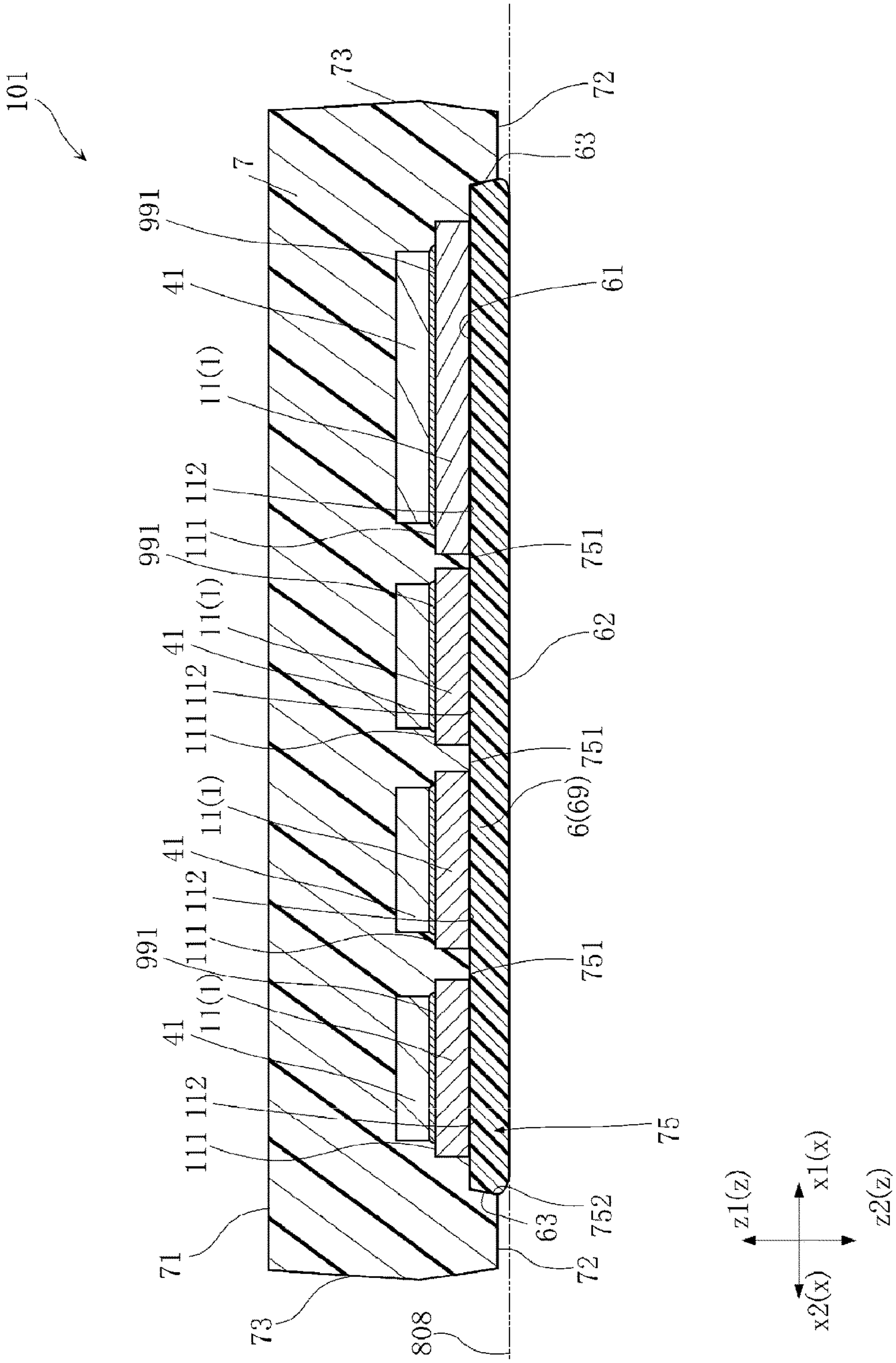
FIG. 10 is a section view of the mounting structure of the semiconductor device according to the first embodiment of the present disclosure.

FIG. 10 is a section view illustrating the semiconductor device 101 mounted on the substrate 807 (see FIG. 1). As shown in FIG. 10, the heat radiation layer 6 makes direct contact with the heat radiation member 808 in a state that the semiconductor device 101 is mounted on the substrate 807. The rear surface 62 of the heat radiation layer 6 is pressed by the heat radiation on member 808 toward the direction at which the recess bottom surface 751 is positioned. Thus the heat radiation layer 6 is elastically deformed, thereby removing the gap between the heat radiation layer 6 and the recess side surface 752. Consequently, the heat radiation layer 6 makes direct contact with the recess side surface 752.

Next, description will be made on a manufacturing method of the semiconductor device 101. In the figures used in describing the manufacturing method, the same components as described above will be designated by like reference symbols.

Figure 6:
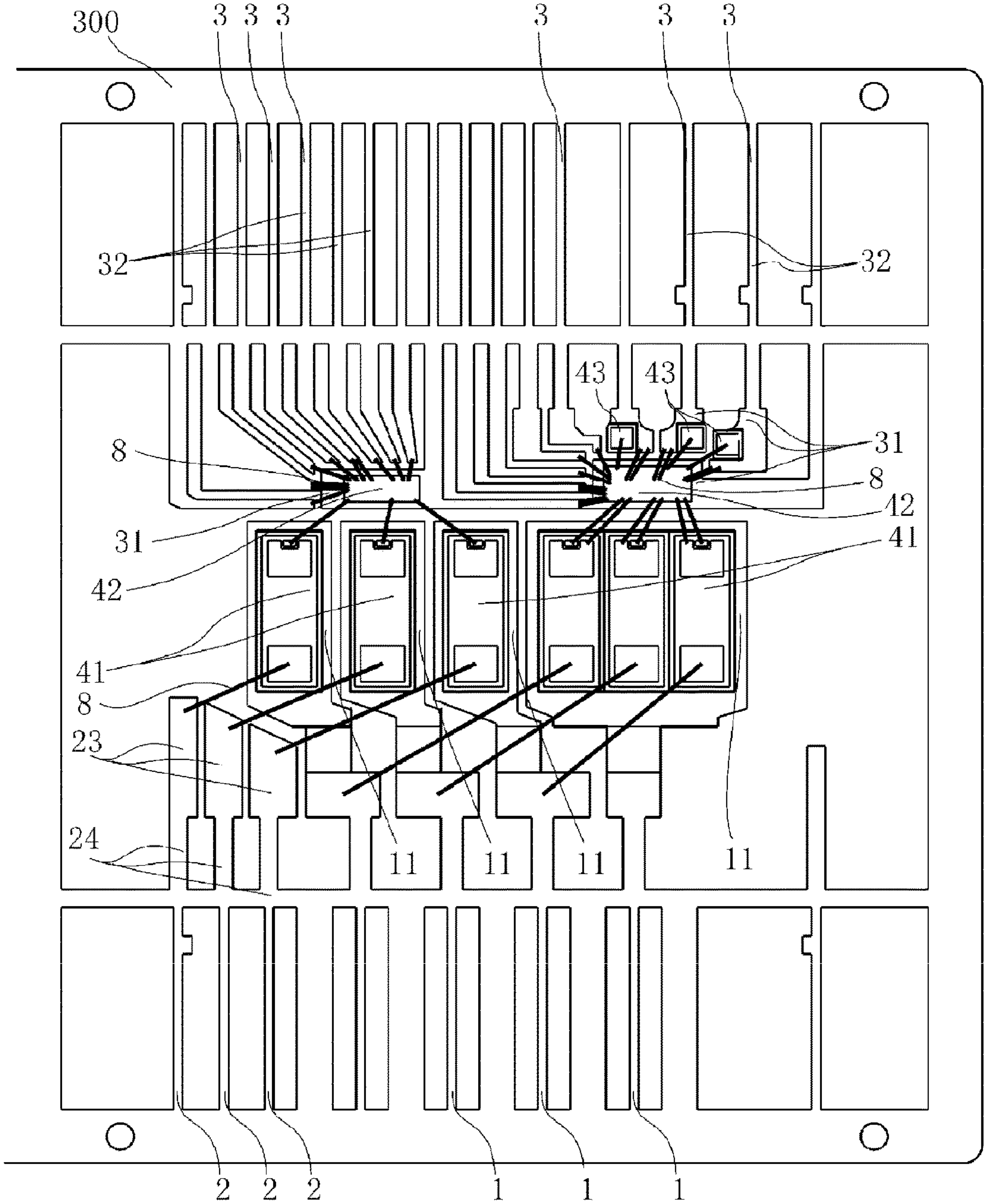
FIG. 6 is a plan view illustrating one process of a manufacturing method of the semiconductor device according to the first embodiment of the present disclosure.

As shown in FIG. 6, the lead frame 300 including the die pad sections 11, 31, the semiconductor chips 41 and 42 and the passive chips 43 are prepared first. Then, as shown in FIG. 6, each of the semiconductor chips 41 is arranged in one of the die pad sections 11 with the joining layer (not shown) interposed therebetween. Similarly, each of the semiconductor chips 42 and each of the passive chips 43 are arranged in one of the control die pad sections 31 with the joining layer (not shown) interposed therebetween. Subsequently, as shown in FIG. 6, the wires 8 are bonded to the respective semiconductor chips 41 and 42 and so forth.

Figure 7:
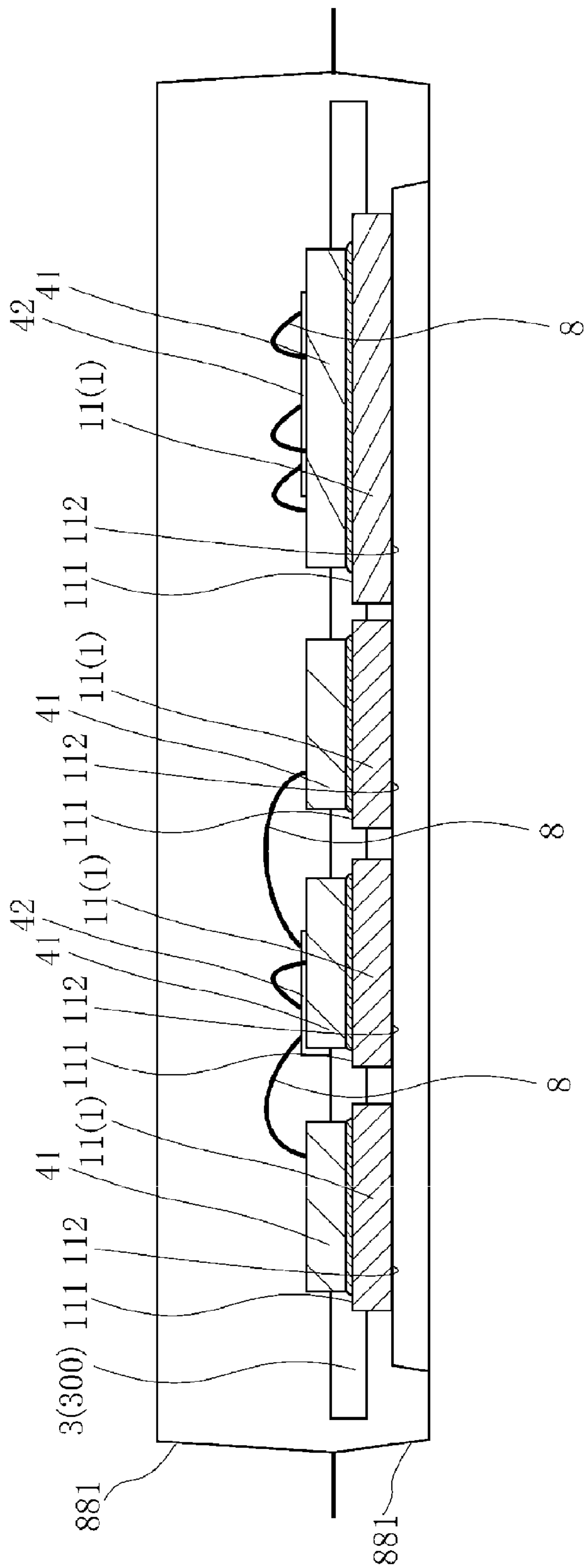
FIG. 7 is a section view illustrating a process subsequent to the process shown in FIG. 6.
Figure 8:
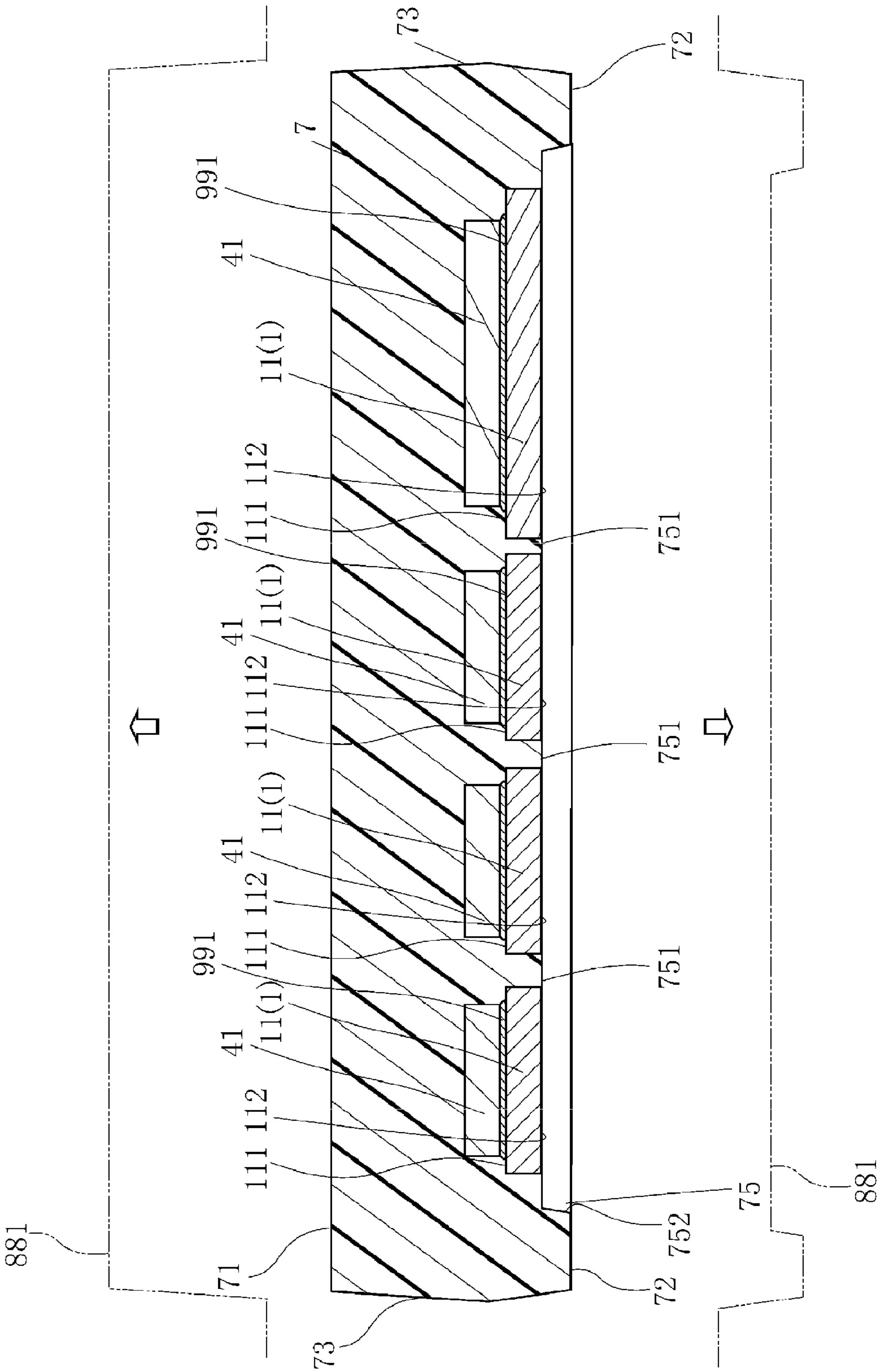
FIG. 8 is a section view illustrating a process subsequent to the process shown in FIG. 7.

Next, as shown in FIGS. 7 and 8, the resin encapsulation portion 7 is formed. As shown in FIG. 7, the resin encapsulation portion 7 is formed by a molding process using a mold 881. As shown in FIG. 7, the die pad sections 11 are pressed by the mold 881. Then, a resin material is injected into the mold 881 and is cured. Once the resin material is cured, the mold 881 is removed from the die pad sections 11 and so forth as shown in FIG. 8. In this manner, the resin encapsulation portion 7 can be formed. When forming the resin encapsulation portion 7, the recess portion 75 for exposing the die pad sections 11 is formed in the resin encapsulation portion 7. In order to easily remove the mold 881 from the resin encapsulation portion 7 after the resin is cured, the recess side surface 752 of the recess portion 75 is formed into a taper shape as set forth above.

Thin resin burrs covering the die pad sections 11 are sometimes formed after formation of the resin encapsulation portion 7. In order to remove the resin burrs, the die pad sections 11 are subjected to a blasting process (not shown). The blasting process refers to a method for roughening a surface by sputtering non-metallic particles, such as silica sands, or metallic particles at a high speed. As a consequence, the die pad rear surface 112 of each of the die pad sections 11 and the recess bottom surface 751 of the resin encapsulation portion 7 become irregular surfaces having a fine concave-convex shape as shown in FIG. 5.

Figure 9:
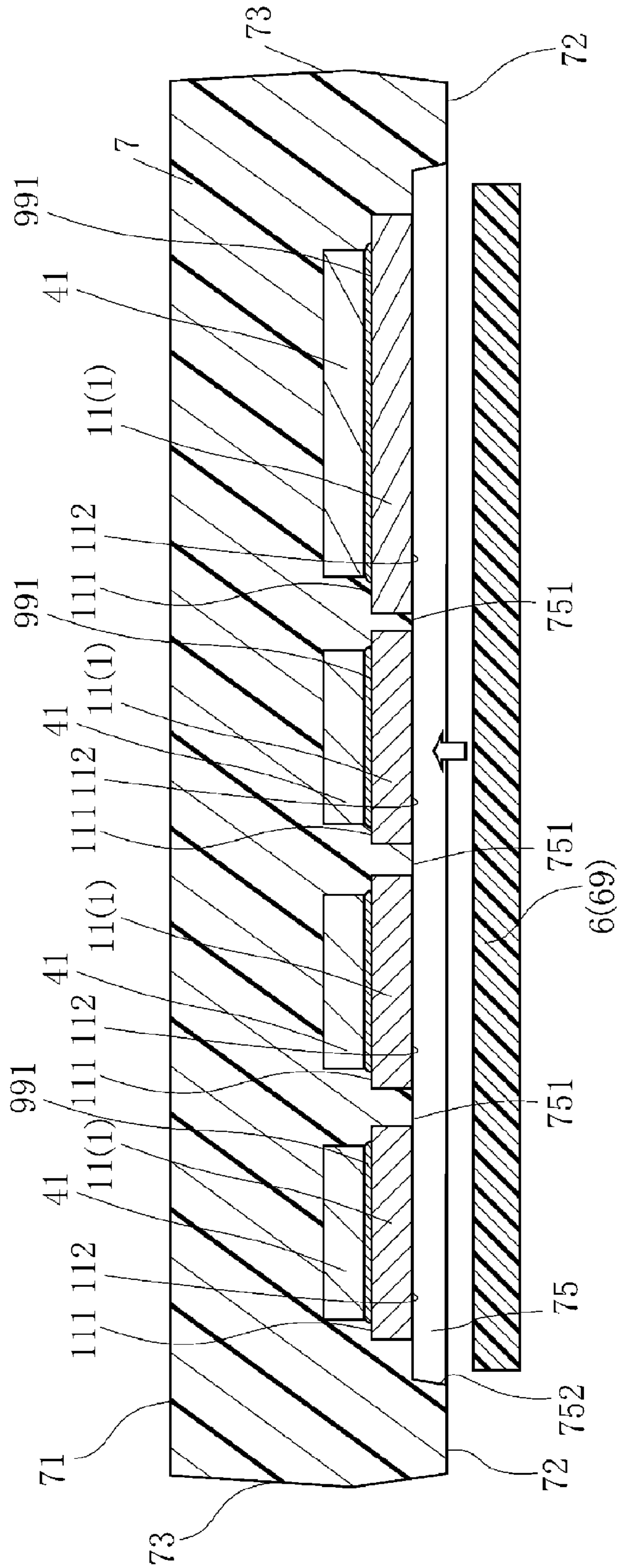
FIG. 9 is a section view illustrating a process subsequent to the process shown in FIG. 8.

As shown in FIG. 9, the heat radiation layer 6 is formed in the recess portion 75 of the resin encapsulation portion 7. More specifically, the heat radiation sheet as the heat radiation layer 6 is embedded into the recess portion 75. The formation of the recess portion 75 in the resin encapsulation portion 7 allows the heat radiation sheet to be easily positioned with respect to each of the die pad sections 11. Since the surface of the heat radiation sheet is relatively sticky, the heat radiation sheet itself is joined to the recess bottom surface 751 and the die pad rear surface 112.

Thereafter, the lead frame 300 shown in FIG. 6 is appropriately diced to thereby manufacture the semiconductor device 101 shown in FIG. 2.

Next, description will be made on the operations and effects of the present embodiment.

In the semiconductor device 101, the heat radiation layer 6 includes the elastic layer 69. The elastic layer 69 is exposed in the direction (the direction z2) in which the recess portion 75 is opened. The elastic layer 69 overlaps with each of the die pad sections 11 when seen in an x-y plane view. With this configuration, as shown in FIG. 10, the elastic layer 69 is pressed by the heat radiation member 808 toward the recess bottom surface 751 when the semiconductor device 101 is mounted on the substrate 807. Thus the elastic layer 69 undergoes elastic deformation and makes close contact with the heat radiation member 808. Since the elastic layer 69 and the heat radiation member 808 can be brought into close contact with each other, there is no need to interpose any heat radiating grease between the elastic layer 69 and the heat radiation member 808. Therefore, it is not necessary that heat radiating grease be applied on the heat radiation member 808 each time the semiconductor device 101 is mounted on the substrate 807. Accordingly, it is possible to efficiently mount the semiconductor device 101 to the substrate 807.

The semiconductor device 101 is not provided with the heat radiation plate mentioned in the section of background. It is therefore possible to reduce the cost involved in providing the heat radiation plate. Moreover, the thickness of the semiconductor device 101 can be reduced just as much as the thickness of the heat radiation plate.

In the semiconductor device 101, as shown in FIG. 10, the resin encapsulation portion 7 has the resin bottom surface 72. The recess portion 75 is depressed from the resin bottom surface 72. The heat radiation layer 6 has a section protruding beyond the resin bottom surface 72. With this configuration, even if the heat radiation layer 6 is elastically deformed, it is hard for the heat radiation member 808 to make contact with the resin bottom surface 72. It is therefore possible to reliably bring the heat radiation layer 6 into close contact with the heat radiation member 808.

If the semiconductor device 101 is in such a state that it is mounted on the substrate 807 (see FIG. 1), the heat radiation layer 6 is elastically deformed. The gap between the heat radiation layer 6 and the recess side surface 752 is removed. The heat radiation layer 6 makes direct contact with recess side surface 752. With this configuration, the heat radiation layer 6 and the recess side surface 752 can be spaced apart from each other through a gap in order to easily arrange the heat radiation sheet as the heat radiation layer 6 in the recess portion 75. Moreover, the heat radiation layer 6 can be brought into close contact with the recess side surface 752 in such a state that the semiconductor device 101 is mounted on the substrate 807. Since the heat radiation layer 6 can be brought into close contact with the recess side surface 752, the heat transferred from the die pad sections 11 to the resin encapsulation portion 7 can be transferred to the heat radiation member 808 by way of the recess bottom surface 751 and the heat radiation layer 6. This assists in enhancing the heat dissipation of the semiconductor device 101.

In the semiconductor device 101, each of the die pad sections 11 has the die pad rear surface 112 with which the heat radiation layer 6 makes direct contact. As shown in FIG. 5, the die pad rear surface 112 is an irregular surface. With this configuration, it is possible to increase the joining area between the die pad rear surface 112 and the heat radiation layer 6. If the joining area between the die pad rear surface 112 and the heat radiation layer 6 grows larger, the die pad rear surface 112 and the heat radiation layer 6 are strongly joined together. Therefore, the heat radiation layer 6 is hardly separated from the die pad rear surface 112. In addition, if the joining area between the die pad rear surface 112 and the heat radiation layer 6 grows larger, the heat transferred from the semiconductor chips 41 to the die pad sections 11 can be readily transferred from the die pad sections 11 to the heat radiation layer 6. For that reason, the heat generated in the semiconductor chips 41 can be efficiently transferred outside of the semiconductor device 101 (to the heat radiation member 808 in the present embodiment) by way of the heat radiation layer 6. The semiconductor device 101 is superior in heat dissipation. With the present embodiment, it is possible to provide the semiconductor device 101 capable of suppressing exfoliation of the heat radiation layer 6 and performing superior heat dissipation.

In the semiconductor device 101, as shown in FIG. 5, the recess bottom surface 751 is an irregular surface with which the heat radiation layer 6 makes direct contact. With this configuration, it is possible to increase the joining area between heat radiation layer 6 and the resin encapsulation portion 7. If the joining area between heat radiation layer 6 and the resin encapsulation portion 7 grows larger, it is possible to restrain the heat radiation layer 6 from being separated from the resin encapsulation portion 7.

In the manufacturing method of the semiconductor device 101, the resin encapsulation portion 7 is subjected to a blasting process, while a blasting process is performed on the die pad rear surface 112. With this configuration, it is not necessary to form a concave-convex section on the recess bottom surface 751 of the resin encapsulation portion 7 in addition to the formation of the concave-convex section on the die pad rear surface 112. This assists in enhancing the manufacturing efficiency of the semiconductor device.

Second Embodiment

A second embodiment of the present disclosure will now be described with reference to FIGS. 11 through 22.

Figure 11:
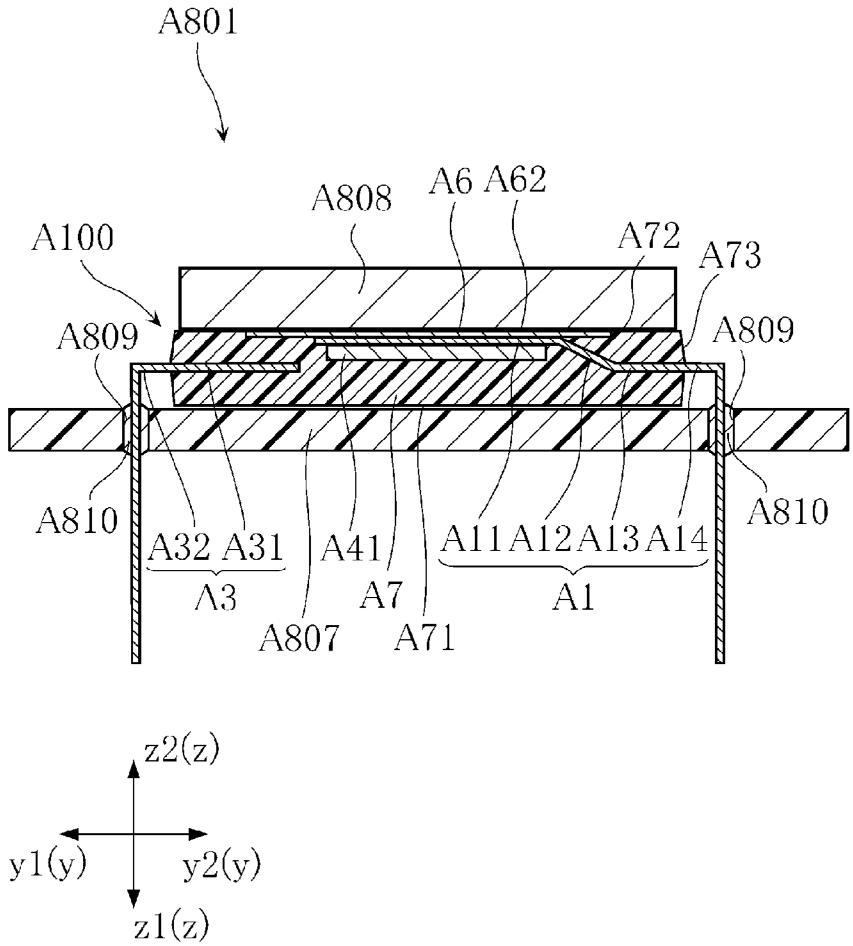
FIG. 11 is a section view illustrating a mounting structure of a semiconductor device according to a second embodiment of the present disclosure.

FIG. 11 is a section view illustrating a mounting structure of a semiconductor device according to a second embodiment of the present disclosure.

The mounting structure A801 of the semiconductor device shown in FIG. 11 includes a semiconductor device A100, a substrate A807 and a heat radiation member A808.

A plurality of electronic parts is mounted on the substrate A807. The substrate A807 is made of an insulating material. A wiring pattern not shown is formed in the substrate A807. A plurality of holes A809 is formed in the substrate A807. The heat radiation member A808 is made of a material having relatively high heat conductivity, e.g., a metal such as aluminum. The heat radiation member A808 is fixed with respect to the substrate A807 by a support member not shown. The semiconductor device A100 is mounted on the substrate A807. In the present embodiment, the semiconductor device A100 is an article called an IPM (Intelligent Power Module). The semiconductor device A100 can find its application in, e.g., an air conditioner or a motor control device.

Figure 12:
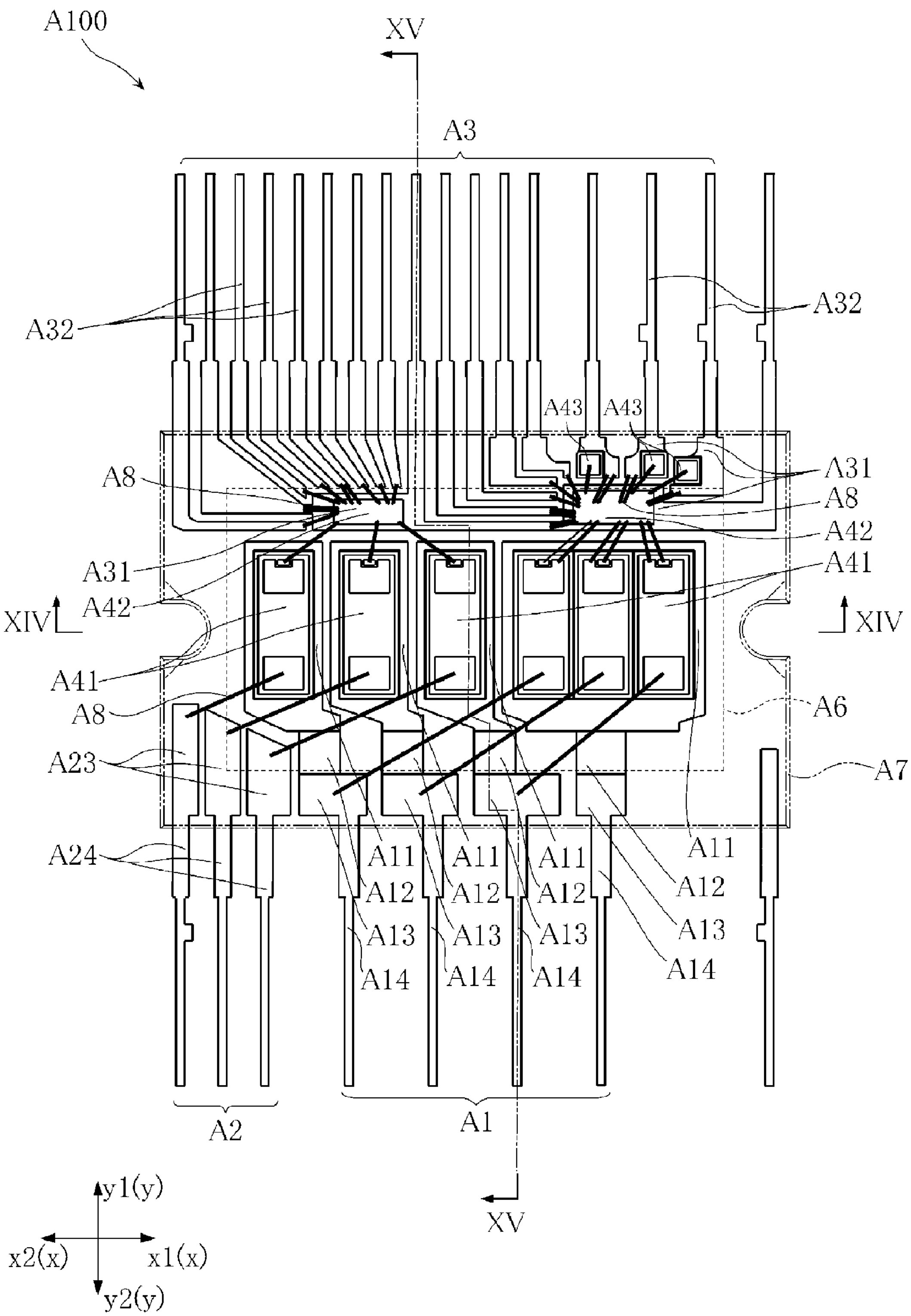
FIG. 12 is a (partially cut away) plan view of the semiconductor device according to the second embodiment of the present disclosure prior to bending the leads.
Figure 13:
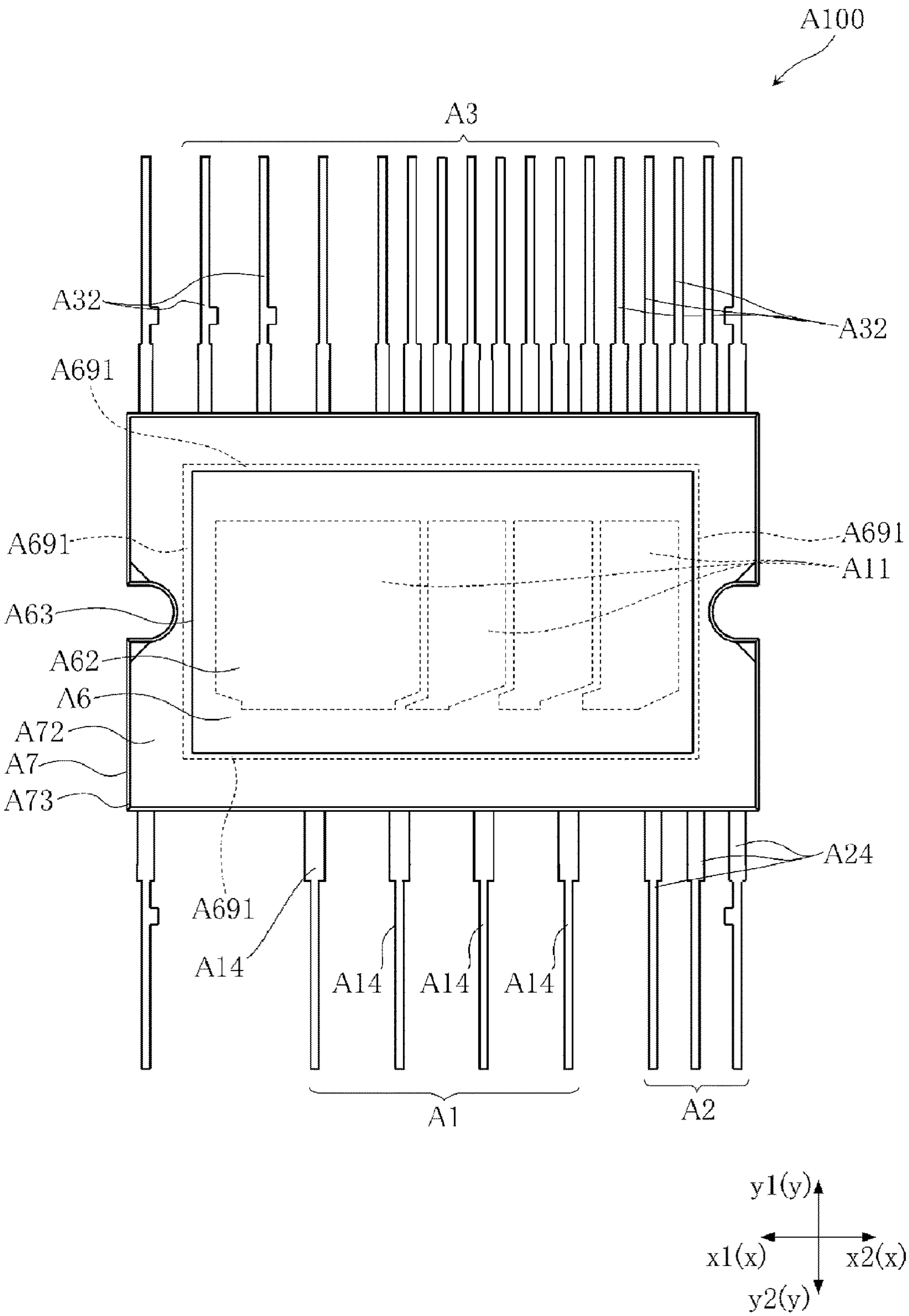
FIG. 13 is a bottom view of the semiconductor device according to the second embodiment of the present disclosure prior to bending the leads.
Figure 14:
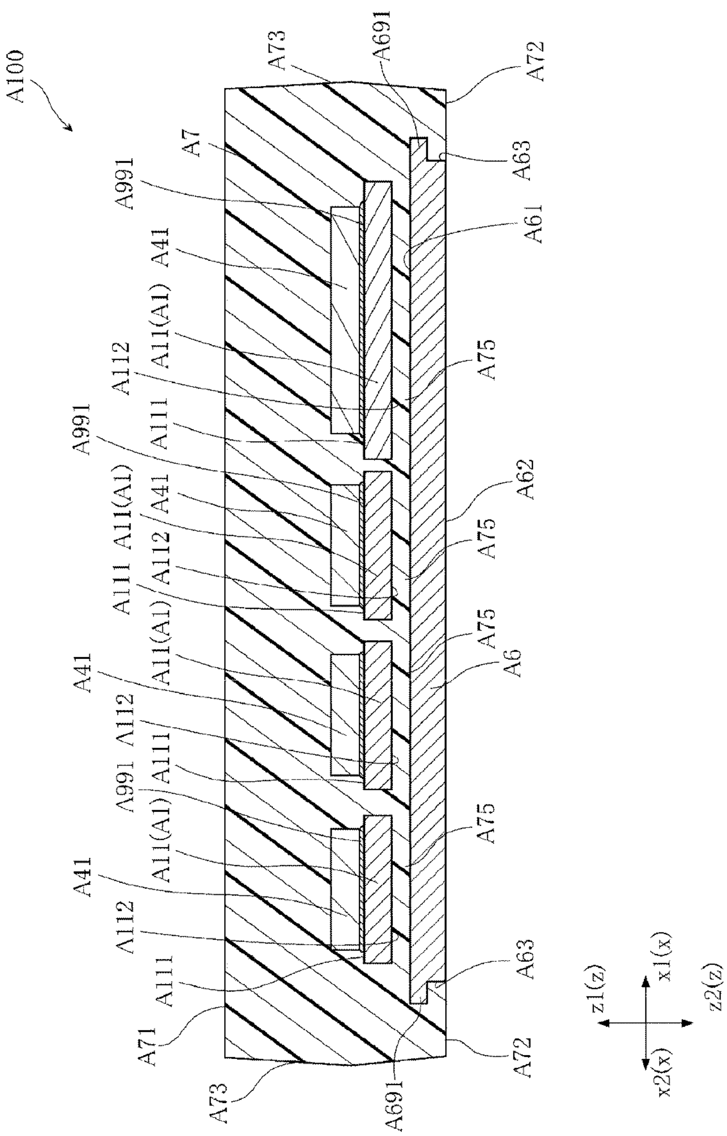
FIG. 14 is a section view taken along line XIV-XIV in FIG. 12.
Figure 15:
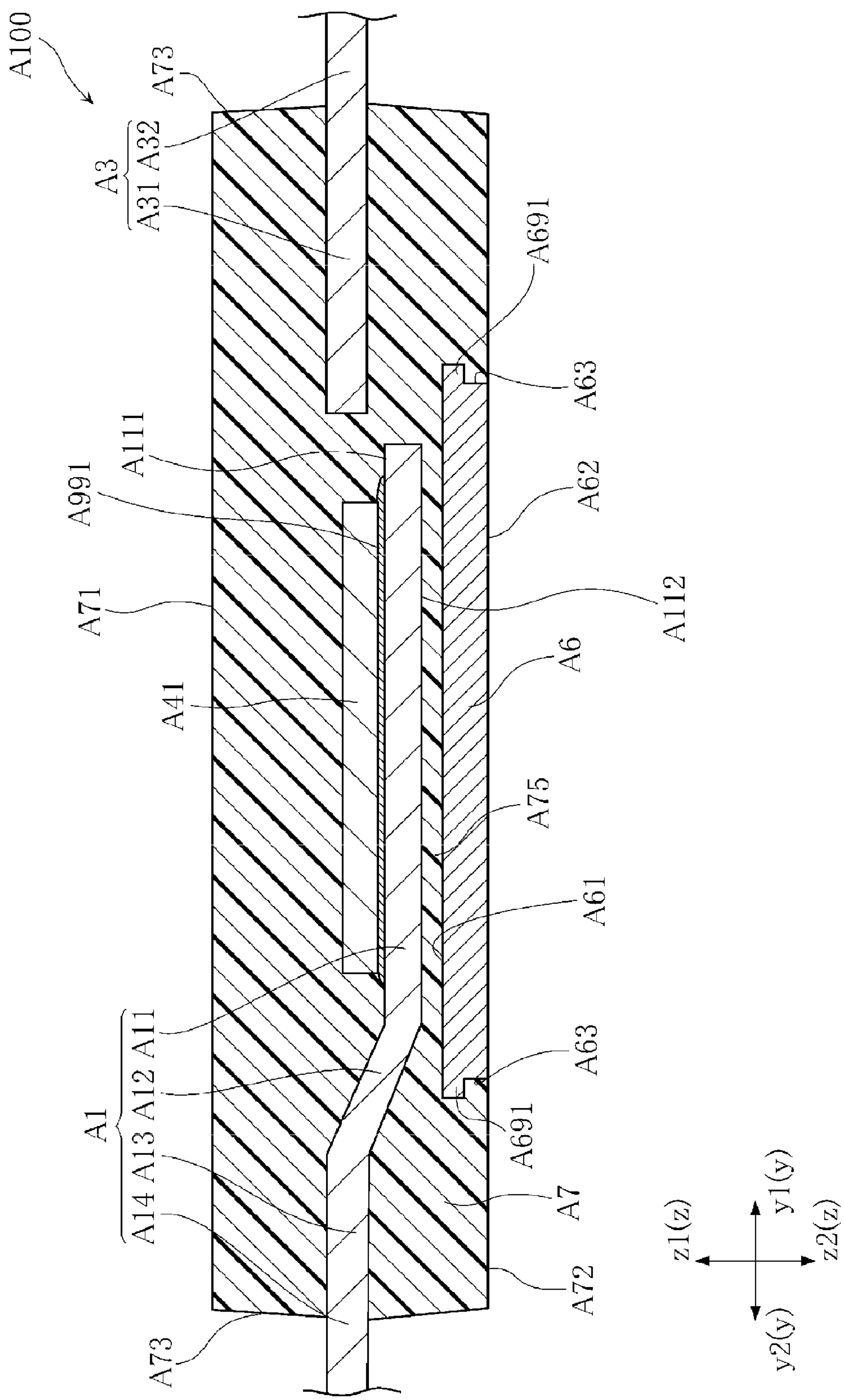
FIG. 15 is a section view taken along line XV-XV in FIG. 12.

FIG. 12 is a (partially cut away) plan view of the semiconductor device according to the second embodiment of the present disclosure prior to bending the leads. FIG. 13 is a bottom view of the semiconductor device according to the second embodiment of the present disclosure prior to bending the leads. FIG. 14 is a section view taken along line XIV-XIV in FIG. 12. FIG. 15 is a section view taken along line XV-XV in FIG. 12.

The semiconductor device A100 shown in these figures includes first electrode portions A1, second electrode portions A2, third electrode portions A3, semiconductor chips A41 and A42, passive chips A43, a heat radiation plate A6, a resin encapsulation portion A7, wires A8 and a joining layer A991. In FIG. 12, the resin encapsulation portion A7 is not shown and is indicated by a double-dot chain line.

The resin encapsulation portion A7 shown in FIGS. 13 through 15 covers the first electrode portions A1, the second electrode portions A2, the third electrode portions A3, the semiconductor chips A41 and A42, the passive chips A43, the heat radiation plate A6, the wires A8 and the joining layer A991. The resin encapsulation portion A7 is made of an insulating resin. The insulating resin may be, e.g., a black epoxy resin. As shown in FIGS. 14 and 15, the resin encapsulation portion A7 has a resin major surface A71, a resin bottom surface A72 and a resin side surface A73.

The resin major surface A71 is a smooth surface facing in the direction z1 and extends along the x-y plane. The resin bottom surface A72 is a smooth surface facing in the direction z2 opposite to the direction z1 and extends along the x-y plane. The resin side surface A73 is shaped to surround the semiconductor chips A41 and A42 and the passive chips A43 when seen in an x-y plane view. The resin side surface A73 is joined to the resin major surface A71 and the resin bottom surface A72.

In the present embodiment, the resin encapsulation portion A7 includes a plurality of intermediate sections A75. The intermediate sections A75 will be described later.

As shown in FIG. 12, the semiconductor chips A41 and A42 and the passive chips A43 have a rectangular shape when seen in a plan view. The semiconductor chips A41 are, e.g., power chips such as an IGBT, a MOS and a diode. The semiconductor chips A42 are, e.g., LSI chips such as a control IC. The passive chips A43 are, e.g., passives such as a resistor and a capacitor.

The first electrode portions A1, the second electrode portions A2 and the third electrode portions A3 shown in FIGS. 12 through 15 have electric conductivity. In other words, the first electrode portions A1, the second electrode portions A2 and the third electrode portions A3 are all made of an electrically conductive material. The electrically conductive material may be, e.g., copper. The electrode portion shown in the right lower region in FIG. 12 is connected to the ground.

Each of the first electrode portions A1 (four first electrode portions A1 in the present embodiment) includes a die pad section A11 (see FIGS. 11 through 14), a connecting section A12 (see FIGS. 11 and 12), a wire bonding section A13 (see FIGS. 11 and 12) and a lead A14 (see FIGS. 11 and 12). The first electrode portions A1 are spaced apart from one another in the x direction.

Each of the die pad sections A11 is formed into a plate-like shape to extend along the x-y plane. The semiconductor chips A41 are arranged in the die pad sections A11. More specifically, the semiconductor chips A41 which generate heat easily are joined to the die pad sections A11.

Each of the die pad sections A11 has a die pad major surface A111 and a die pad rear surface A112. The die pad major surface A111 faces in the direction z1. The die pad rear surface A112 faces in the direction z2. That is to say, the die pad major surface A111 and the die pad rear surface A112 face toward the opposite directions from each other. Each of the semiconductor chips A41 is arranged in the die pad major surface A111. More specifically, each of the semiconductor chips A41 is joined to the die pad major surface A111. The joining layer A991 (to be described later) exists between the die pad major surface A111 and each of the semiconductor chips A41.

As shown in FIGS. 11 and 12, each of the connecting sections A12 is positioned between each of the die pad sections A11 and each of the wire bonding sections A13 and is joined to each of the die pad sections A11 and each of the wire bonding sections A13. Each of the connecting sections A12 is shaped to extend along a surface inclined with respect to the x-y plane. Each of the connecting sections A12 is inclined with respect to the x-y plane such that each of the connecting sections A12 extends in the direction z1 as it goes away from each of the die pad sections A11.

Each of the wire bonding sections A13 shown in FIGS. 11, 12 and 15 is shaped to extend along the x-y plane. Each of the wire bonding sections A13 is positioned in the z1 direction with respect to each of the die pad sections A11 in the direction z. The wires A8 are bonded to each of the wire bonding sections A13 and each of the semiconductor chips A41, whereby each of the wire bonding sections A13 and each of the semiconductor chips A41 are electrically connected to each other. Each of the leads A14 is joined to each of the wire bonding sections A13. Each of the leads A14 extends along the direction y. Each of the leads A14 has a section protruding from the resin side surface A73 of the resin encapsulation portion A7. In the present embodiment, each of the leads A14 is used for an insertion-mounting purpose. As shown in FIG. 11, when the semiconductor device A100 is mounted on the substrate A807, each of the leads A14 is bent and inserted into each of the holes A809. A solder layer A810 fills each of the holes A809 in order to fix the leads A14 to the substrate A807.

As shown in FIG. 12, each of the second electrode portions A2 (three second electrode portions A2 in the present embodiment) includes a wire bonding section A23 and a lead A24. The second electrode portions A2 are spaced apart from one another in the x direction.

Each of the wire bonding sections A23 is shaped to extend along the x-y plane. Each of the wire bonding sections A23 is positioned in the z1 direction with respect to each of the die pad sections A11 in the direction z. The wires 8 are bonded to each of the wire bonding sections A23 and each of the semiconductor chips A41, whereby each of the wire bonding sections A23 and each of the semiconductor chips A41 are electrically connected to each other. Each of the leads A24 is joined to each of the wire bonding sections A23. Each of the leads A24 extends along the direction y. Each of the leads A24 has a section protruding from the resin side surface A73 of the resin encapsulation portion A7. In the present embodiment, the leads A24 are used for an insertion-mounting purpose. While not shown in the drawings, just like the leads 14, the leads A24 are inserted into the holes A809 when the semiconductor device A100 is mounted on the substrate A807.

The third electrode portions A3 shown in FIGS. 11 and 12 include a plurality of control die pad sections A31 and a plurality of leads A32. The control die pad sections A31 and the leads A32 are all arranged in the same position in the z direction. The semiconductor chips A42 or the passive chips A43 are arranged in the respective control die pad sections A31. A joining layer (not shown) exists between the control die pad sections A31 and the semiconductor chips A42, and between the control die pad sections A31 and the passive chips A43. The rear surfaces of the control die pad sections A31 may not face the heat radiation plate A6 and may not be exposed.

Each of the leads A32 has a section protruding from the resin side surface A73 of the resin encapsulation portion A7. In the present embodiment, the leads A32 are used for an insertion-mounting purpose. As shown in FIG. 11, the leads A32 are inserted into the holes A809 when the semiconductor device A100 is mounted on the substrate A807. As described above with respect to the leads 14, a solder layer A810 fills the holes A809 in order to fix the leads A32 to the substrate A807. The wires A8 are bonded to each of the leads A32 and each of the semiconductor chips A42, whereby each of the leads A32 and each of the semiconductor chips A42 are electrically connected to each other. The wires A8 are also bonded to each of the semiconductor chips A42 and each of the passive chips A43.

As shown in FIGS. 14 and 15, the joining layer A991 exists between each of the die pad sections A11 and each of the semiconductor chips A41. The joining layer A991 joins each of the semiconductor chips A41 to each of the die pad sections A11. The joining layer A991 is made of, e.g., an electrically conductive material. The electrically conductive material may be, e.g., a silver paste or a solder. The solder is relatively high in heat conductivity. If the solder is used as the joining layer A991, it becomes possible to efficiently transfer heat from each of the semiconductor chips A41 to each of the die pad sections A11. The joining layer A991 may be made of an insulating material instead of the electrically conductive material.

As shown in FIGS. 13 through 15, the heat radiation plate A6 directly faces the die pad sections A11. In the present embodiment, the heat radiation plate A6 is formed into a plate-like shape to extend along the x-y plane. The heat radiation plate A6 is spaced apart from the die pad sections A11. The intermediate sections A75 mentioned above exist between the heat radiation plate A6 and the die pad sections A11. The intermediate sections A75 make direct contact with the heat radiation plate A6 and the die pad sections A11. Therefore, the heat radiation plate A6 and the die pad sections A11 are joined by the resin encapsulation portion A7. Since the intermediate sections A75 are a portion of the resin encapsulation portion A7, the material making up the intermediate sections A75 is the same as the material making up the section of the resin encapsulation portion A7 that covers the semiconductor chips A41 and A42. The heat radiation plate A6 is exposed from the resin bottom surface A72 of the resin encapsulation portion A7.

The heat radiation plate A6 is provided to rapidly dissipate the heat generated in the semiconductor chips A41 outside of the semiconductor device A100. In order to rapidly dissipate the heat generated in the semiconductor chips A41 outside of the semiconductor device A100, it is preferred in some embodiments that the heat conductivity of the material making up the heat radiation plate A6 becomes larger. The heat radiation plate A6 may be made of a material higher in heat conductivity than the material of which the resin encapsulation portion A7 is made. More specifically, the heat radiation plate A6 is made of a material higher in heat conductivity than the material of which the die pad sections A11 are made. The heat radiation plate A6 is made of, e.g., an electrically conductive material. The electrically conductive material may be, e.g., aluminum, copper, copper alloy or iron. The heat radiation plate A6 may be silver-plated aluminum. On the other hand, the heat radiation plate A6 may be made of an insulating material. The insulating material may be, e.g., ceramic. Examples of the ceramic include alumina, aluminum nitride and silicon nitride. In the present embodiment, the heat radiation plate A6 is made of an electrically conductive material.

Specifically, the clearance between the heat radiation plate A6 and die pad sections A11 (namely, the thickness of the intermediate sections A75) may be in some embodiments, e.g., from 20 μm to 200 μm. If the clearance between the heat radiation plate A6 and die pad sections A11 is too small, there is an increasing possibility that the die pad sections A11 are electrically connected to one another via the heat radiation plate A6. On the other hand, if the clearance between the heat radiation plate A6 and die pad sections A11 becomes too large, the transfer of the heat generated in the semiconductor chips A41 to the heat radiation plate A6 is cut off by the intermediate sections A75. Thus it is hard to transfer the heat generated in the semiconductor chips A41 to the heat radiation plate A6.

As shown in FIG. 12, the heat radiation plate A6 overlaps with all the die pad sections A11 when seen in an x-y plane view. While the semiconductor device A100 is provided with only one heat radiation plate A6, the semiconductor device A100 may be provided with a plurality of heat radiation plates. If the semiconductor device A100 is provided with a plurality of heat radiation plates, each of the heat radiation plates overlaps with one of the die pad sections A11 when seen in an x-y plane view.

The heat radiation plate A6 has a major surface A61, a rear surface A62 and a side surface A63. The major surface A61 of the heat radiation plate A6 directly faces the die pad rear surface A112 of each of the die pad sections A11. The major surface A61 is spaced apart from the die pad sections A11. The aforementioned intermediate sections A75 exist between the major surface A61 of the heat radiation plate and the die pad sections A11. The major surface A61 and the die pad sections A11 make direct contact with the intermediate sections A75. In the present embodiment, the major surface A61 is smooth. The major surface A61 in other embodiments may not be smooth but may have a concave-convex section. The concave-convex section may be arranged near the intermediate sections A75. The rear surface A62 faces an opposite direction to which the major surface A61 faces. The resin bottom surface A72 faces the same direction as the rear surface A62 of the heat radiation plate A6 faces. The rear surface A62 is exposed from the resin bottom surface A72 of the resin encapsulation portion A7. In the present embodiment, the rear surface A62 is flush with the resin bottom surface A72. As shown in FIG. 11, when the semiconductor device A100 is in use, the rear surface A62 directly faces the heat radiation member A808 (makes contact with the heat radiation member A808 in the present embodiment). The side surface A63 is smooth and is perpendicular to the rear surface A62. The side surface A63 of the heat radiation plate A6 as a whole is covered by the resin encapsulation portion A7.

As shown in FIGS. 13 through 15, the heat radiation plate A6 includes dropout prevention units A691. The dropout prevention units A691 are provided to prevent the heat radiation plate A6 from being dropped out (detached) from the resin encapsulation portion A7. The dropout prevention units A691 protrude from the rear surface A62 of the heat radiation plate when seen in the thickness direction z of the die pad sections A11 (when seen in an x-y plane view). The dropout prevention units A691 are positioned to face the major surface A61 with respect to the resin encapsulation portion A7. That is to say, a portion of the resin encapsulation portion A7 is positioned in the z2 direction of the dropout prevention units A691. In the present embodiment, the dropout prevention units A691 are shaped to protrude from the side surface A63 of the heat radiation plate in the direction orthogonal to the direction z.

Next, description will be made on a manufacturing method of the semiconductor device A100. In the following description, components identical with or similar to those described above will be designated by like reference symbols and description on the identical or similar components will not be described, if appropriate.

Figure 16:
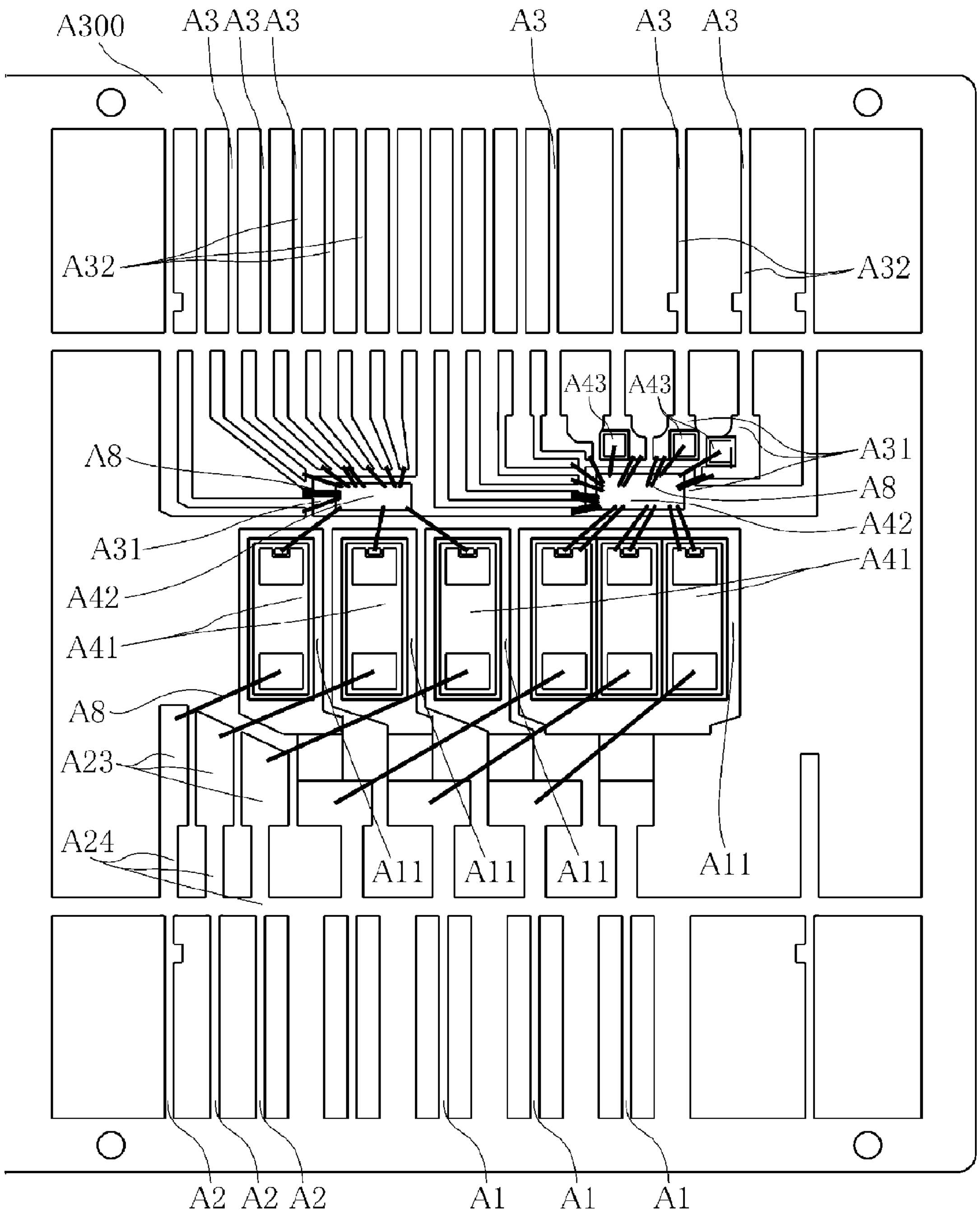
FIG. 16 is a plan view illustrating one process of a manufacturing method of the semiconductor device according to the second embodiment of the present disclosure.

As shown in FIG. 16, the lead frame A300 including the die pad sections A11 and A31, the semiconductor chips A41 and A42 and the passive chips A43 are prepared first. Then, as shown in FIG. 16, each of the semiconductor chips A41 is arranged in one of the die pad sections A11 with the joining layer (not shown) interposed therebetween. Similarly, each of the semiconductor chips A42 and each of the passive chips A43 are arranged in one of the control die pad sections A31 with the joining layer (not shown) interposed therebetween. Subsequently, as shown in FIG. 16, the wires A8 are bonded to the respective semiconductor chips A41 and A42 and so forth.

Figure 17:
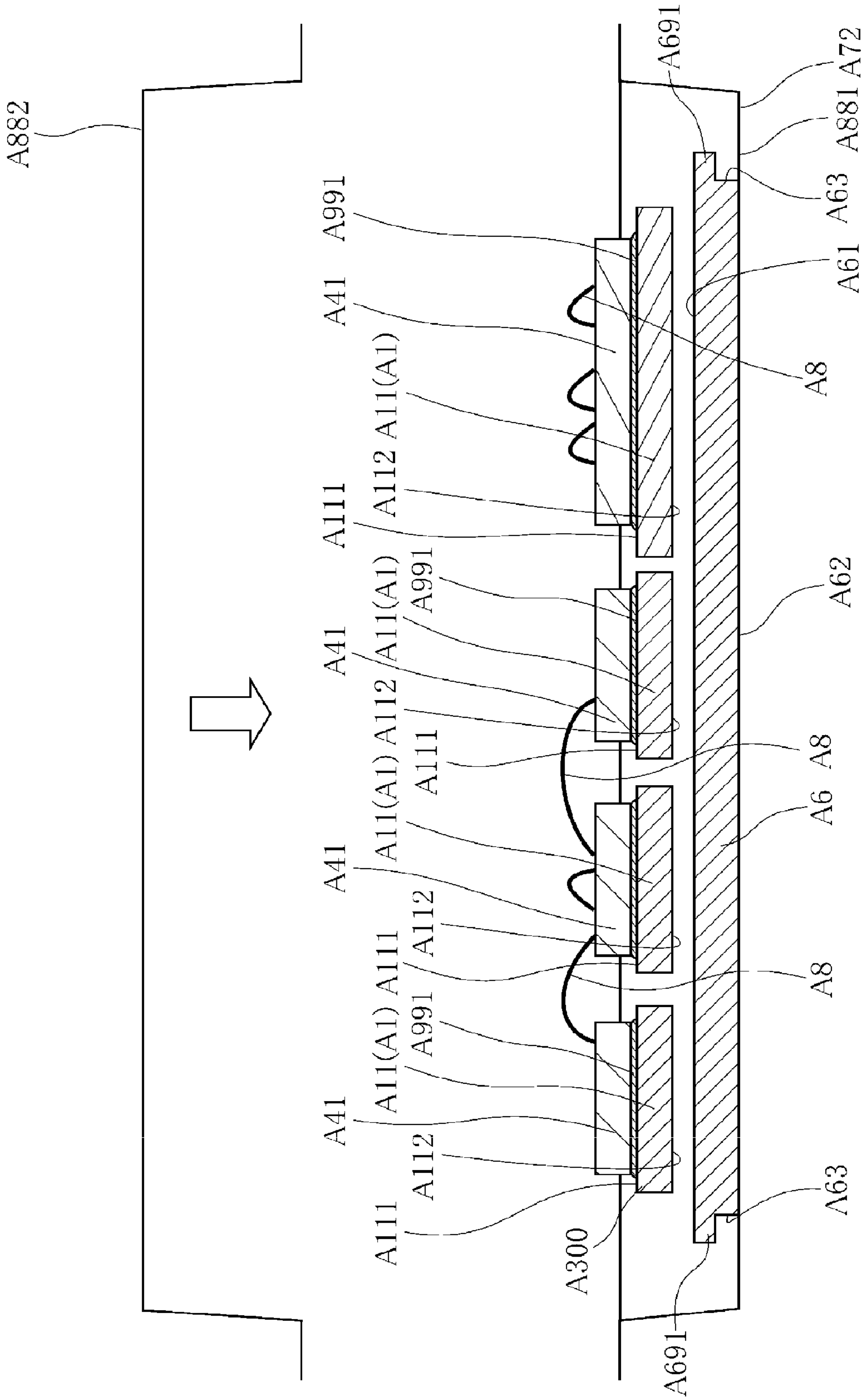
FIG. 17 is a section view illustrating a process subsequent to the process shown in FIG. 16.
Figure 18:
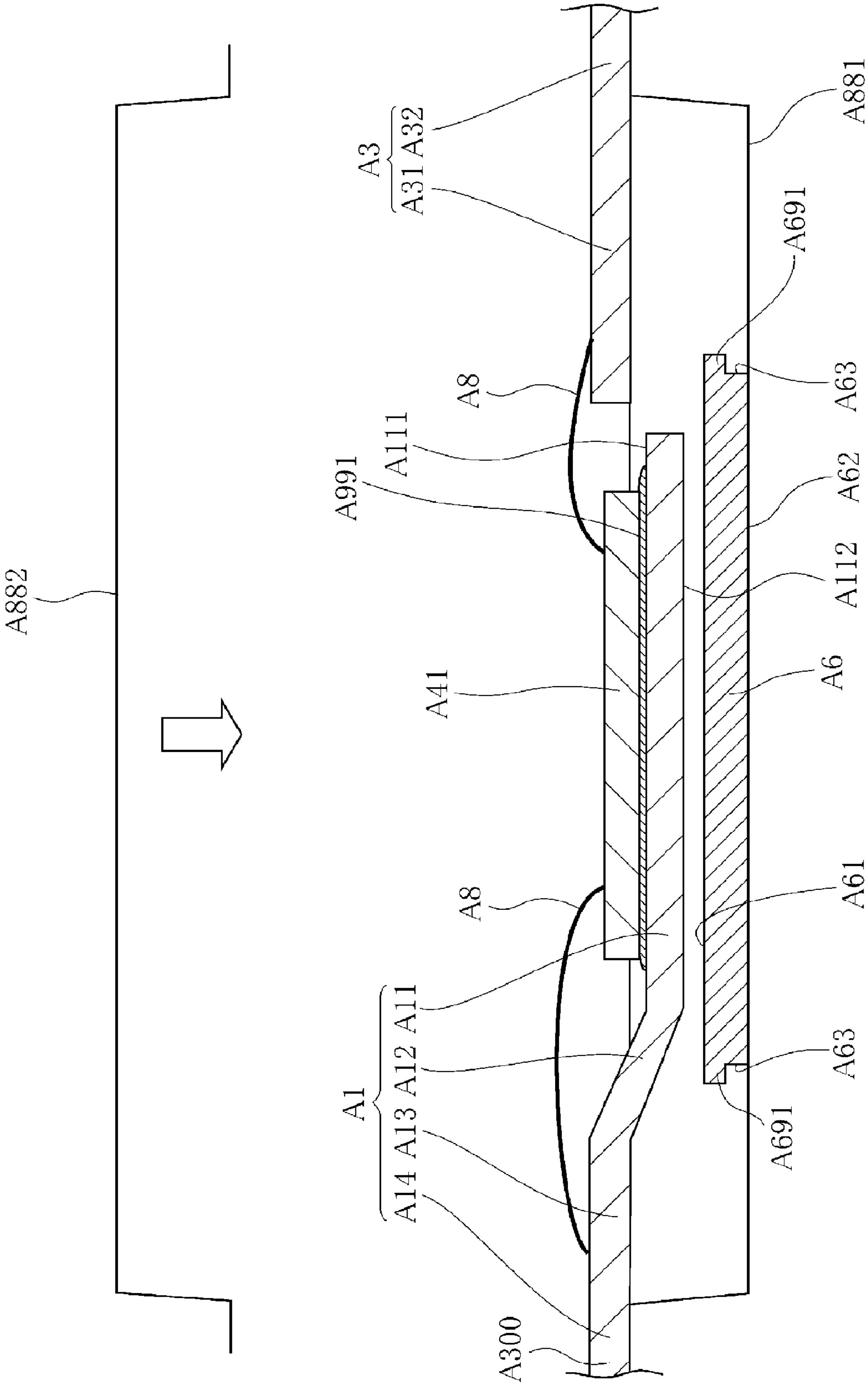
FIG. 18 is a section view illustrating a process subsequent to the process shown in FIG. 17.

Next, a first mold A881 and a second mold A882 shown in FIGS. 17 and 18 are prepared. The resin encapsulation portion A7 is formed using the first mold A881 and the second mold A882.

First, the heat radiation plate A6 is arranged in the first mold A881. Then, the lead frame A300 is placed on the edge of the first mold A881 (see FIG. 18). When the lead frame A300 is placed on the edge of the first mold A881, a gap is formed between the heat radiation plate A6 and the die pad sections A11.

Figure 19:
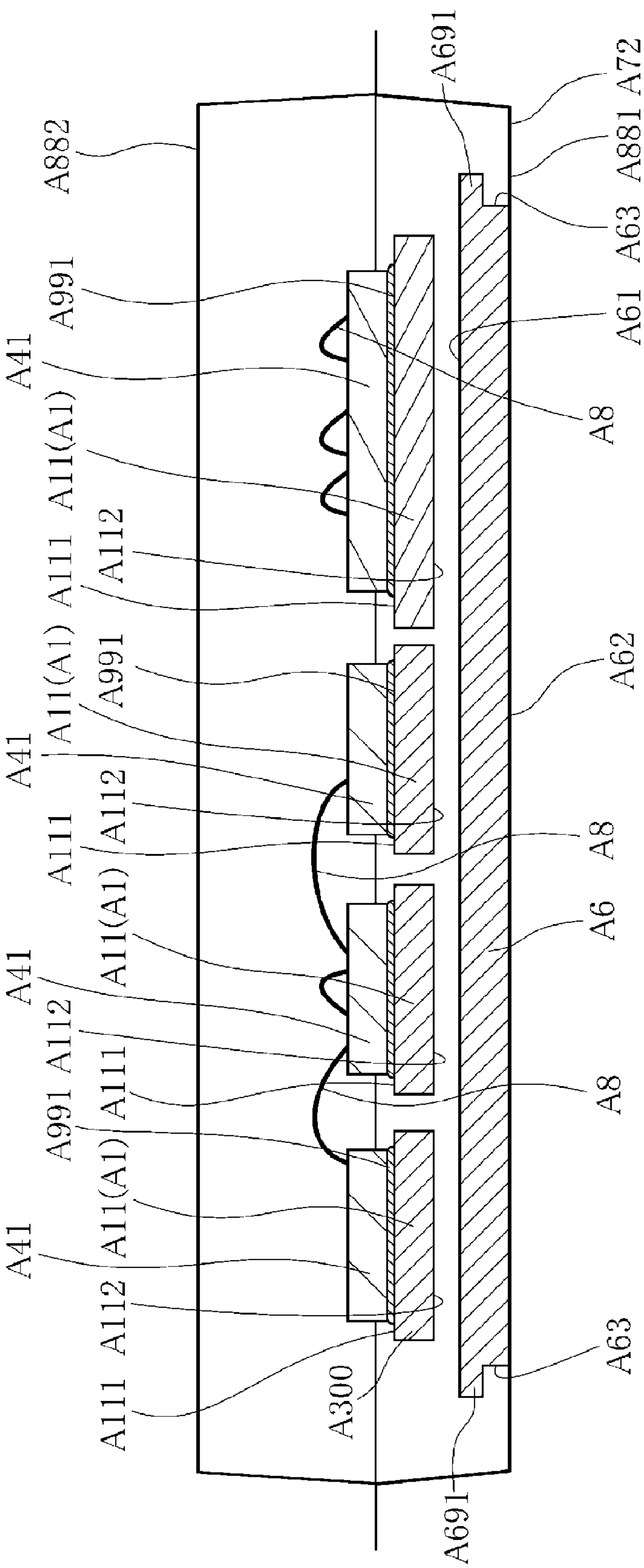
FIG. 19 is a section view illustrating a process subsequent to the process shown in FIG. 18.
Figure 20:
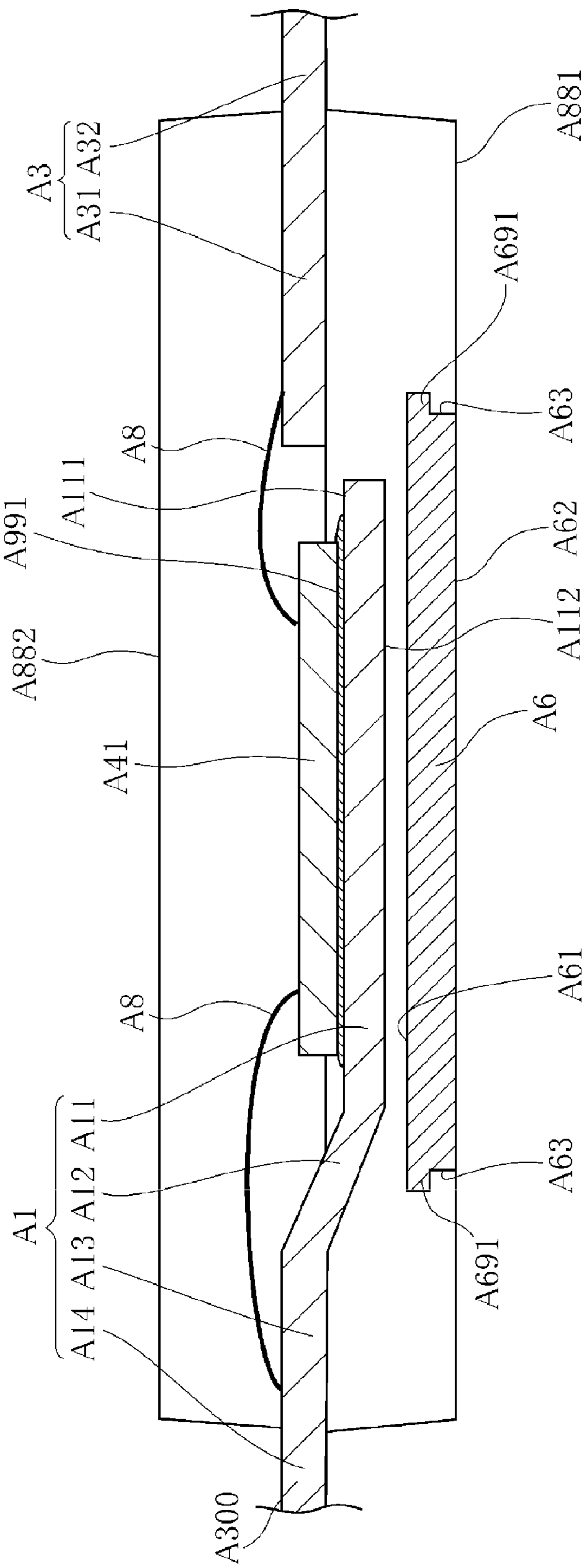
FIG. 20 is a section view illustrating a process subsequent to the process shown in FIG. 19.

Subsequently, as shown in FIGS. 19 and 20, the heat radiation plate A6, the die pad sections A11, the semiconductor chips A41 and A42, the passive chips A43 and the wires A8 are enclosed by the first mold A881 and the second mold A882. Then, a resin material is injected into the space surrounded by the first mold A881 and the second mold A882. When the resin material is injected into the space surrounded by the first mold A881 and the second mold A882, the heat radiation plate A6 and the die pad sections A11 are not bonded to each other.

Figure 21:
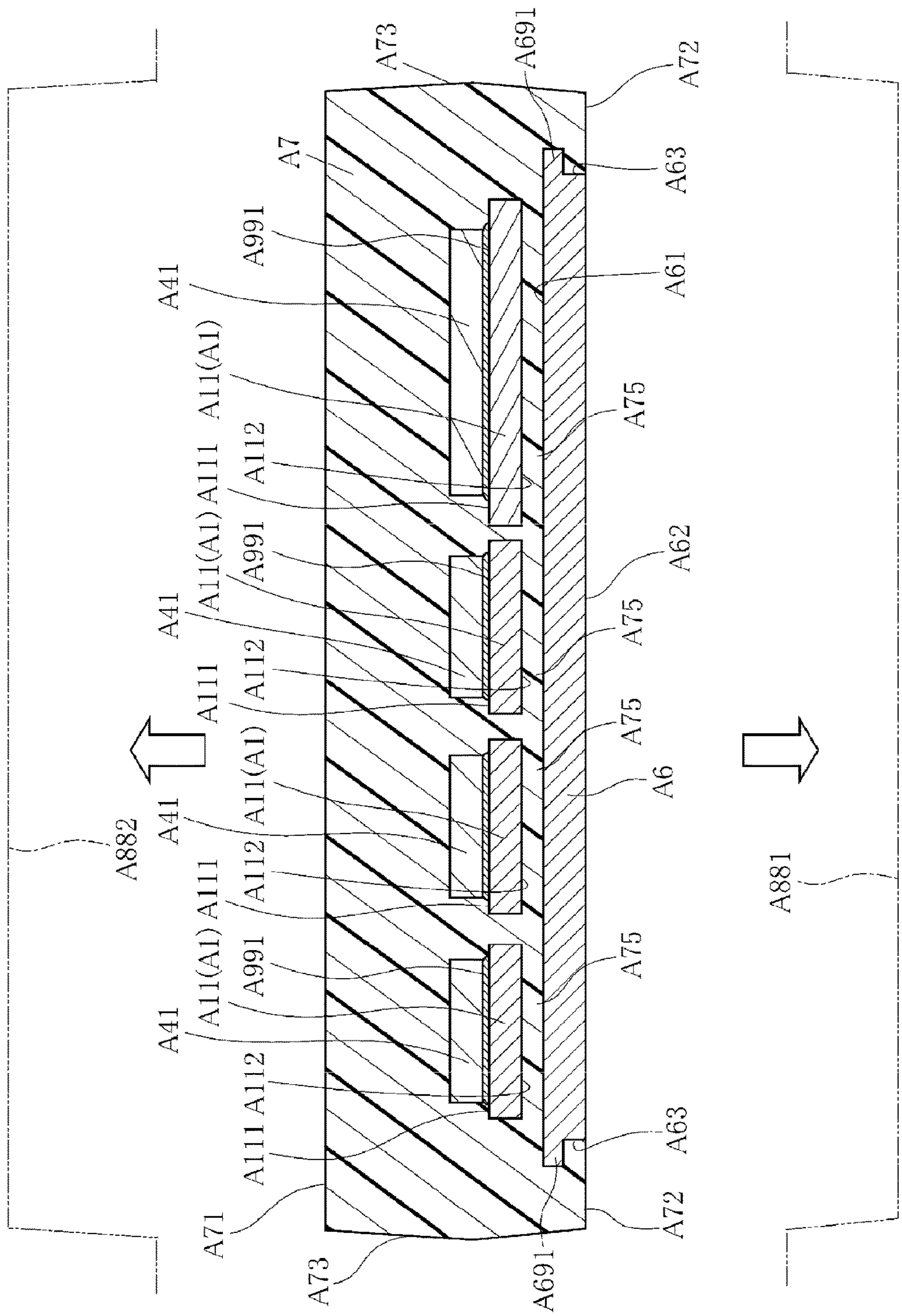
FIG. 21 is a section view illustrating a process subsequent to the process shown in FIG. 20.
Figure 22:
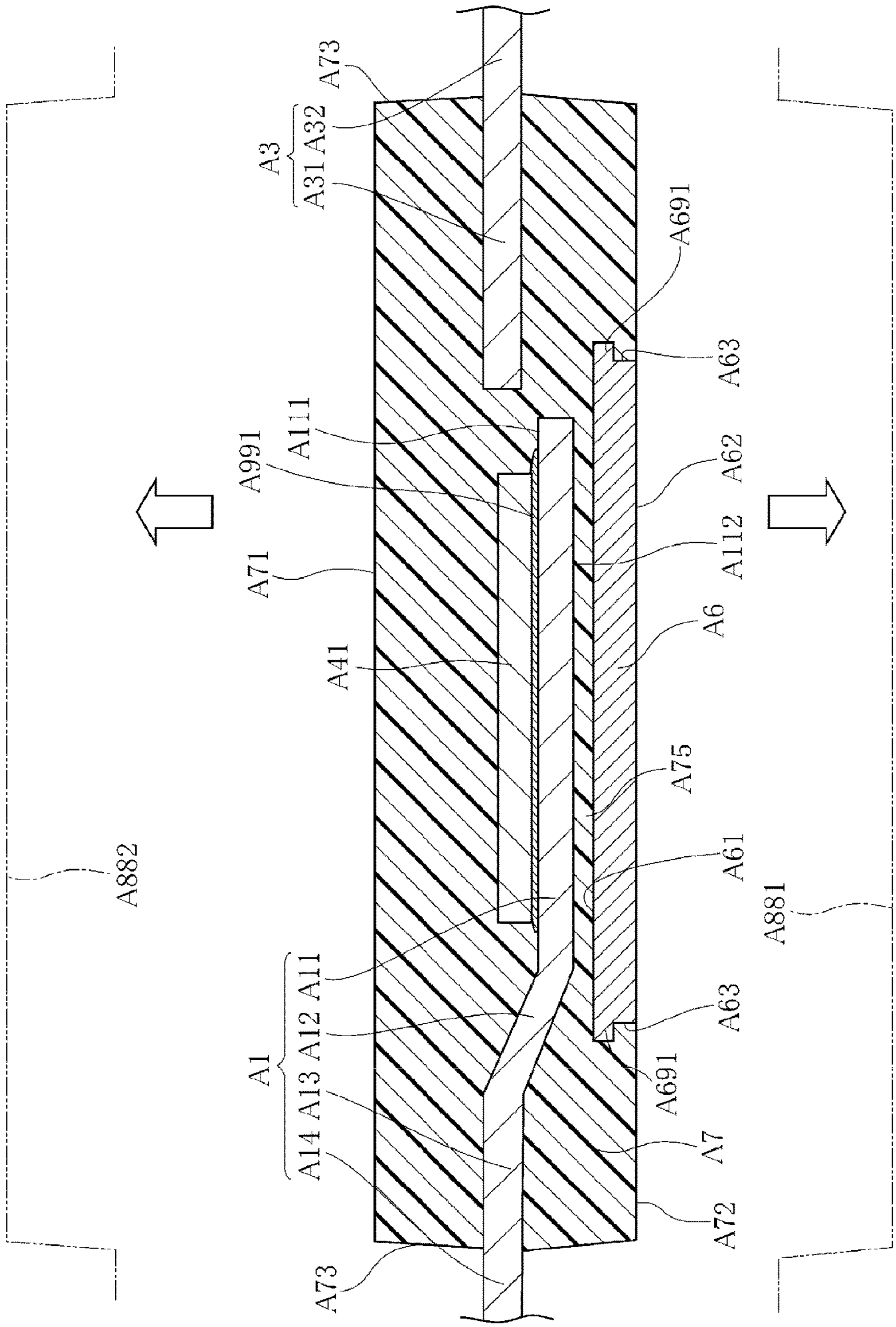
FIG. 22 is a section view illustrating a process subsequent to the process shown in FIG. 21.

The resin material is cured after it is injected into the space surrounded by the first mold A881 and the second mold A882. The resin encapsulation portion A7 shown in FIGS. 21 and 22 is formed by curing the resin material. As the resin material is cured, the heat radiation plate A6 and the die pad sections A11 are joined together. Then, as shown in FIGS. 21 and 22, the first mold A881 and the second mold A882 are removed from the resin encapsulation portion A7.

Thereafter, the lead frame A300 shown in FIG. 16 is appropriately diced to thereby manufacture the semiconductor device A100 shown in FIG. 12.

Next, description will be made on the operations and effects of the present embodiment.

In the manufacturing method of the semiconductor device A100, the heat radiation plate A6 and the die pad sections A11 are joined together by the resin encapsulation portion A7 when forming the resin encapsulation portion A7. With this configuration, it is not necessary to join the heat radiation plate A6 and the die pad sections A11 through a joining layer other than the resin encapsulation portion A7. For that reason, it is possible to reduce the cost involved in providing a joining layer for joining the heat radiation plate A6 and the die pad sections A11. With the configuration of the present embodiment, the heat radiation plate A6 and the die pad sections A11 can be joined together simultaneously while forming the resin encapsulation portion A7. Therefore, it is not necessary to join the heat radiation plate A6 and the die pad sections A11 apart from forming the resin encapsulation portion A7. This makes it possible to enhance the manufacturing efficiency of the semiconductor device. With the manufacturing method of the semiconductor device A100 described above, it is possible to reduce the manufacturing cost and to enhance the manufacturing efficiency.

First Modified Example of the Second Embodiment

A first modified example of the second embodiment of the present disclosure will be described with reference to FIGS. 23 through 26.

Figure 23:
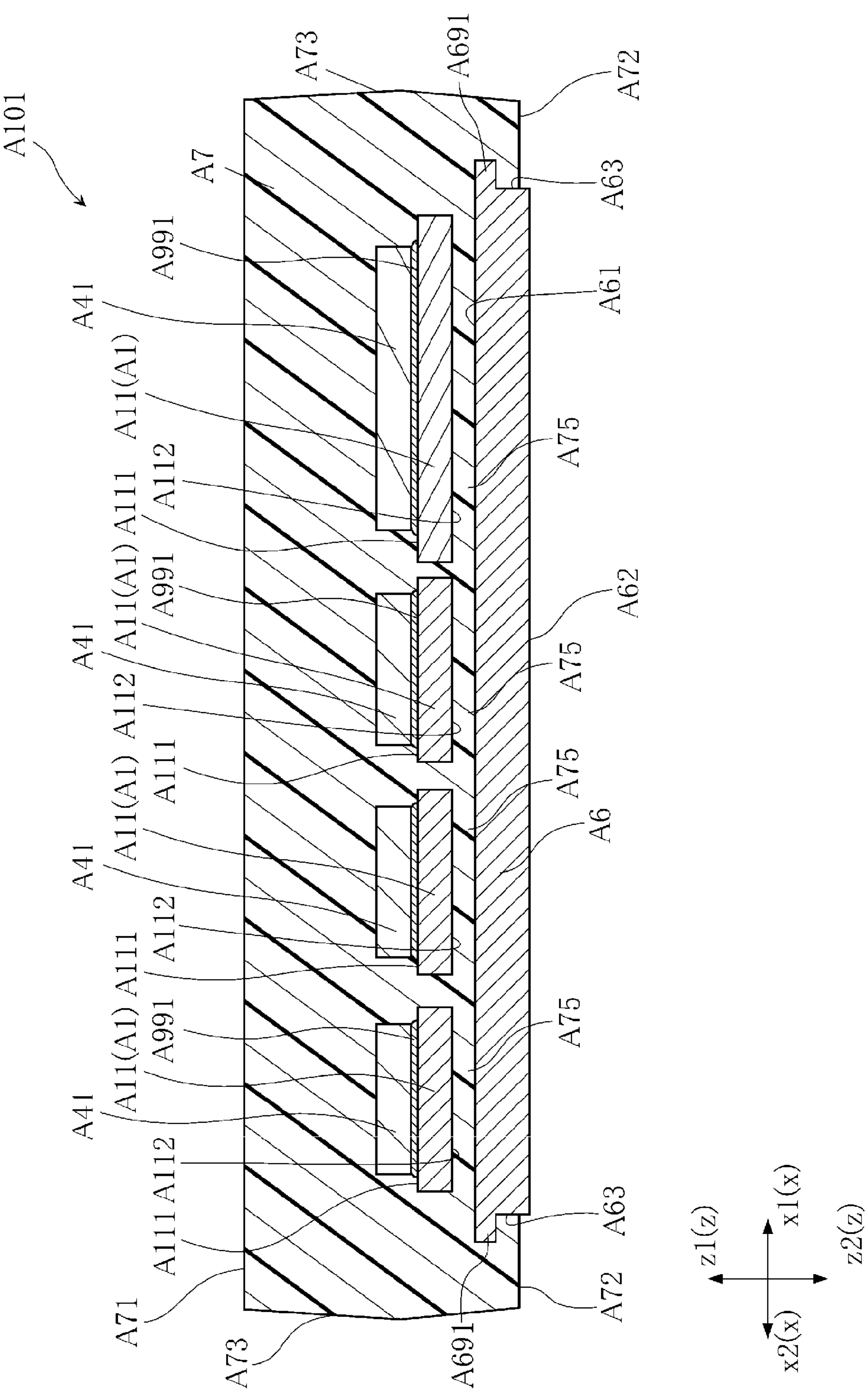
FIG. 23 is a section view illustrating a semiconductor device according to a first modified example of the second embodiment of the present disclosure.
Figure 24:
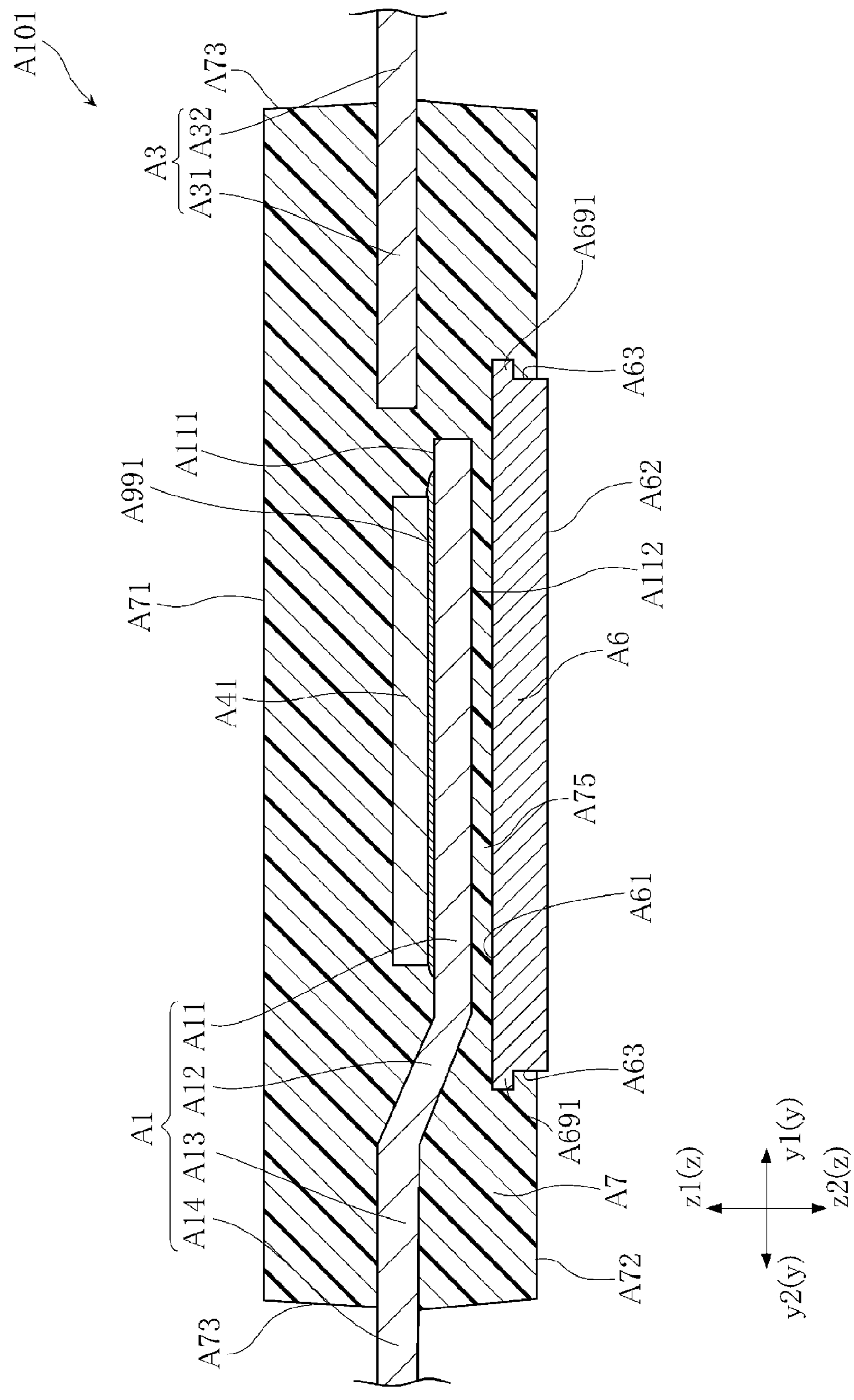
FIG. 24 is a section view illustrating the semiconductor device according to the first modified example of the second embodiment of the present disclosure.

FIG. 23 is a section view illustrating a semiconductor device according to a first modified example of the second embodiment of the present disclosure. FIG. 24 is a section view illustrating the semiconductor device according to the first modified example of the second embodiment of the present disclosure.

The semiconductor device A101 shown in these figures includes first electrode portions A1, second electrode portions A2, third electrode portions A3, semiconductor chips A41 and A42, passive chips A43, a heat radiation plate A6, an resin encapsulation portion A7, wires A8 and a joining layer A991. Except for the heat radiation plate A6, the respective components of the semiconductor device A101 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A100 and, therefore, will not be described.

The heat radiation plate A6 has a major surface A61, a rear surface A62 and a side surface A63. The major surface A61 is the same as that of the semiconductor device A100 and, therefore, will not be described. The rear surface A62 faces an opposite direction from which the major surface A61 faces. The rear surface A62 is exposed from the resin bottom surface A72 of the resin encapsulation portion A7. In the present modified example, the heat radiation plate A6 has a section protruding toward the facing direction of the rear surface A62 (the direction z2) beyond the resin bottom surface A72. For that reason, the rear surface A62 is positioned at the direction z2 with respect to the resin bottom surface A72. When the semiconductor device A101 is in use, the rear surface A62 makes contact with the heat radiation member A808. The side surface A63 is smooth and is perpendicular to the rear surface A62. A portion of the side surface A63 is covered by the resin encapsulation portion A7 and a portion of the side surface A63 is exposed from the resin encapsulation portion A7. Unlike the present modified example, the side surface A63 as a whole may be covered by the resin encapsulation portion A7.

Except the points described above, specific configurations of the heat radiation plate A6 are the same as those of the semiconductor device A100 and, therefore, will not be described.

Next, description will be made on a manufacturing method of the semiconductor device A101.

First, the article shown in FIG. 16 is manufactured through the same processes as described with respect to the semiconductor device A100.

Figure 25:
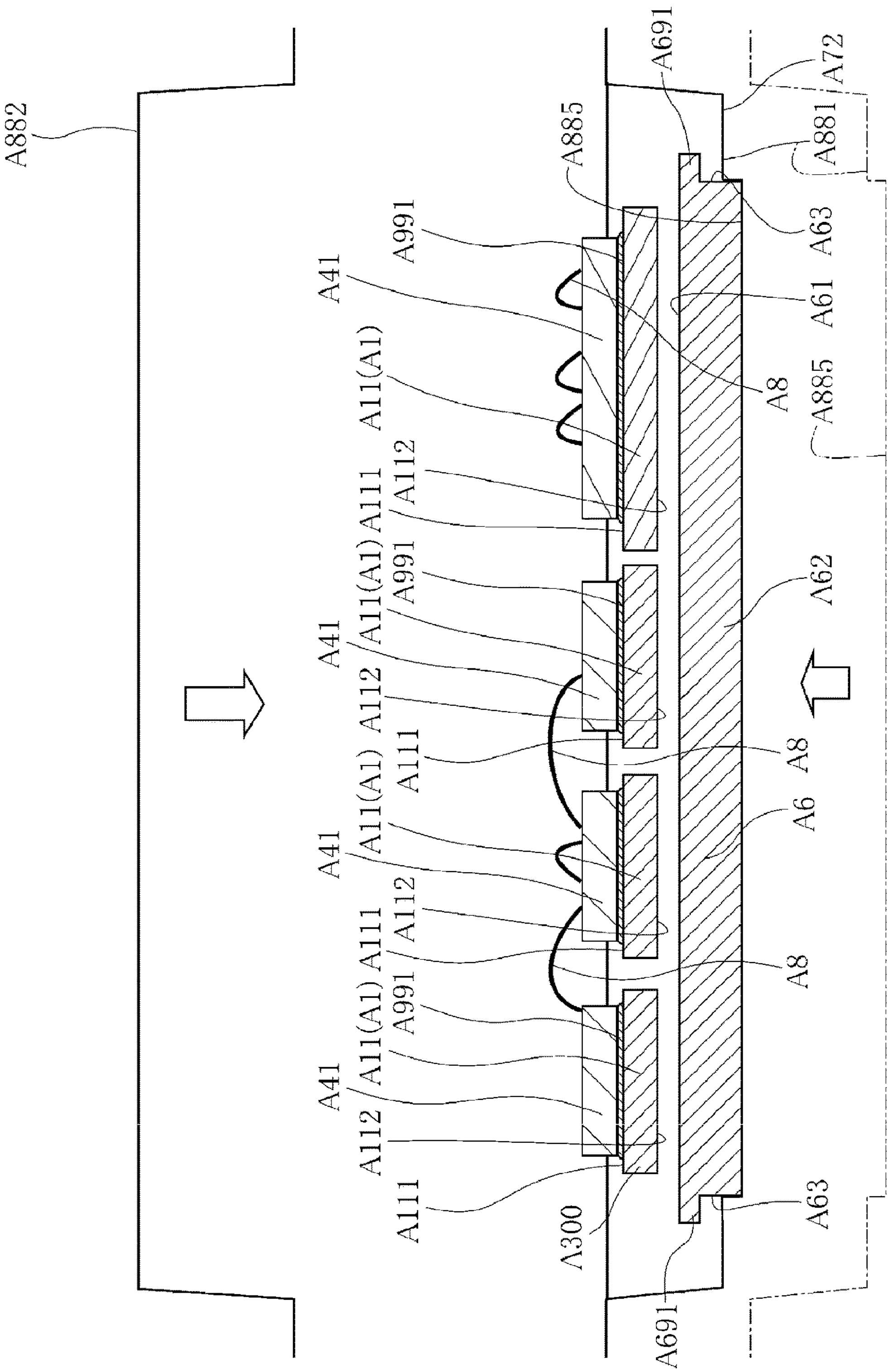
FIG. 25 is a section view illustrating one process of a manufacturing method of the semiconductor device according to the first modified example of the second embodiment of the present disclosure.
Figure 26:
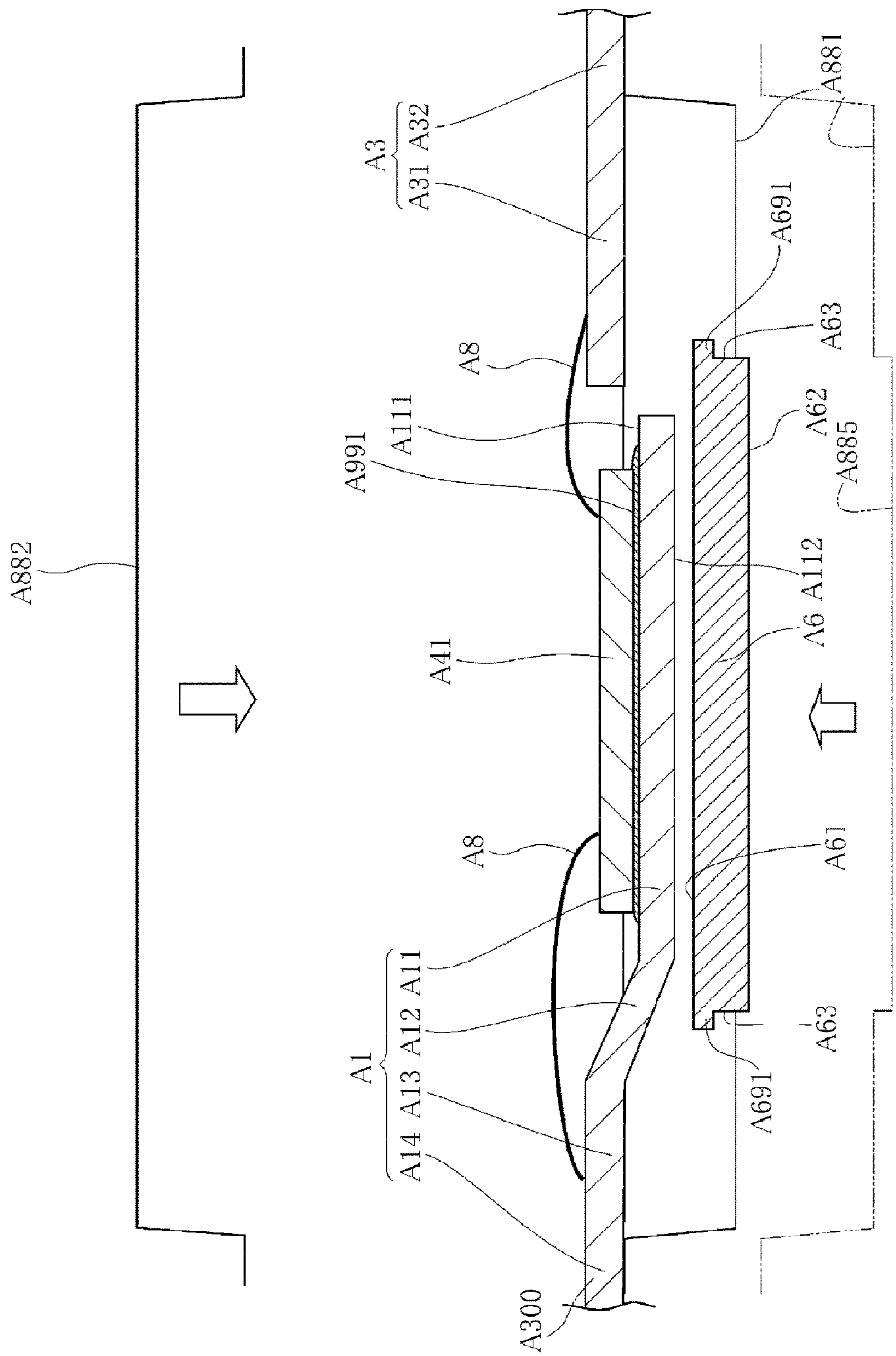
FIG. 26 is a section view illustrating one process of the manufacturing method of the semiconductor device according to the first modified example of the second embodiment of the present disclosure.

Then, a first mold A881 and a second mold A882 shown in FIGS. 25 and 26 are prepared. The resin encapsulation portion A7 is formed using the first mold A881 and the second mold A882. In the present modified example, a recess portion A885 is formed in the first mold A881. The plan-view size of the recess portion A885 is a little larger than the plan-view size of the heat radiation plate A6.

First, the heat radiation plate A6 is arranged in the first mold A881. In the present modified example, the heat radiation plate A6 is arranged in the recess portion A885 of the first mold A881 (see FIG. 26). Then, the lead frame A300 is placed on the edge of the first mold A881. In the state that the lead frame A300 is placed on the edge of the first mold A881, a gap is formed between the heat radiation plate A6 and the die pad sections A11. Subsequently, the heat radiation plate A6, the die pad sections A11, the semiconductor chips A41 and A42, the passive chips A43 and the wires A8 are enclosed by the first mold A881 and the second mold A882. Then, a resin material is injected into the space surrounded by the first mold A881 and the second mold A882. At the time when the resin material is injected into the space surrounded by the first mold A881 and the second mold A882, the heat radiation plate A6 and the die pad sections A11 are not bonded to each other.

The resin material is cured after it is injected into the space surrounded by the first mold A881 and the second mold A882. The resin encapsulation portion A7 is formed by curing the resin material. As the resin material is cured, the heat radiation plate A6 and the die pad sections A11 are joined together. Then, the first mold A881 and the second mold A882 are removed from the resin encapsulation portion A7.

Thereafter, as described above with respect to the semiconductor device A100, the lead frame A300 is appropriately diced to thereby manufacture the semiconductor device A101.

Next, description will be made on the operations and effects of the present modified example.

With the manufacturing method of the semiconductor device A101, for the same reason as described above with respect to the semiconductor device A100, it is possible to reduce the manufacturing cost and to enhance the manufacturing efficiency.

In the semiconductor device A101, the heat radiation plate A6 has a section protruding toward the facing direction of the rear surface A62 (the z2 direction) beyond the resin bottom surface A72. For that reason, the rear surface A62 is positioned in the z2 direction with respect to the resin bottom surface A72. With this configuration, it is hard to for the heat radiation member A808 to be contact with the resin bottom surface A72. This makes it easy to bring the rear surface A62 of the heat radiation plate A6 into contact with the heat radiation member A808. Accordingly, the heat transferred from the semiconductor chips A41 to the heat radiation plate A6 can be efficiently transferred to the heat radiation member A808.

As set forth above, the first mold A881 having the recess portion A885 is used in manufacturing the semiconductor device A101. Since the heat radiation plate A6 is arranged in the recess portion A885, it is possible to prevent the heat radiation plate A6 from moving within the space by the flow of the resin material when the resin material is injected into the space surrounded by the first mold A881 and the second mold A882. With the present modified example, it is therefore possible to precisely arrange the heat radiation plate A6 in a desired position.

Second Modified Example of the Second Embodiment

A second modified example of the second embodiment of the present disclosure will be described with reference to FIGS. 27 through 28.

Figure 27:
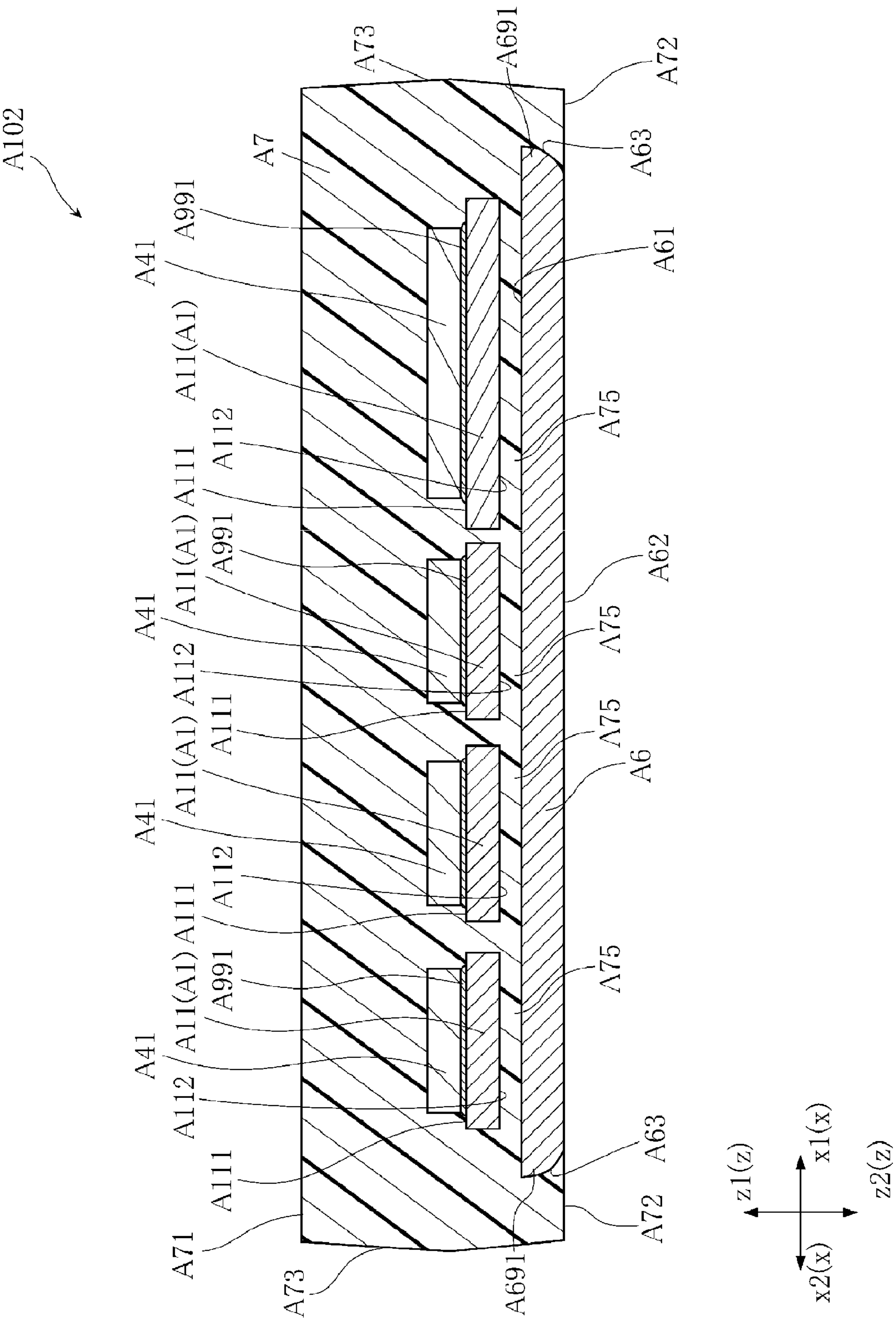
FIG. 27 is a section view illustrating a semiconductor device according to a second modified example of the second embodiment of the present disclosure.
Figure 28:
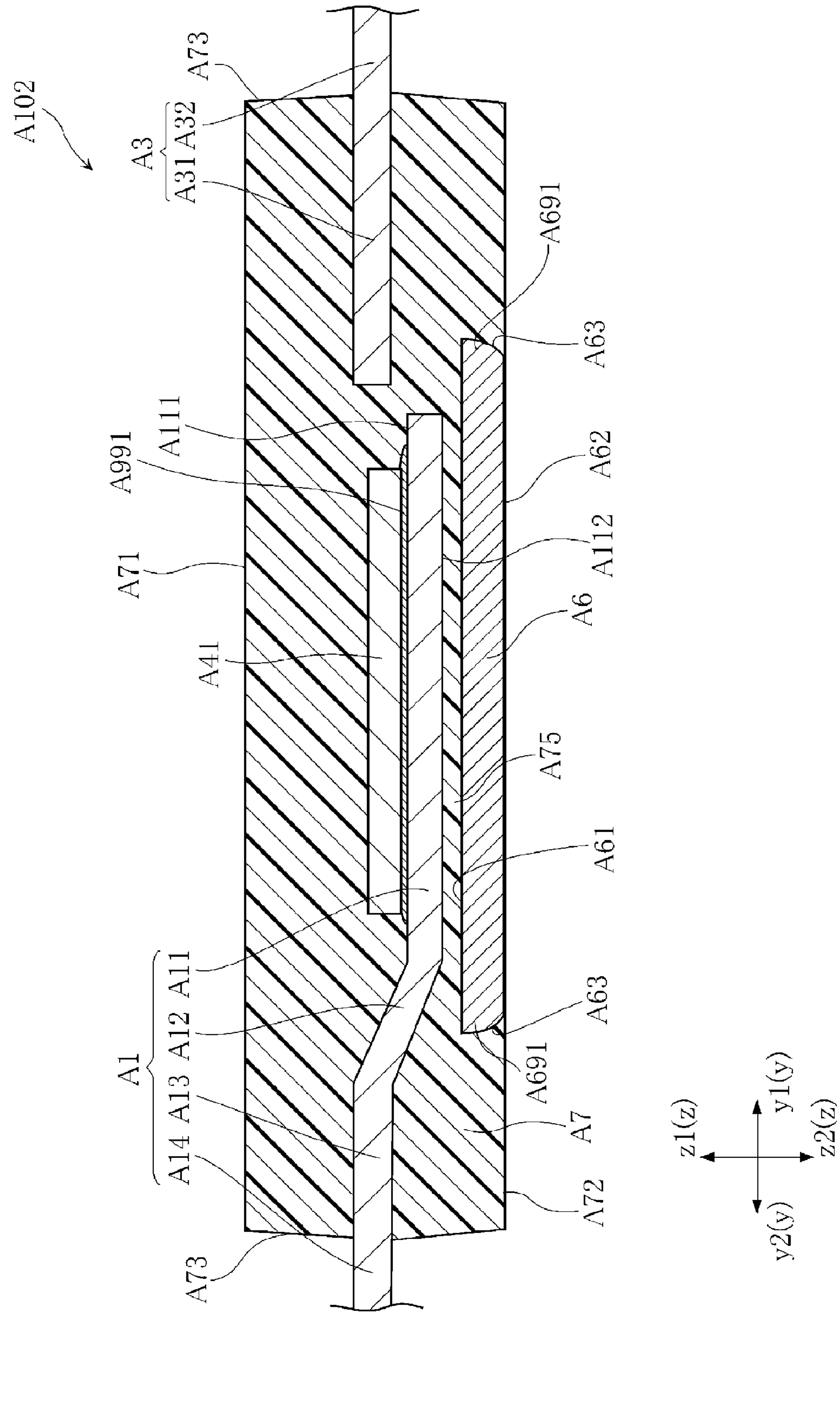
FIG. 28 is a section view illustrating the semiconductor device according to the second modified example of the second embodiment of the present disclosure.

FIGS. 27 and 28 are section views illustrating a semiconductor device according to a second modified example of the second embodiment of the present disclosure.

The semiconductor device A102 shown in these figures includes first electrode portions A1, second electrode portions A2, third electrode portions A3, semiconductor chips A41 and A42, passive chips A43, a heat radiation plate A6, a resin encapsulation portion A7, wires A8 and a joining layer A991. Except for the heat radiation plate A6, the respective components of the semiconductor device A102 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A100 and, therefore, will not be described.

The heat radiation plate A6 of the present modified example differs from the heat radiation plate A6 of the semiconductor device A100 in terms of the cross-sectional shape. The heat radiation plate A6 has a major surface A61, a rear surface A62 and a side surface A63. The major surface A61 and the rear surface A62 are the same as those of the semiconductor device A100 and, therefore, will not be described. The side surface A63 has a curved surface shape. The side surface A63 as a whole is covered by the resin encapsulation portion A7.

Except the points described above, specific configurations of the heat radiation plate A6 are the same as those of the semiconductor device A100 and, therefore, will not be described.

Next, description will be made on the operations and effects of the present modified example.

With the manufacturing method of the semiconductor device A102, for the same reason as described above with respect to the semiconductor device A100, it is possible to reduce the manufacturing cost and to enhance the manufacturing efficiency. Further, according to the present modified example, the curved shape of the side surface A63 can improve its manufacturability. Also, the resin encapsulation portion A7 covered on the side surface A63 can prevent foam (or bubbles) from forming on the side surface A63.

Third Modified Example of the Second Embodiment

A third modified example of the second embodiment of the present disclosure will be described with reference to FIGS. 29 through 30.

Figure 29:
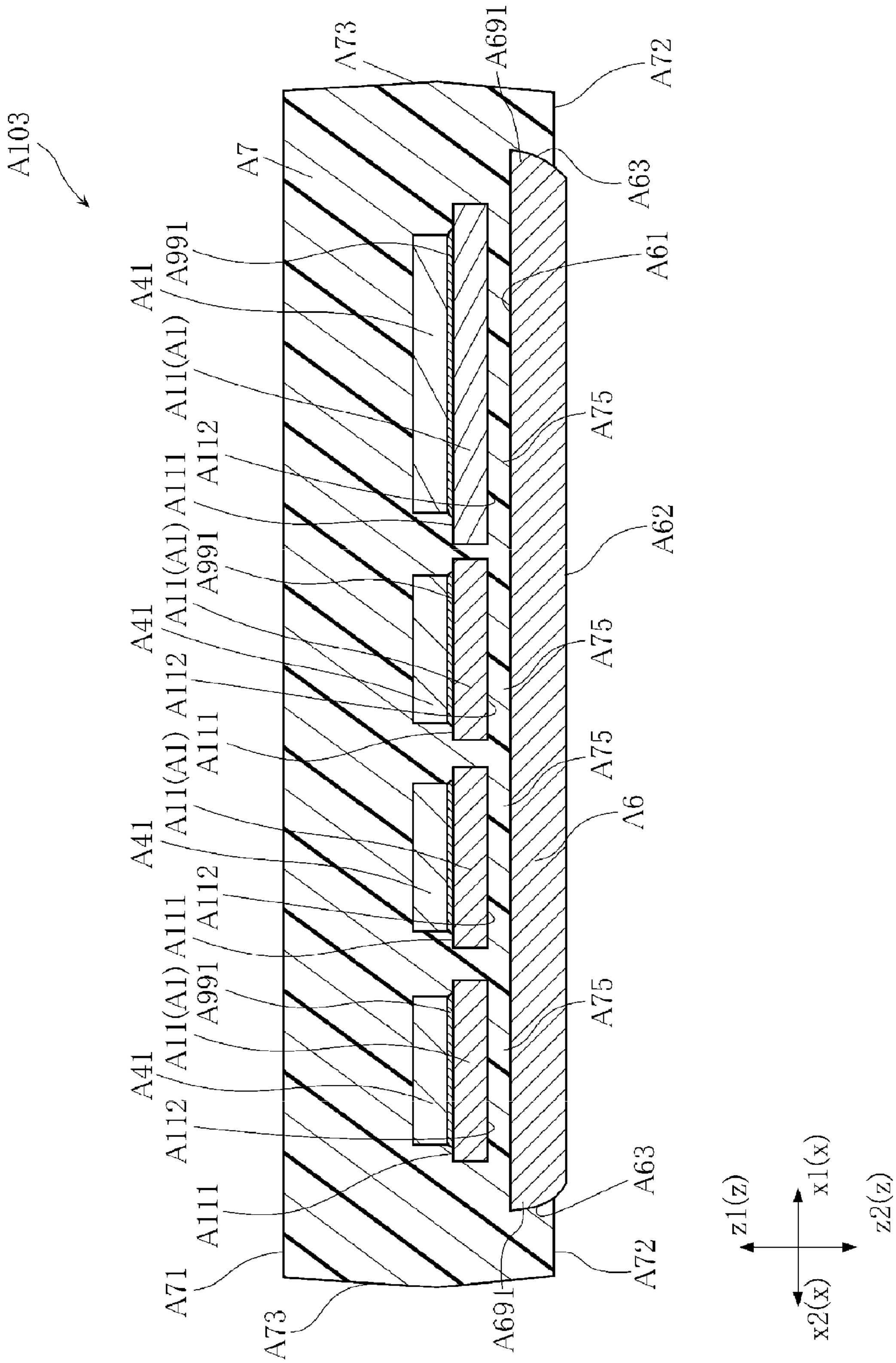
FIG. 29 is a section view illustrating a semiconductor device according to a third modified example of the second embodiment of the present disclosure.
Figure 30:
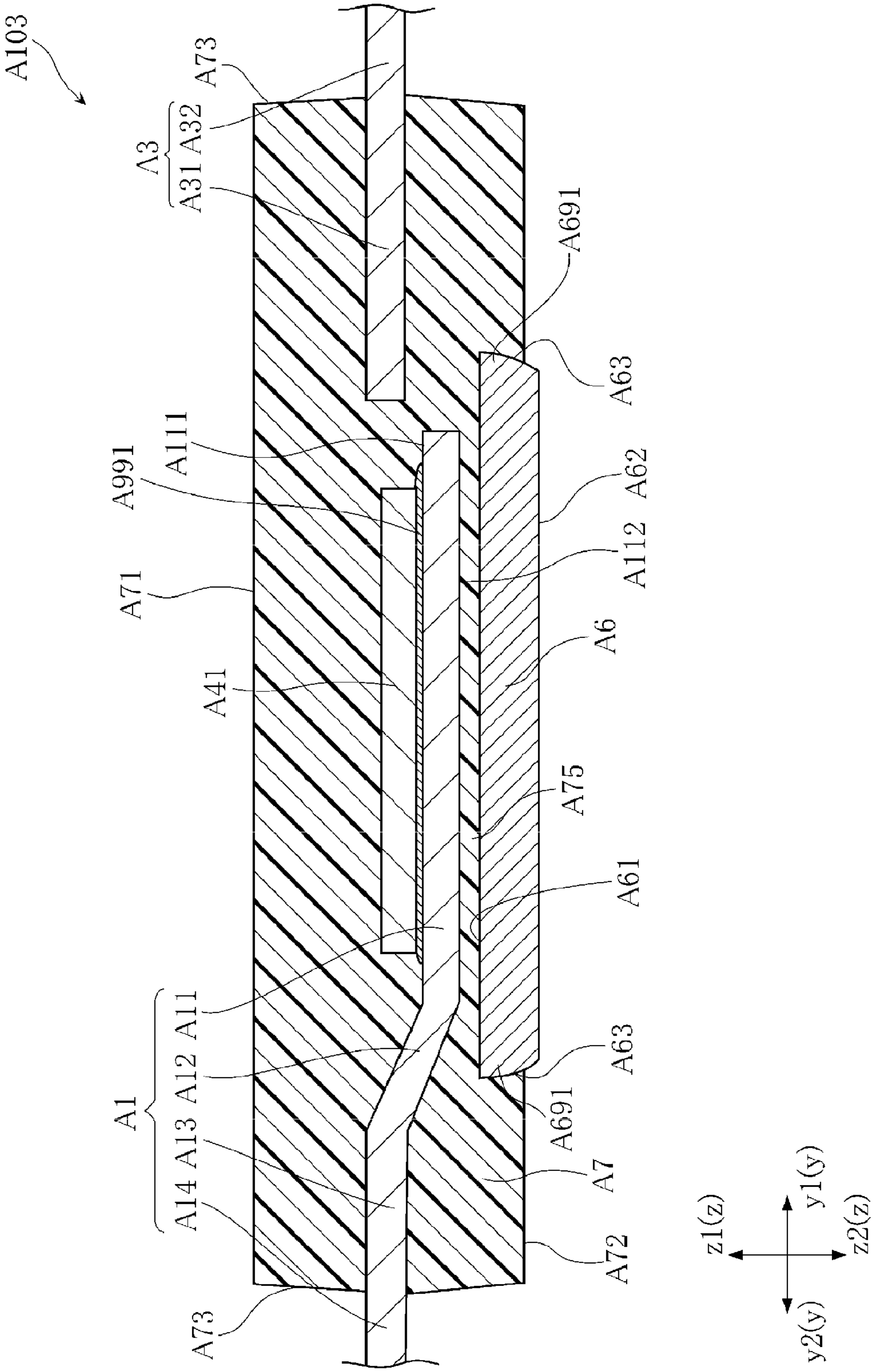
FIG. 30 is a section view illustrating the semiconductor device according to the third modified example of the second embodiment of the present disclosure.

FIGS. 29 and 30 are section views illustrating a semiconductor device according to a third modified example of the second embodiment of the present disclosure.

The semiconductor device A103 shown in these figures includes first electrode portions A1, second electrode portions A2, third electrode portions A3, semiconductor chips A41 and A42, passive chips A43, a heat radiation plate A6, an resin encapsulation portion A7, wires A8 and a joining layer A991. Except the heat radiation plate A6, the respective components of the semiconductor device A103 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A102 and, therefore, will not be described.

The heat radiation plate A6 has a major surface A61, a rear surface A62 and a side surface A63. The major surface A61 is the same as that of the semiconductor device A102 and, therefore, will not be described. The rear surface A62 faces in an opposite direction from which the major surface A61 faces. The rear surface A62 is exposed from the resin bottom surface A72 of the resin encapsulation portion A7. In the present modified example, the heat radiation plate A6 has a section protruding toward the facing direction of the rear surface A62 (the z2 direction) beyond the resin bottom surface A72. For that reason, the rear surface A62 is positioned in the z2 direction with respect to the resin bottom surface A72. When the semiconductor device A103 is in use, the rear surface A62 makes contact with the heat radiation member A808. The side surface A63 has a curved surface shape. A portion of the side surface A63 is covered by the resin encapsulation portion A7 and a portion of the side surface A63 is exposed from the resin encapsulation portion A7. Unlike the present modified example, the side surface A63 as a whole may be covered by the resin encapsulation portion A7.

Except the points described above, specific configurations of the heat radiation plate A6 are the same as those of the semiconductor device A102 and, therefore, will not be described.

When manufacturing the semiconductor device A103, it may be possible to use the first mold A881 having a recess portion A885, which is the same as used in manufacturing the semiconductor device A101.

Next, description will be made on the operations and effects of the present modified example.

With the manufacturing method of the semiconductor device A103, for the same reason as described above with respect to the semiconductor device A100, it is possible to reduce the manufacturing cost and to enhance the manufacturing efficiency.

With the semiconductor device A103, for the same reason as described above with respect to the semiconductor device A101, the heat transferred from the semiconductor chips A41 to the heat radiation plate A6 can be efficiently transferred to the heat radiation member A808.

With the semiconductor device A103, for the same reason as described above with respect to the semiconductor device A101, it is possible to precisely arrange the heat radiation plate A6 in a desired position.

Fourth Modified Example of the Second Embodiment

A fourth modified example of the second embodiment of the present disclosure will be described with reference to FIGS. 31 through 32.

Figure 31:
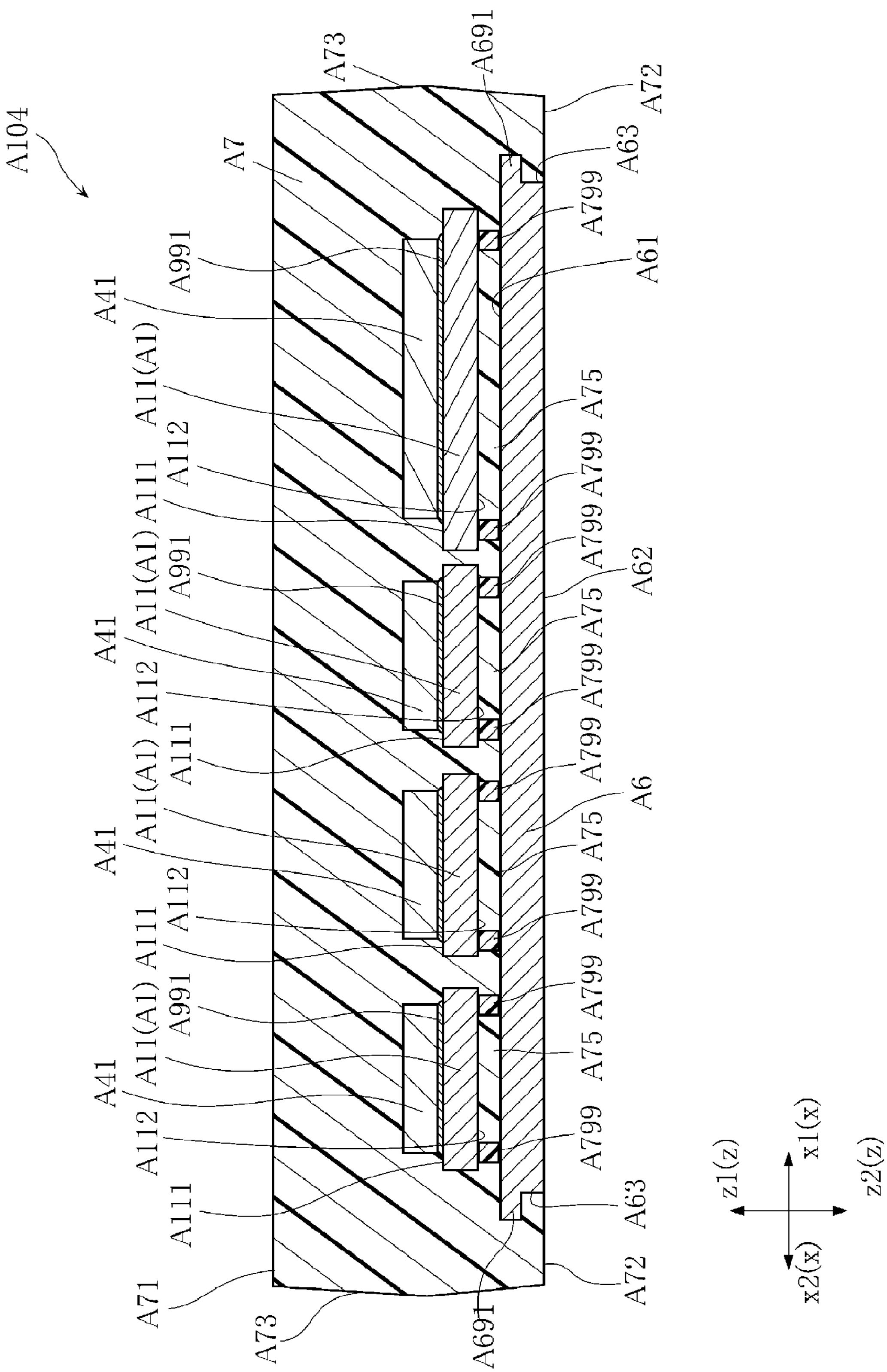
FIG. 31 is a section view illustrating a semiconductor device according to a fourth modified example of the second embodiment of the present disclosure.
Figure 32:
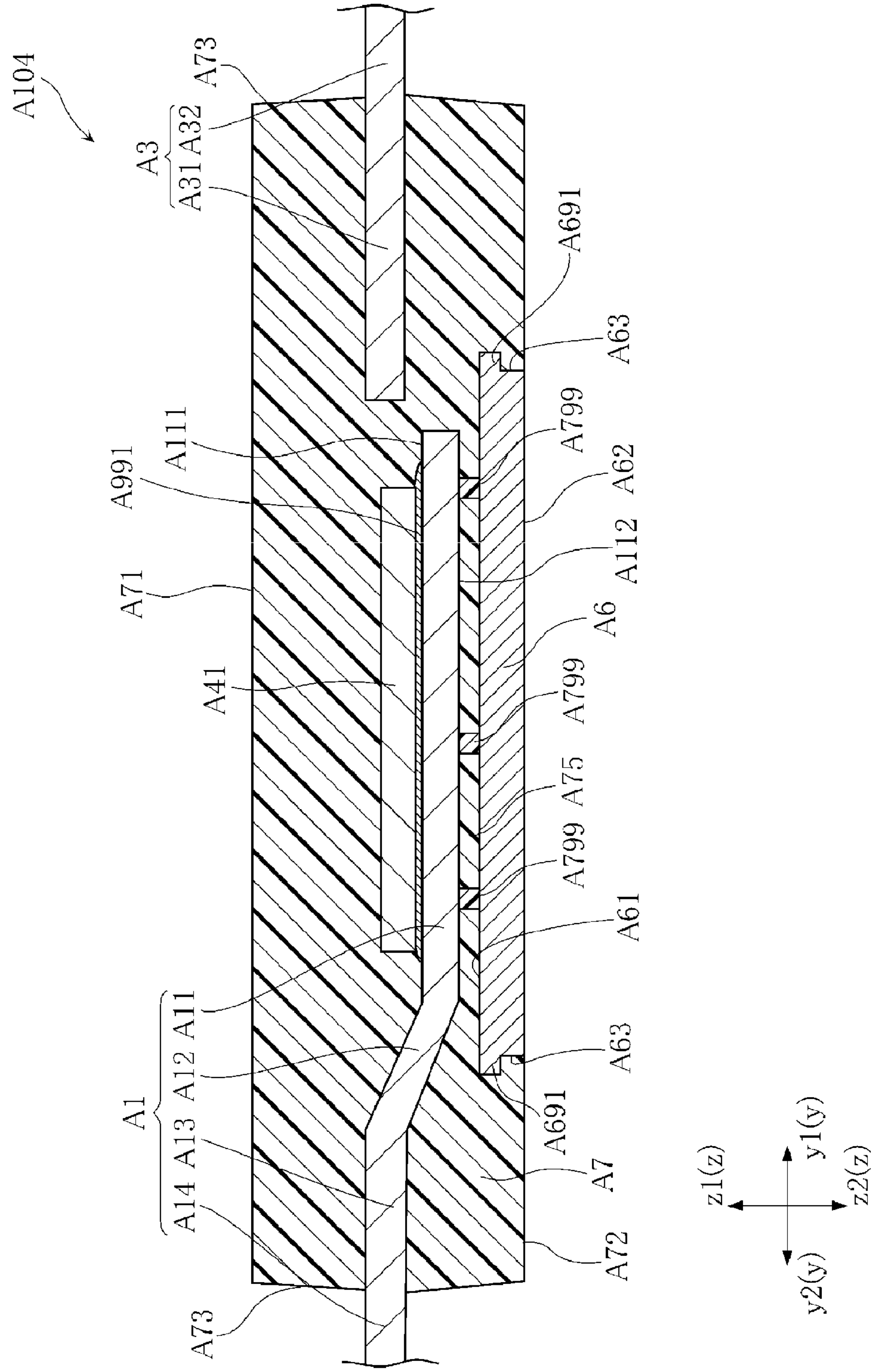
FIG. 32 is a section view illustrating the semiconductor device according to the fourth modified example of the second embodiment of the present disclosure.

FIGS. 31 and 32 are section views illustrating a semiconductor device according to a fourth modified example of the second embodiment of the present disclosure.

The semiconductor device A104 shown in these figures differs from the semiconductor device A100 in that the semiconductor device A104 further includes a plurality of spacers A799. The respective spacers A799 exist between the die pad sections A11 and the heat radiation plate A6. The respective spacers A799 make direct contact with the die pad sections A11 and the heat radiation plate A6. The respective spacers A799 are made of an insulating material. In the present modified example, each of the spacers A799 has a cubical shape. Alternatively, each of the spacers A799 may have a spherical shape, a rod-like shape or other shapes. The spacers A799 are covered by the intermediate sections A75 of the resin encapsulation portion A7. With the present modified example, the spacers A799 define the clearance between the die pad sections A11 and the heat radiation plate A6. Accordingly, it is possible to accurately position the die pad sections A11 with respect to the heat radiation plate A6.

The configuration provided with the spacers A799 may be applied to one of the semiconductor devices A101, A102 and A103.

Third Embodiment

A third embodiment of the present disclosure will be described with reference to FIGS. 33 through 36.

Figure 33:
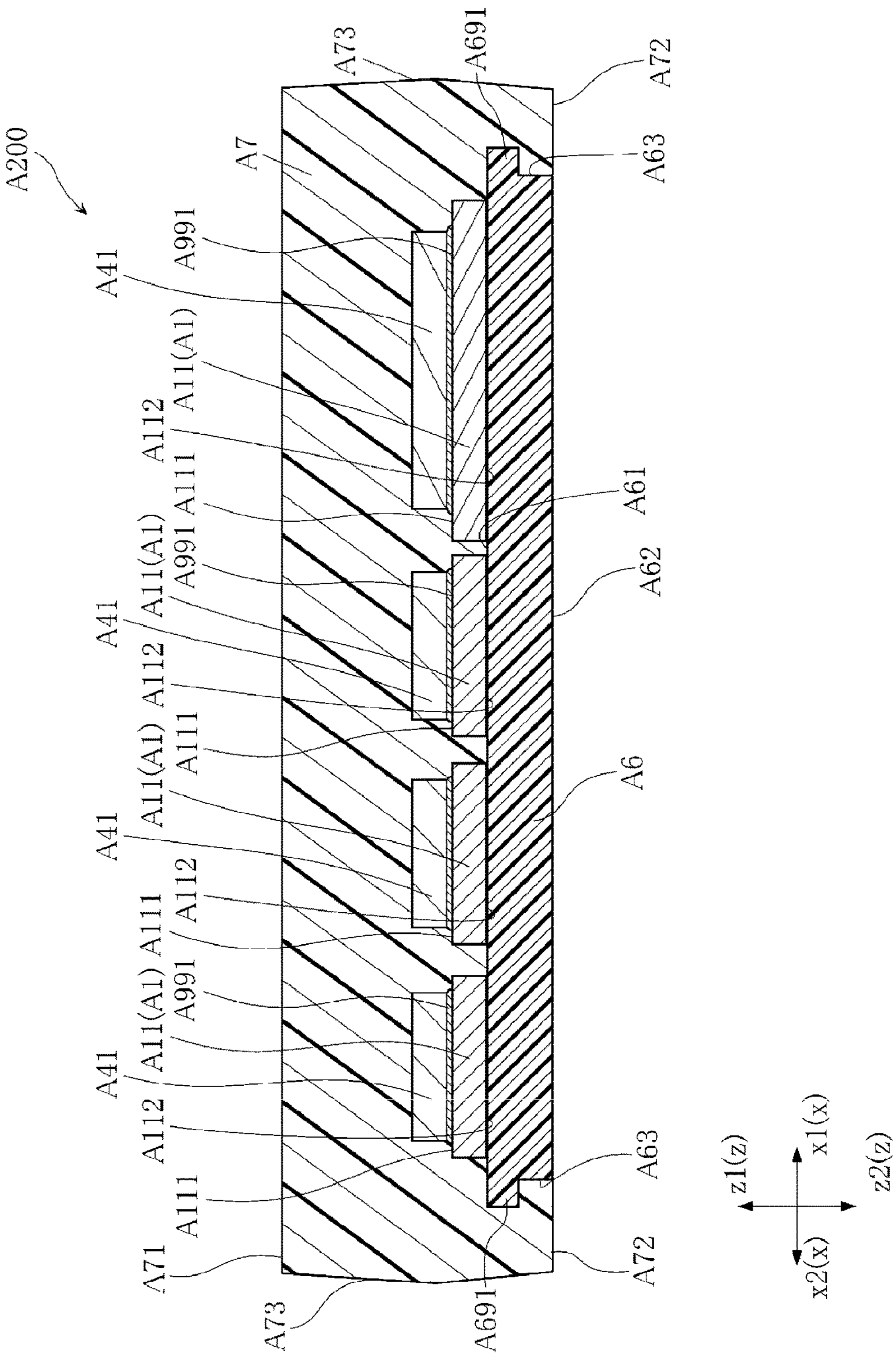
FIG. 33 is a section view illustrating a semiconductor device according to a third embodiment of the present disclosure.
Figure 34:
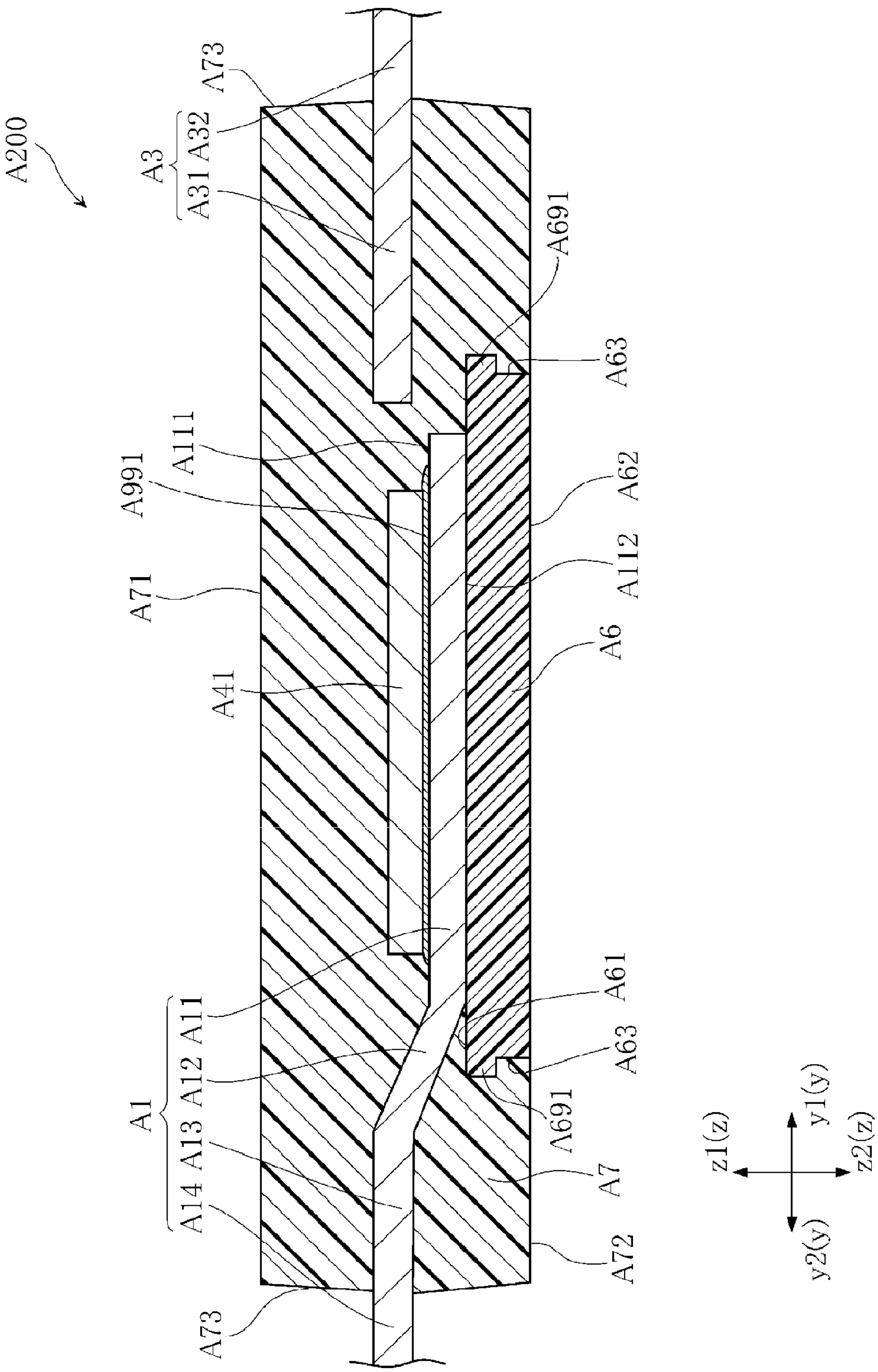
FIG. 34 is a section view illustrating the semiconductor device according to the third embodiment of the present disclosure.

FIGS. 33 and 34 are section views illustrating a semiconductor device according to a third embodiment of the present disclosure.

The semiconductor device A200 shown in these figures includes first electrode portions A1, second electrode portions A2, third electrode portions A3, semiconductor chips A41 and A42, passive chips A43, a heat radiation plate A6, an resin encapsulation portion A7, wires A8 and a joining layer A991. Except for the heat radiation plate A6 and the resin encapsulation portion A7, the respective components of the semiconductor device A200 including the first electrode portions A1, the second electrode portions A2, the third electrode portions A3, the semiconductor chips A41 and A42, the passive chips A43, the wires A8 and the joining layer A991 are the same as the respective components of the semiconductor device A100 and, therefore, will not be described.

The resin encapsulation portion A7 of the present embodiment remains the same as the configuration of the semiconductor device A100 except that the resin encapsulation portion A7 does not include the intermediate sections A75 stated above.

The heat radiation plate A6 directly faces the die pad sections A11. The heat radiation plate A6 of the present embodiment is formed into a plate-like shape to extend along the x-y plane. The heat radiation plate A6 makes direct contact with the die pad sections A11. The heat radiation plate A6 is exposed from the resin bottom surface A72 of the resin encapsulation portion A7.

The heat radiation plate A6 is provided to rapidly dissipate the heat generated in the semiconductor chips A41 to the outside of the semiconductor device A200. In order to rapidly dissipate the heat generated in the semiconductor chips A41 to the outside of the semiconductor device A200, it is preferred in some embodiments that the heat conductivity of the material making up the heat radiation plate A6 becomes larger. Specifically, the heat radiation plate A6 may be made of a material higher in heat conductivity than the material of which the resin encapsulation portion A7 is made. More specifically, the heat radiation plate A6 is made of a material higher in heat conductivity than the material of which the die pad sections A11 are made. In the present embodiment, the heat radiation plate A6 may be made of an insulating material. The insulating material may be, e.g., ceramic. Examples of the ceramic include alumina, aluminum nitride and silicon nitride.

The heat radiation plate A6 overlaps with all the die pad sections A11 when seen in an x-y plane view (see FIG. 13). While the semiconductor device A200 is provided with only one heat radiation plate A6, the semiconductor device A200 may be provided with a plurality of heat radiation plates. When the semiconductor device A200 is provided with a plurality of heat radiation plates, each of the heat radiation plates overlaps with one of the die pad sections A11 when seen in an x-y plane view.

The heat radiation plate A6 has a major surface A61, a rear surface A62 and a side surface A63. The major surface A61 directly faces the die pad rear surface A112 of each of the die pad sections A11. The major surface A61 makes direct contact with the die pad rear surface A112 of each of the die pad sections A11. In the present embodiment, the major surface A61 is smooth. The rear surface A62 and the side surface A63 are the same as those of the semiconductor device A100 and, therefore, will not be described.

The heat radiation plate A6 includes dropout prevention units A691. The dropout prevention units A691 are the same as those of the semiconductor device A100 and, therefore, will not be described.

Next, description will be made on a manufacturing method of the semiconductor device A200.

First, the article shown in FIG. 16 is manufactured through the same process as described with respect to the semiconductor device A100.

Figure 35:
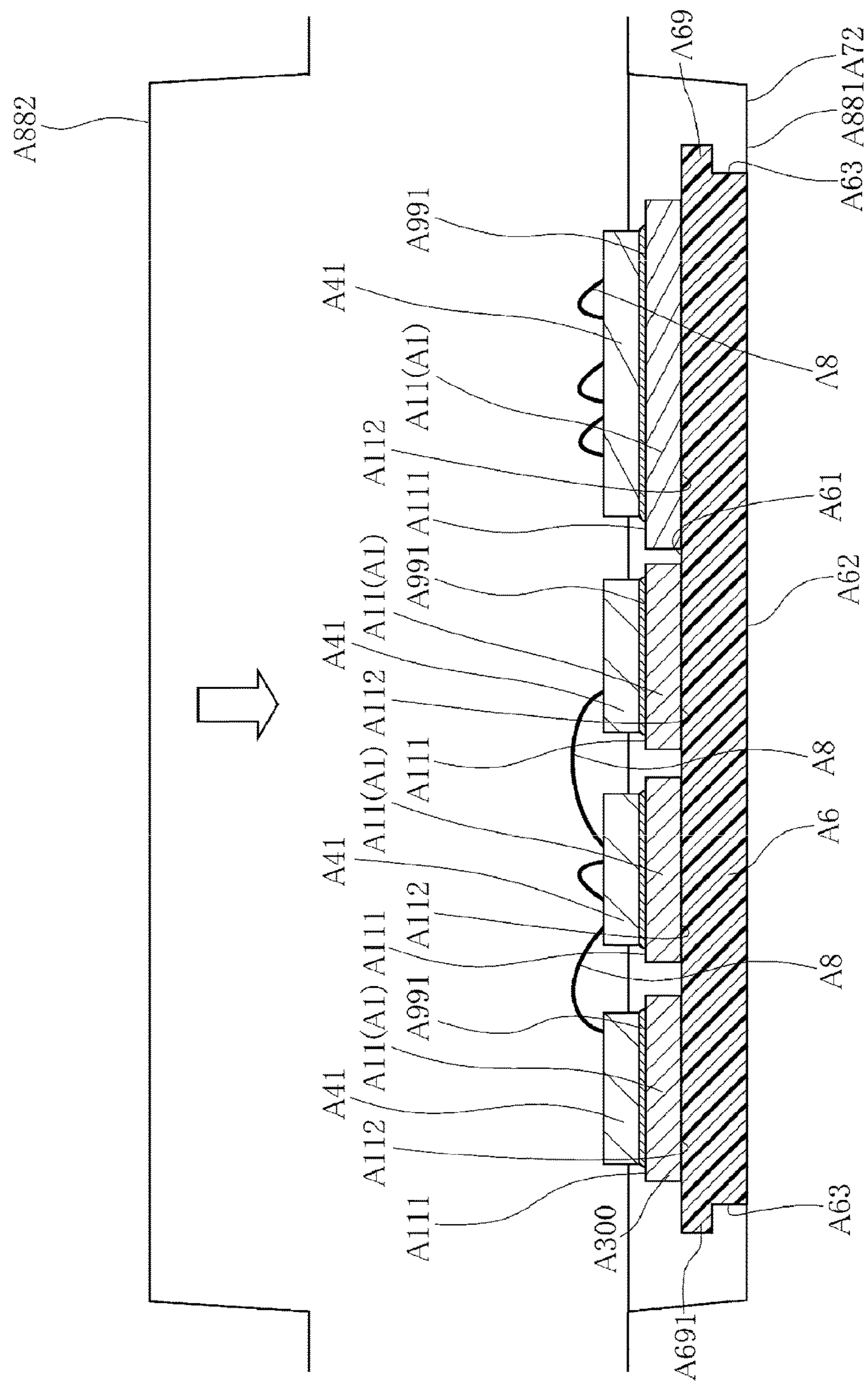
FIG. 35 is a section view illustrating one process of a manufacturing method of the semiconductor device according to the third embodiment of the present disclosure.
Figure 36:
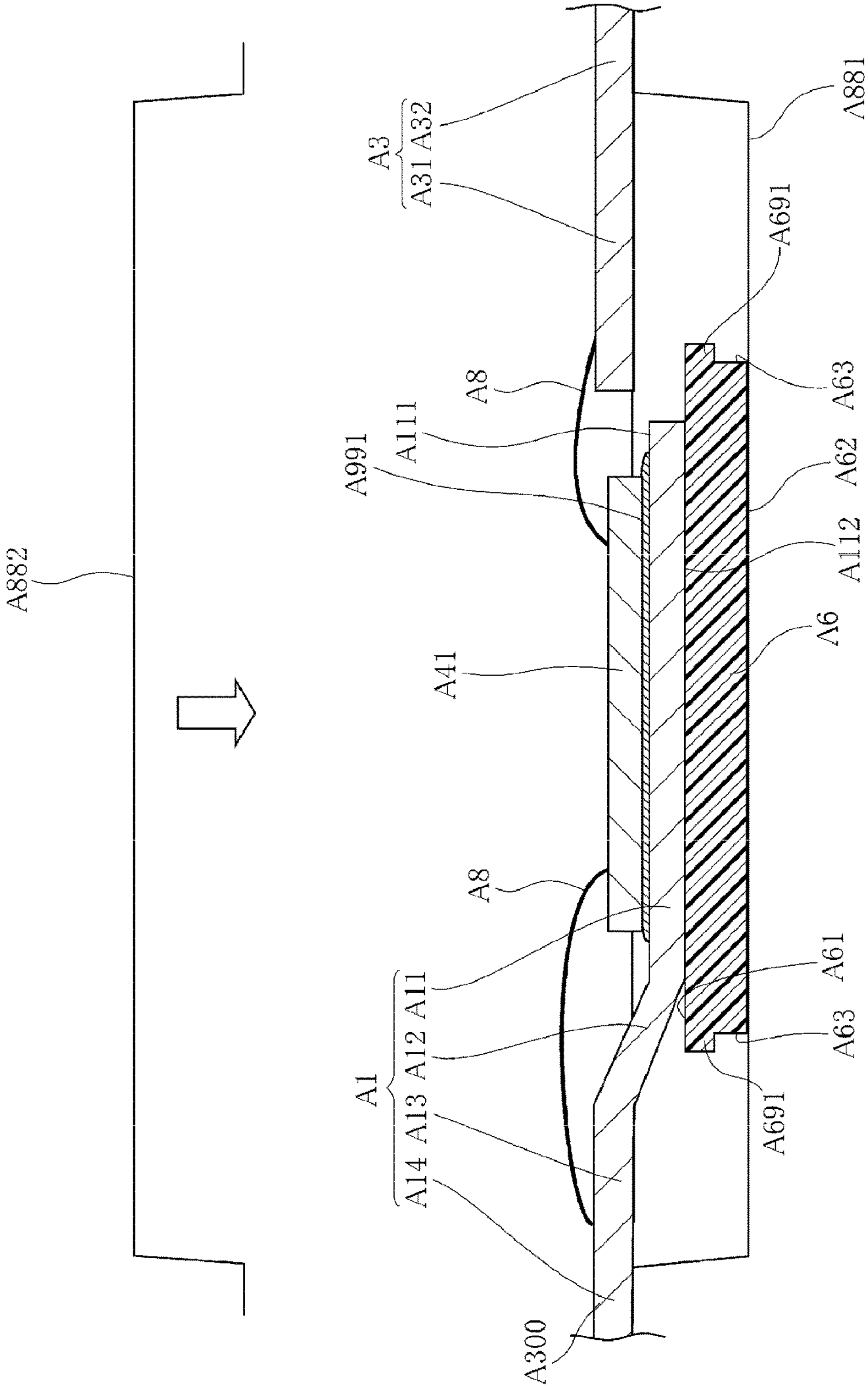
FIG. 36 is a section view illustrating one process of the manufacturing method of the semiconductor device according to the third embodiment of the present disclosure.

Next, a first mold A881 and a second mold A882 shown in FIGS. 35 and 36 are prepared. The resin encapsulation portion A7 is formed using the first mold A881 and the second mold A882.

First, the heat radiation plate A6 is arranged in the first mold A881. Then, the lead frame A300 is placed on the edge of the first mold A881. When the lead frame A300 is placed on the edge of the first mold A881, the heat radiation plate A6 and the die pad sections A11 make direct contact with each other. Subsequently, the heat radiation plate A6, the die pad sections A11, the semiconductor chips A41 and A42, the passive chips A43 and the wires A8 are enclosed by the first mold A881 and the second mold A882 (not shown). Then, a resin material is injected into the space surrounded by the first mold A881 and the second mold A882. When the resin material is injected into the space surrounded by the first mold A881 and the second mold A882, the heat radiation plate A6 and the die pad sections A11 are not bonded to each other.

The resin material is cured after it is injected into the space surrounded by the first mold A881 and the second mold A882. The resin encapsulation portion A7 is formed by curing the resin material. As the resin material is cured, the heat radiation plate A6 and the die pad sections A11 are joined together. Then, the first mold A881 and the second mold A882 are removed from the resin encapsulation portion A7.

Thereafter, as described above with respect to the semiconductor device A100, the lead frame A300 is appropriately diced to thereby manufacture the semiconductor device A200.

Next, description will be made on the operations and effects of the present embodiment.

With the manufacturing method of the semiconductor device A200, for the same reason as described above with respect to the semiconductor device A100, it is possible to reduce the manufacturing cost and to enhance the manufacturing efficiency.

First Modified Example of the Third Embodiment

A first modified example of the third embodiment of the present disclosure will be described with reference to FIGS. 37 and 38.

Figure 37:
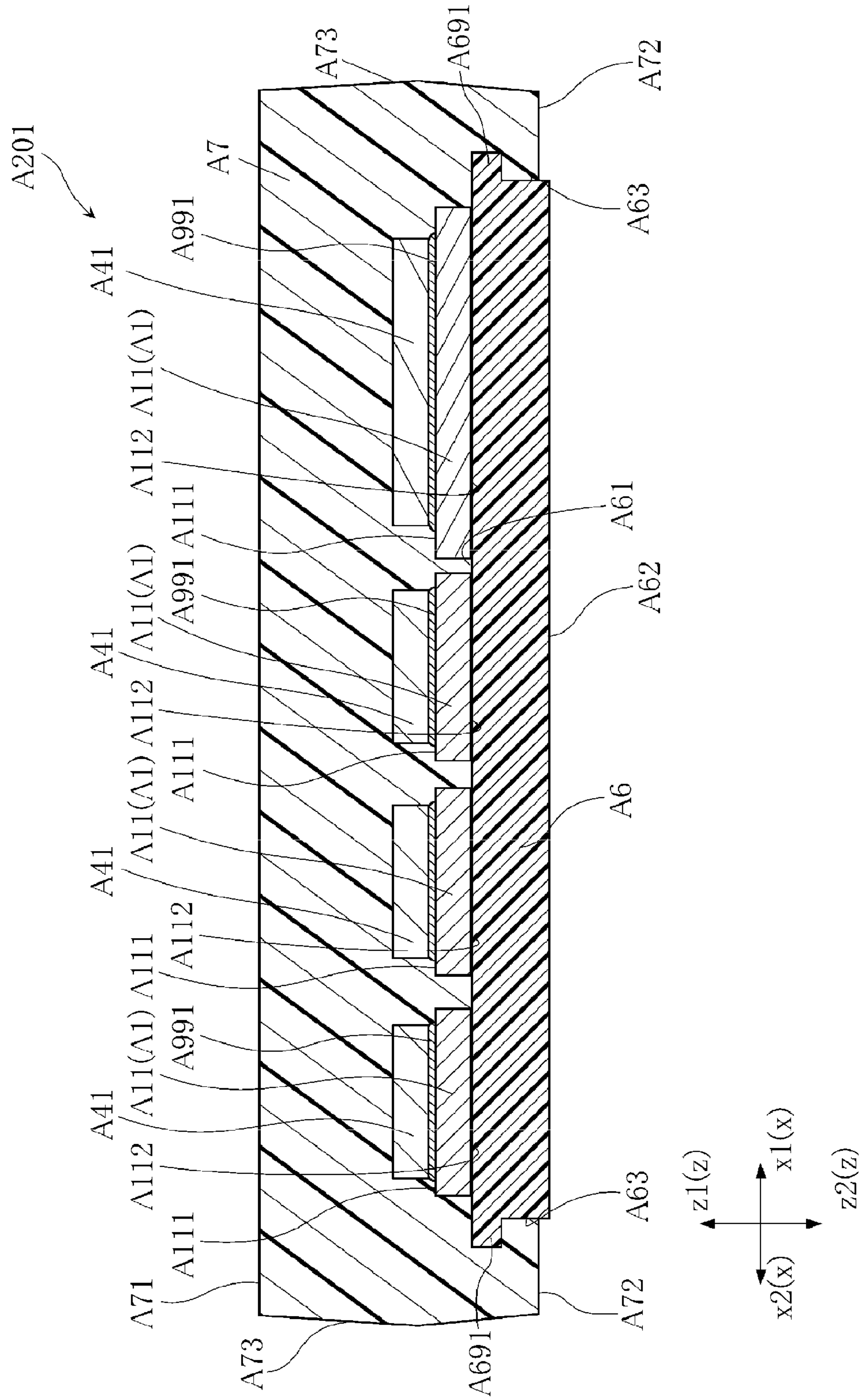
FIG. 37 is a section view illustrating a semiconductor device according to a first modified example of the third embodiment of the present disclosure.
Figure 38:
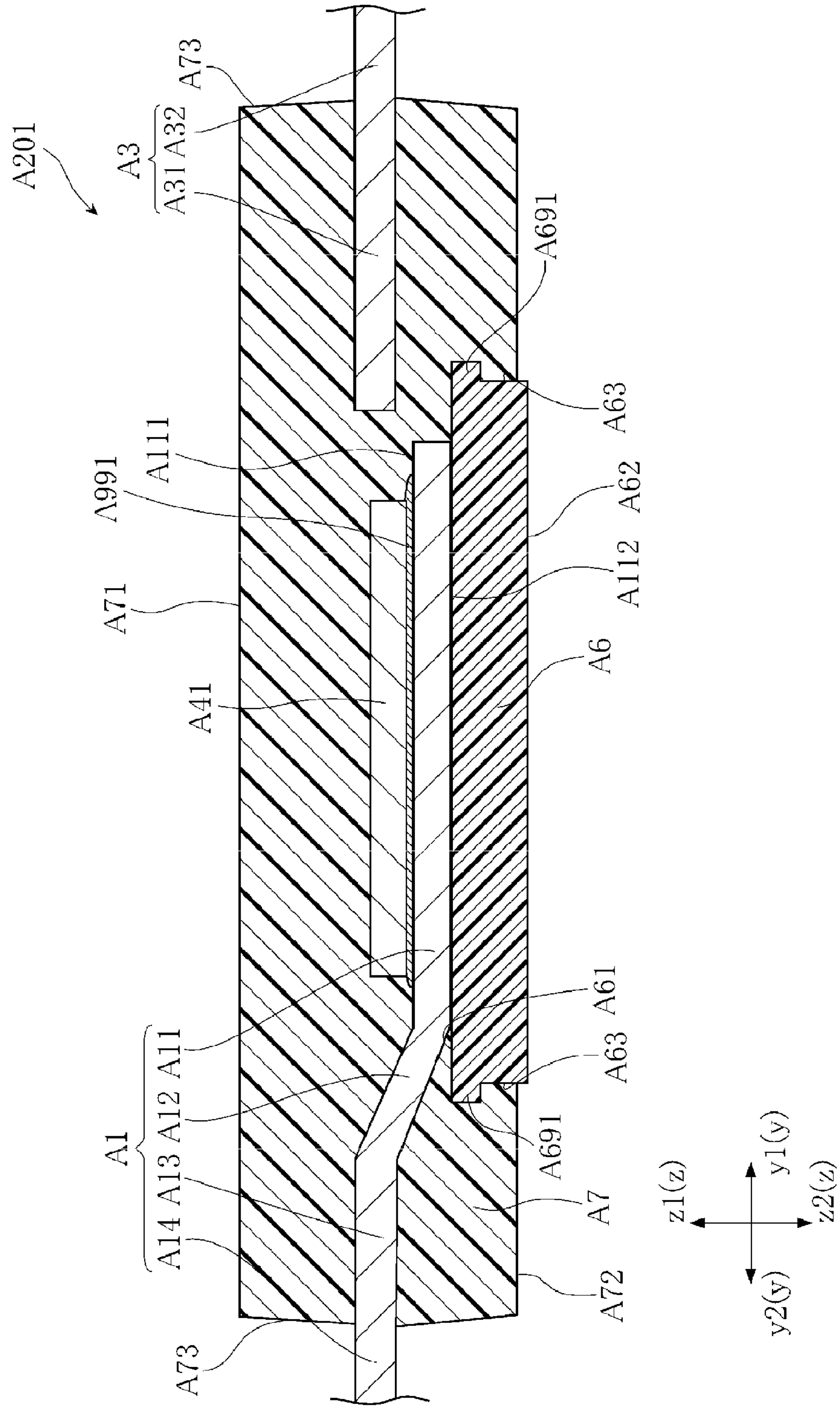
FIG. 38 is a section view illustrating the semiconductor device according to the first modified example of the third embodiment of the present disclosure.

FIGS. 37 and 38 are section views illustrating a semiconductor device according to a first modified example of the third embodiment of the present disclosure.

The semiconductor device A201 corresponds to the combination of the configuration of the semiconductor device A200 and the configuration of the semiconductor device A101. More specifically, the semiconductor device A201 is configured as follows.

The semiconductor device A201 includes first electrode portions A1, second electrode portions A2, third electrode portions A3, semiconductor chips A41 and A42, passive chips A43, a heat radiation plate A6, a resin encapsulation portion A7, wires A8 and a joining layer A991. Except for the heat radiation plate A6, the respective components of the semiconductor device A201 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A200 and, therefore, will not be described.

The heat radiation plate A6 has a major surface A61, a rear surface A62 and a side surface A63. The major surface A61 is the same as that of the semiconductor device A200 and, therefore, will not be described. The rear surface A62 faces a direction opposite from which the heat radiation plate major surface A61 faces. The rear surface A62 is exposed from the resin bottom surface A72 of the resin encapsulation portion A7. In the present modified example, the heat radiation plate A6 has a section protruding toward the facing direction of the rear surface A62 (the direction z2) beyond the resin bottom surface A72. For that reason, the rear surface A62 is positioned in the direction z2 with respect to the resin bottom surface A72. When the semiconductor device A201 is in use, the rear surface A62 makes contact with the heat radiation member A808. The side surface A63 is smooth and is perpendicular to the rear surface A62. A portion of the side surface A63 is covered by the resin encapsulation portion A7 and a portion of the side surface A63 is exposed from the resin encapsulation portion A7. Unlike the present modified example, the side surface A63 as a whole may be covered by the resin encapsulation portion A7.

Except for the points described above, specific configurations of the heat radiation plate A6 are the same as those of the semiconductor device A200 and, therefore, will not be described.

The semiconductor device A201 can be manufactured in the same method as the manufacturing method of the semiconductor device A101.

Next, description will be made on the operations and effects of the present modified example.

With the manufacturing method of the semiconductor device A201, for the same reason as described above with respect to the semiconductor device A100, it is possible to reduce the manufacturing cost and to enhance the manufacturing efficiency.

With the semiconductor device A201, for the same reason as described above with respect to the semiconductor device A101, the heat transferred from the semiconductor chips A41 to the heat radiation plate A6 can be efficiently transferred to the heat radiation member A808.

With the semiconductor device A201, for the same reason as described above with respect to the semiconductor device A101, it is possible to precisely arrange the heat radiation plate A6 in a desired position.

Second Modified Example of the Third Embodiment

A second modified example of the third embodiment of the present disclosure will be described with reference to FIGS. 39 and 40.

Figure 39:
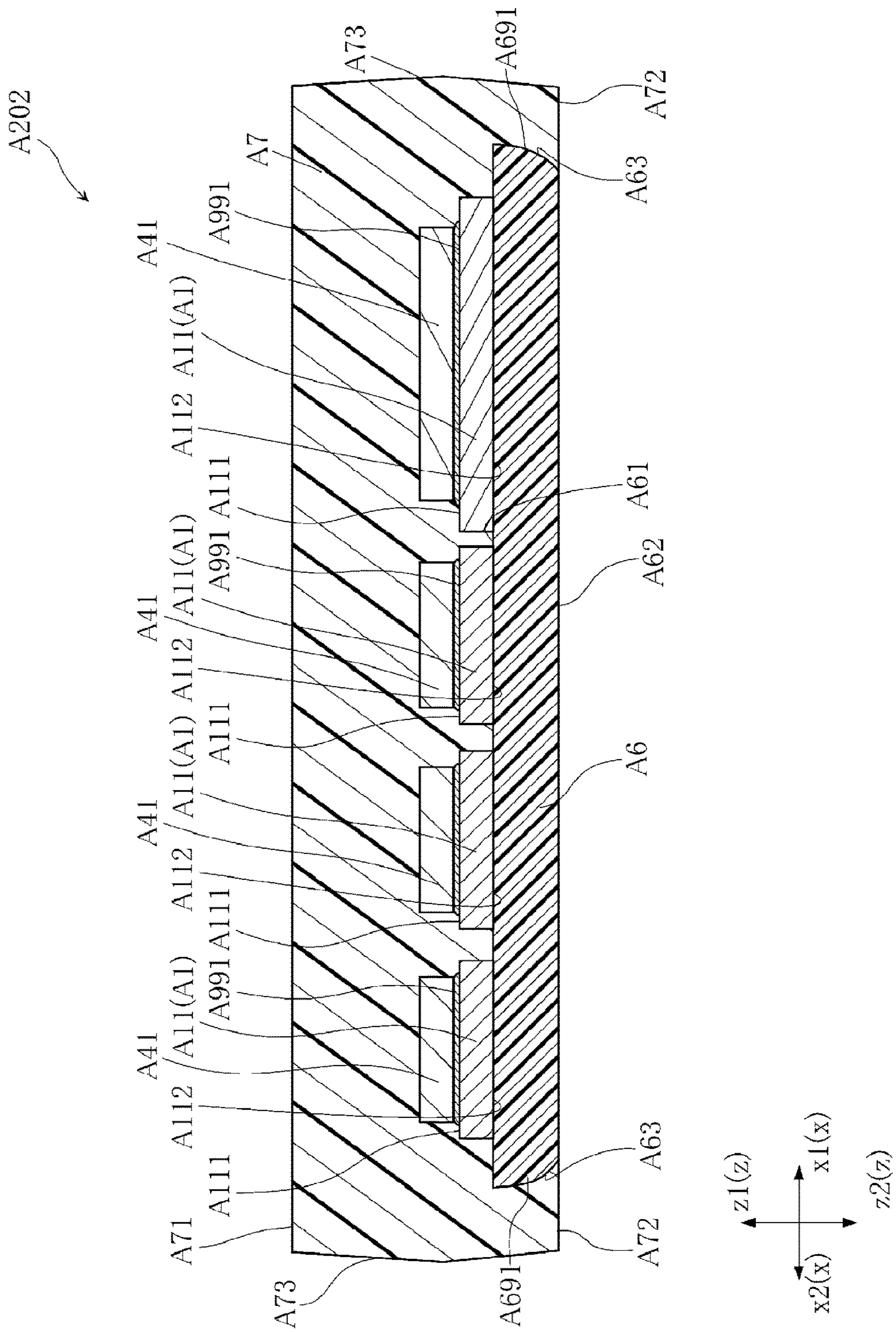
FIG. 39 is a section view illustrating a semiconductor device according to a second modified example of the third embodiment of the present disclosure.
Figure 40:
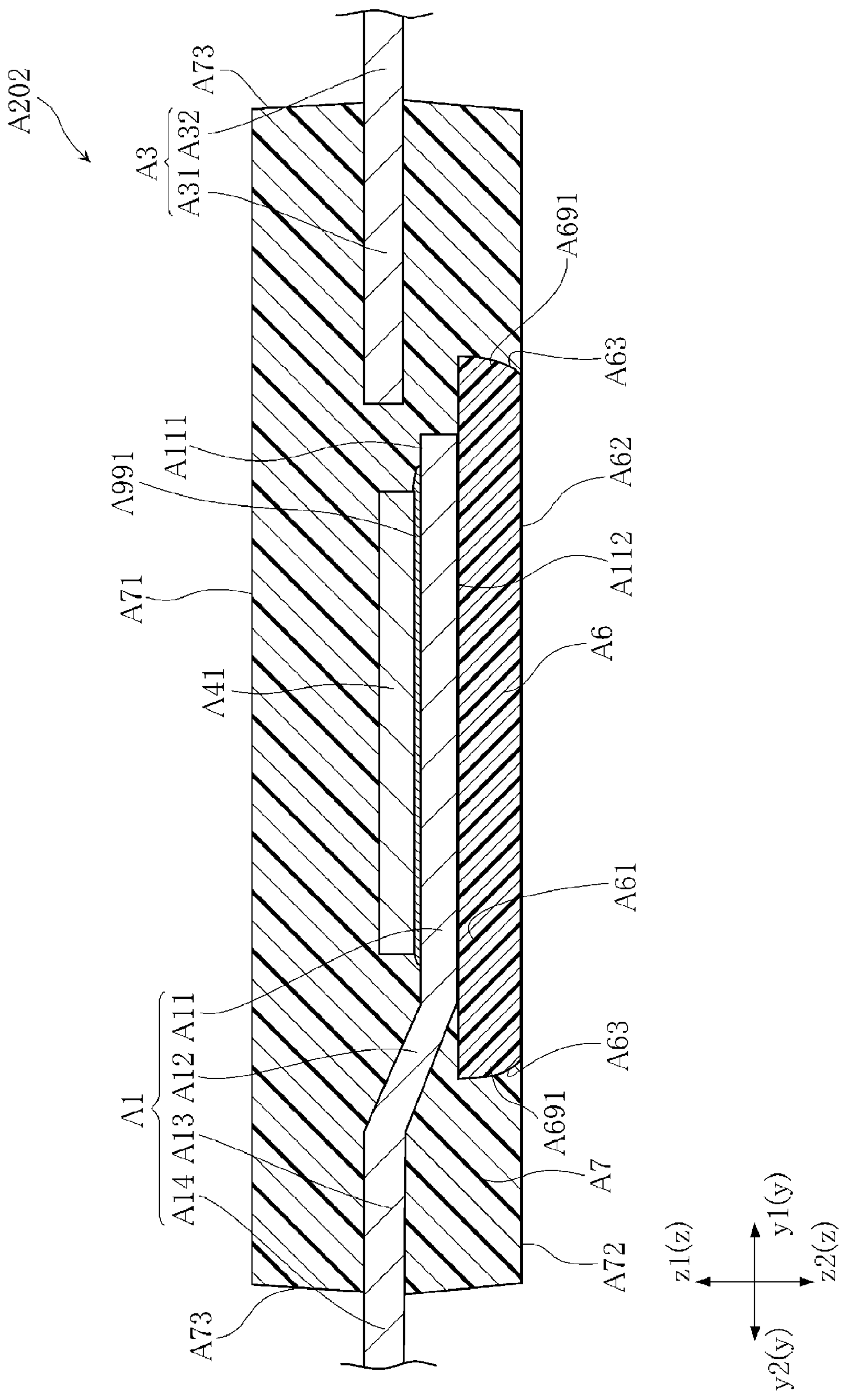
FIG. 40 is a section view illustrating the semiconductor device according to the second modified example of the third embodiment of the present disclosure.

FIGS. 39 and 40 are section views illustrating a semiconductor device according to a second modified example of the third embodiment of the present disclosure.

The semiconductor device A202 corresponds to the combination of the configuration of the semiconductor device A200 and the configuration of the semiconductor device A102. More specifically, the semiconductor device A202 is configured as follows.

The semiconductor device A202 includes first electrode portions A1, second electrode portions A2, third electrode portions A3, semiconductor chips A41 and A42, passive chips A43, a heat radiation plate A6, an resin encapsulation portion A7, wires A8 and a joining layer A991. Except for the heat radiation plate A6, the respective components of the semiconductor device A202 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A200 and, therefore, will not be described.

The heat radiation plate A6 of the present modified example differs from the heat radiation plate A6 of the semiconductor device A200 in terms of the cross-sectional shape. The heat radiation plate A6 has a major surface A61, a rear surface A62 and a side surface A63. The major surface A61 and the rear surface A62 are the same as those of the semiconductor device A200 and, therefore, will not be described. The side surface A63 has a curved surface shape. The side surface A63 as a whole is covered by the resin encapsulation portion A7.

Except the points described above, specific configurations of the heat radiation plate A6 are the same as those of the semiconductor device A200 and, therefore, will not be described.

Next, description will be made on the operations and effects of the present modified example.

With the manufacturing method of the semiconductor device A202, for the same reason as described above with respect to the semiconductor device A100, it is possible to reduce the manufacturing cost and to enhance the manufacturing efficiency.

Third Modified Example of the Third Embodiment

A third modified example of the third embodiment of the present disclosure will be described with reference to FIGS. 41 and 42.

Figure 41:
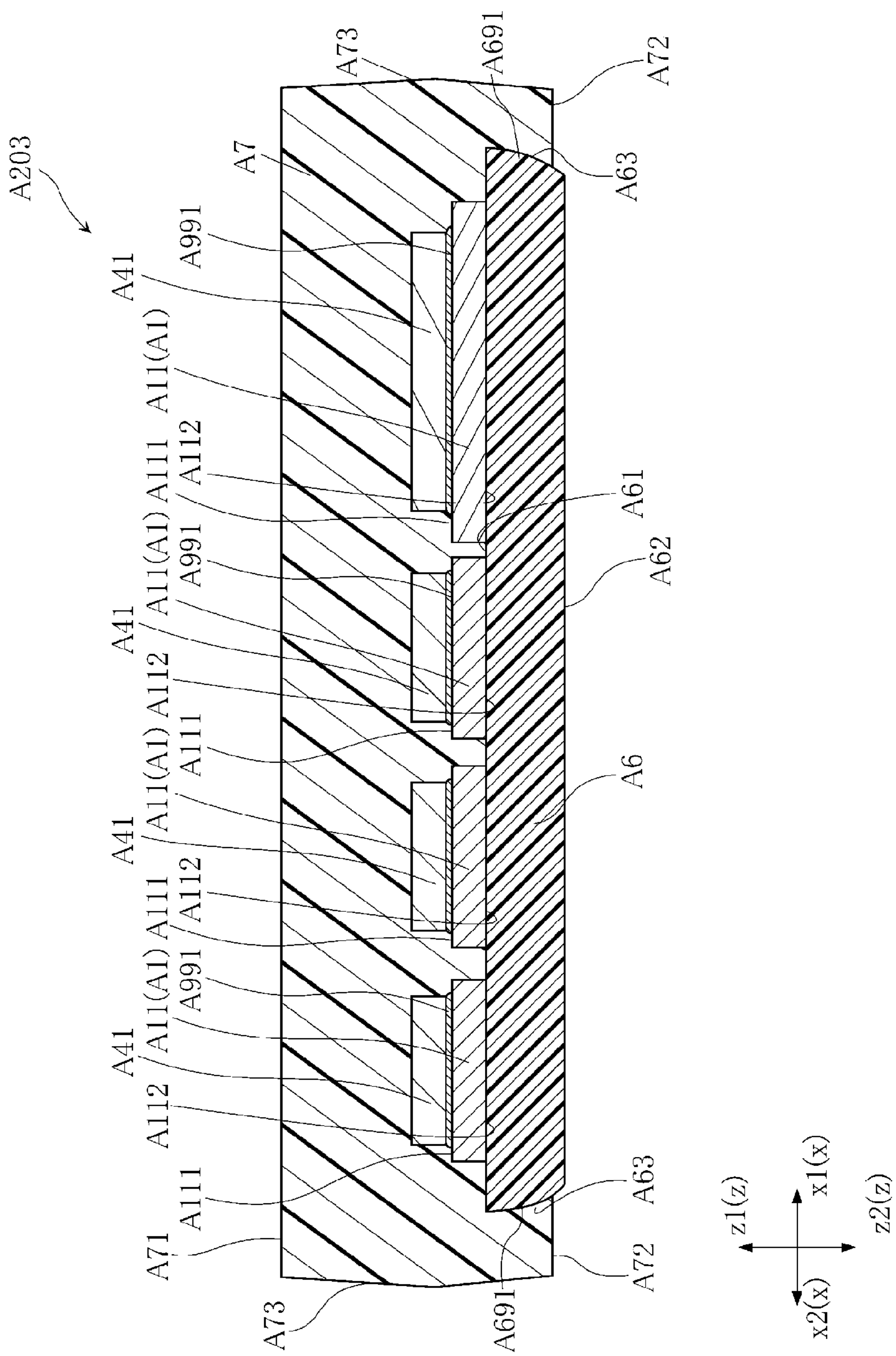
FIG. 41 is a section view illustrating a semiconductor device according to a third modified example of the third embodiment of the present disclosure.
Figure 42:
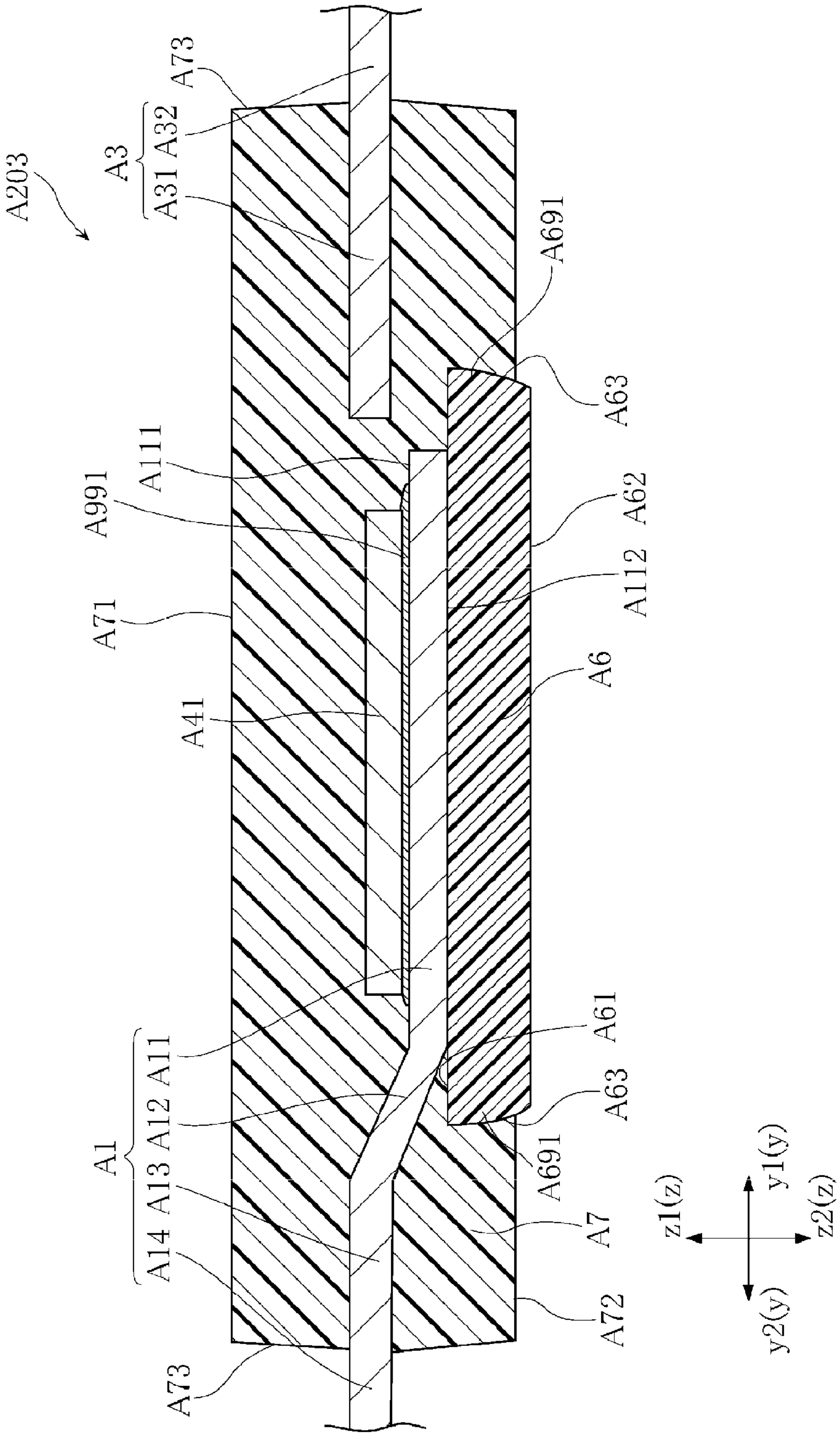
FIG. 42 is a section view illustrating the semiconductor device according to the third modified example of the third embodiment of the present disclosure.

FIGS. 41 and 42 are section views illustrating a semiconductor device according to a third modified example of the third embodiment of the present disclosure.

The semiconductor device A203 corresponds to the combination of the configuration of the semiconductor device A200 and the configuration of the semiconductor device A103. More specifically, the semiconductor device A203 is configured as follows.

The semiconductor device A203 includes first electrode portions A1, second electrode portions A2, third electrode portions A3, semiconductor chips A41 and A42, passive chips A43, a heat radiation plate A6, a resin encapsulation portion A7, wires A8 and a joining layer A991. Except for the heat radiation plate A6, the respective components of the semiconductor device A203 including the first electrode portions A1, the second electrode portions A2, the third electrode portions A3, the semiconductor chips A41 and A42, the passive chips A43, the resin encapsulation portion A7, the wires A8 and the joining layer A991 are the same as the respective components of the semiconductor device A202 and, therefore, will not be described.

The heat radiation plate A6 has a major surface A61, a rear surface A62 and a side surface A63. The major surface A61 is the same as that of the semiconductor device A202 and, therefore, will not be described. The rear surface A62 faces in a direction opposite from which the heat radiation plate major surface A61 faces. The rear surface A62 is exposed from the resin bottom surface A72 of the resin encapsulation portion A7. In the present modified example, the heat radiation plate A6 has a section protruding toward the facing direction of the rear surface A62 (the direction z2) beyond the resin bottom surface A72. For that reason, the rear surface A62 is positioned in the z2 direction with respect to the resin bottom surface A72. When the semiconductor device A203 is in use, the rear surface A62 makes contact with the heat radiation member A808. The side surface A63 has a curved surface shape. A portion of the side surface A63 is covered by the resin encapsulation portion A7 and a portion of the side surface A63 is exposed from the resin encapsulation portion A7. Unlike the present modified example, the side surface A63 as a whole may be covered by the resin encapsulation portion A7.

Except the points described above, specific configurations of the heat radiation plate A6 are the same as those of the semiconductor device A202 and, therefore, will not be described.

When manufacturing the semiconductor device A203, it may be possible to use the first mold A881 having a recess portion A885, which is the same as used in manufacturing the semiconductor device A201.

Next, description will be made on the operations and effects of the present modified example.

With the manufacturing method of the semiconductor device A203, for the same reason as described above with respect to the semiconductor device A100, it is possible to reduce the manufacturing cost and to enhance the manufacturing efficiency.

With the semiconductor device A203, for the same reason as described above with respect to the semiconductor device A101, the heat transferred from the semiconductor chips A41 to the heat radiation plate A6 can be efficiently transferred to the heat radiation member A808.

With the semiconductor device A203, for the same reason as described above with respect to the semiconductor device A101, it is possible to precisely arrange the heat radiation plate A6 in a desired position.

Fourth Modified Example of the Third Embodiment

A fourth modified example of the third embodiment of the present disclosure will be described with reference to FIGS. 43 and 44.

Figure 43:
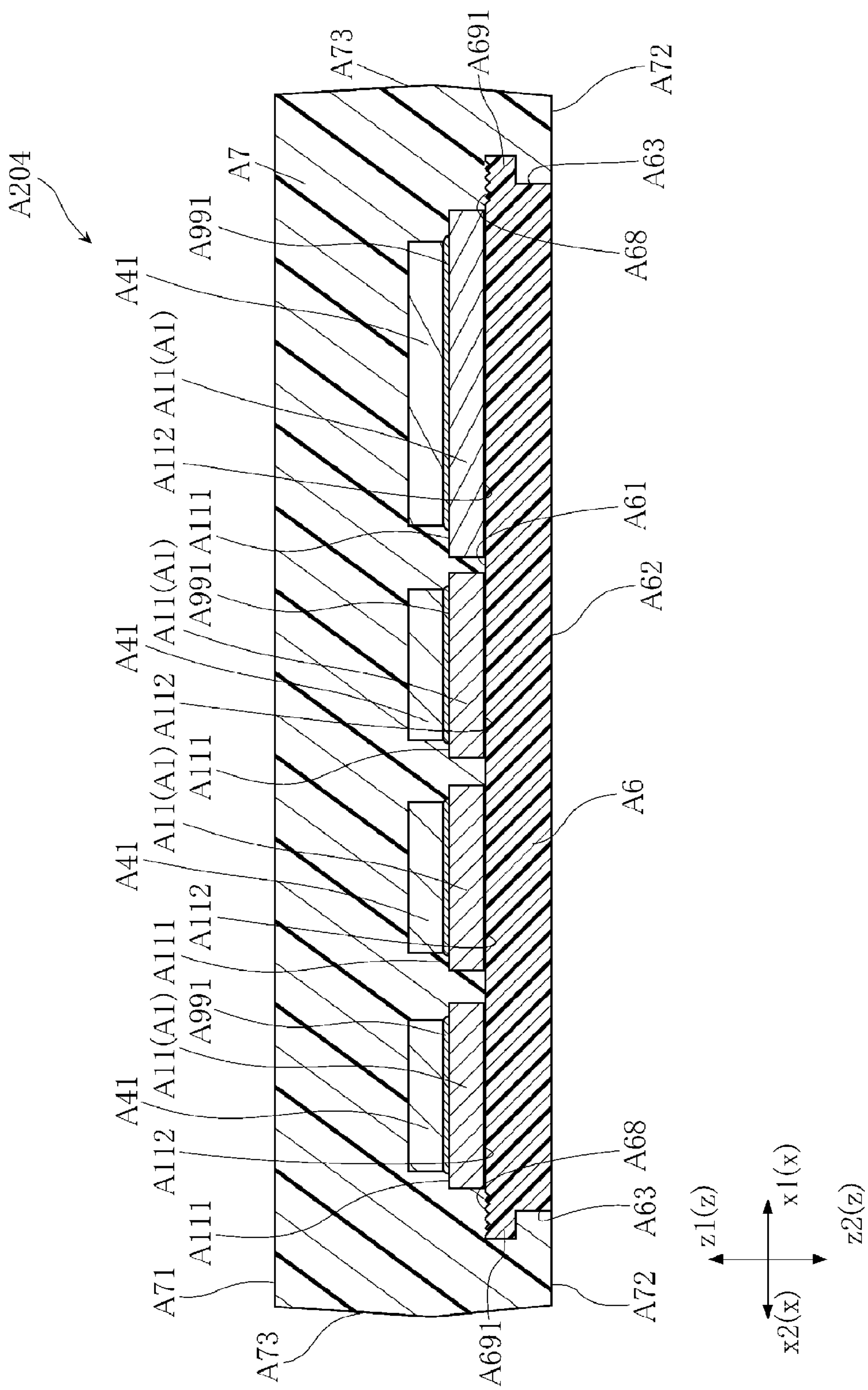
FIG. 43 is a section view illustrating a semiconductor device according to a fourth modified example of the third embodiment of the present disclosure.
Figure 44:
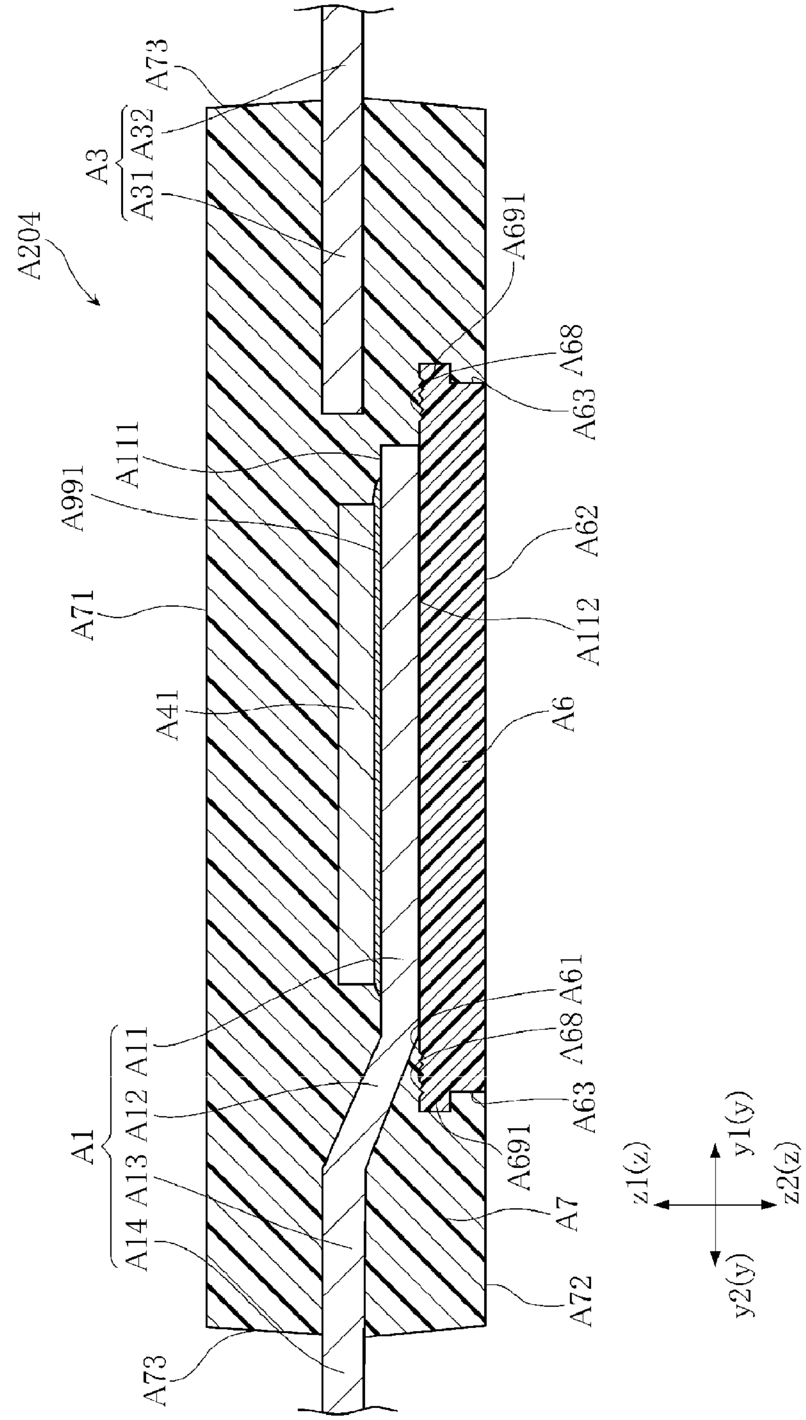
FIG. 44 is a section view illustrating the semiconductor device according to the fourth modified example of the third embodiment of the present disclosure.

FIGS. 43 and 44 are section views illustrating a semiconductor device according to a fourth modified example of the third embodiment of the present disclosure.

The semiconductor device A204 shown in these figures differs from the semiconductor device A200 in that the heat radiation plate A6 includes a concave-convex portion 68 or a groove. In other points, the semiconductor device A204 remains the same as the semiconductor device A200. With this configuration, it is possible to increase the creeping distance of the die pad sections A11 and the heat radiation member A808 (see FIG. 11). This makes it possible to restrain an electricity cutoff or reduction of the humidity resistance between the die pad sections A11 and the heat radiation member A808.

The configuration of the present modified example may be applied to one of the semiconductor device A201, A202 and A203.

Additionally, some other configurations of the present disclosure and variations thereof will now be enumerated as appendices.

APPENDIX 1

A semiconductor device manufacturing method, including:

a step of preparing a semiconductor chip, a radiator plate and a lead frame having a die pad section;

a step of joining the semiconductor chip to the die pad section;

a step of causing the radiator plate to directly face the die pad section; and a step of forming an encapsulating resin portion that covers the semiconductor chip, the radiator plate and the die pad section, the radiator plate and the die pad section being joined by the encapsulating resin portion in the step of forming the encapsulating resin portion.

APPENDIX 2

The method of Appendix 1, wherein the die pad section has a die pad major surface and a die pad rear surface, the semiconductor chip being joined to the die pad major surface in the step of joining the semiconductor chip, the radiator plate being caused to directly face the die pad rear surface in the step of causing the radiator plate to directly face the die pad section.

APPENDIX 3

The method of Appendix 2, wherein the radiator plate is exposed from the encapsulating resin portion in the step of forming the encapsulating resin portion.

APPENDIX 4

The method of any one of Appendices 1 to 3, further including a step of preparing a first mold and a second mold, and wherein the step of forming the encapsulating resin portion includes: a step of enclosing the radiator plate, the die pad section and the semiconductor chip with the first mold and the second mold; and a step of, after the enclosing step, injecting a resin material into a space surrounded by the first mold and the second mold, the radiator plate and the die pad section being not bonded to each other at a time point when the resin material is injected.

APPENDIX 5

The method of Appendix 4, wherein the first mold has a recess portion and the step of forming the encapsulating resin portion includes a step of, before the enclosing step, arranging the radiator plate in the recess portion.

APPENDIX 6

A semiconductor device, including:

a die pad section;

a semiconductor chip joined to the die pad section;

a radiator plate spaced apart from the die pad section; and an encapsulating resin portion configured to cover at least semiconductor-chip-side regions of the die pad section, the semiconductor chip and the radiator plate, the encapsulating resin portion including an intermediate section existing between the radiator plate and the die pad section, the intermediate section making direct contact with the radiator plate and the die pad section.

APPENDIX 7

A semiconductor device, including:

a die pad section;

a semiconductor chip joined to the die pad section;

a radiator plate making direct contact with the die pad section; and an encapsulating resin portion configured to cover at least semiconductor-chip-side regions of the die pad section, the semiconductor chip and the radiator plate.

APPENDIX 8

The device of Appendix 6 or 7, wherein the die pad section has a die pad major surface and a die pad rear surface, the semiconductor chip joined to the die pad major surface, the radiator plate having a radiator plate major surface directly facing the die pad rear surface.

APPENDIX 9

The device of Appendix 8, wherein the radiator plate has a radiator plate rear surface facing toward the opposites side from the radiator plate major surface, the radiator plate rear surface exposed from the encapsulating resin portion.

APPENDIX 10

The device of Appendix 9, wherein the encapsulating resin portion has a resin bottom surface facing toward the same direction as the facing direction of the radiator plate rear surface, the radiator plate having a section protruding toward the facing direction of the radiator plate rear surface beyond the resin bottom surface.

APPENDIX 11

The device of Appendix 9 or 10, wherein the radiator plate includes a drop-preventing portion protruding from the radiator plate rear surface when seen in a thickness direction of the die pad section, the drop-preventing portion positioned at the side of the facing direction of the radiator plate major surface with respect to the encapsulating resin portion.

APPENDIX 12

The device of any one of Appendices 9 to 11, wherein the radiator plate has a radiator plate side surface perpendicular to the radiator plate rear surface.

APPENDIX 13

The device of any one of Appendices 6 to 12, wherein the radiator plate is made of an electrically conductive material.

APPENDIX 14

The device of Appendix 13, wherein the electrically conductive material is aluminum, copper, copper alloy or iron.

APPENDIX 15

The device of Appendix 13 or 14, further including: a spacer existing between the die pad section and the radiator plate, the spacer made of an insulating material.

APPENDIX 16

The device of any one of Appendices 6 to 12, wherein the radiator plate is made of an insulating material.

APPENDIX 17

The device of Appendix 16, wherein the insulating material is ceramic.

APPENDIX 18

The device of Appendix 17, wherein the ceramic is alumina, aluminum nitride or silicon nitride.

APPENDIX 19

The device of Appendix 17 or 18, wherein the radiator plate includes a concave-convex section or a groove formed in a peripheral portion of the radiator plate major surface.

APPENDIX 20

The device of any one of Appendices 6 to 19, further including: a joining layer existing between semiconductor chip and the die pad section to join the semiconductor chip and the die pad section together.

APPENDIX 21

A semiconductor device mounting structure, including:

the semiconductor device of any one of Appendices 6 to 20;

a substrate to which the semiconductor device is mounted; and a radiator member fixed with respect to the substrate and configured to directly face the radiator plate.

APPENDIX 22

An IPM semiconductor device of any one of Appendices 6 to 20, wherein the semiconductor chip is a power chip, and further including an LSI chip configured to control the power chip, the radiator plate arranged at a rear surface side of the die pad section to which the power chip is mounted.

Fourth Embodiment

A fourth embodiment of the present disclosure will be described with reference to FIGS. 45 through 53.

Figure 45:
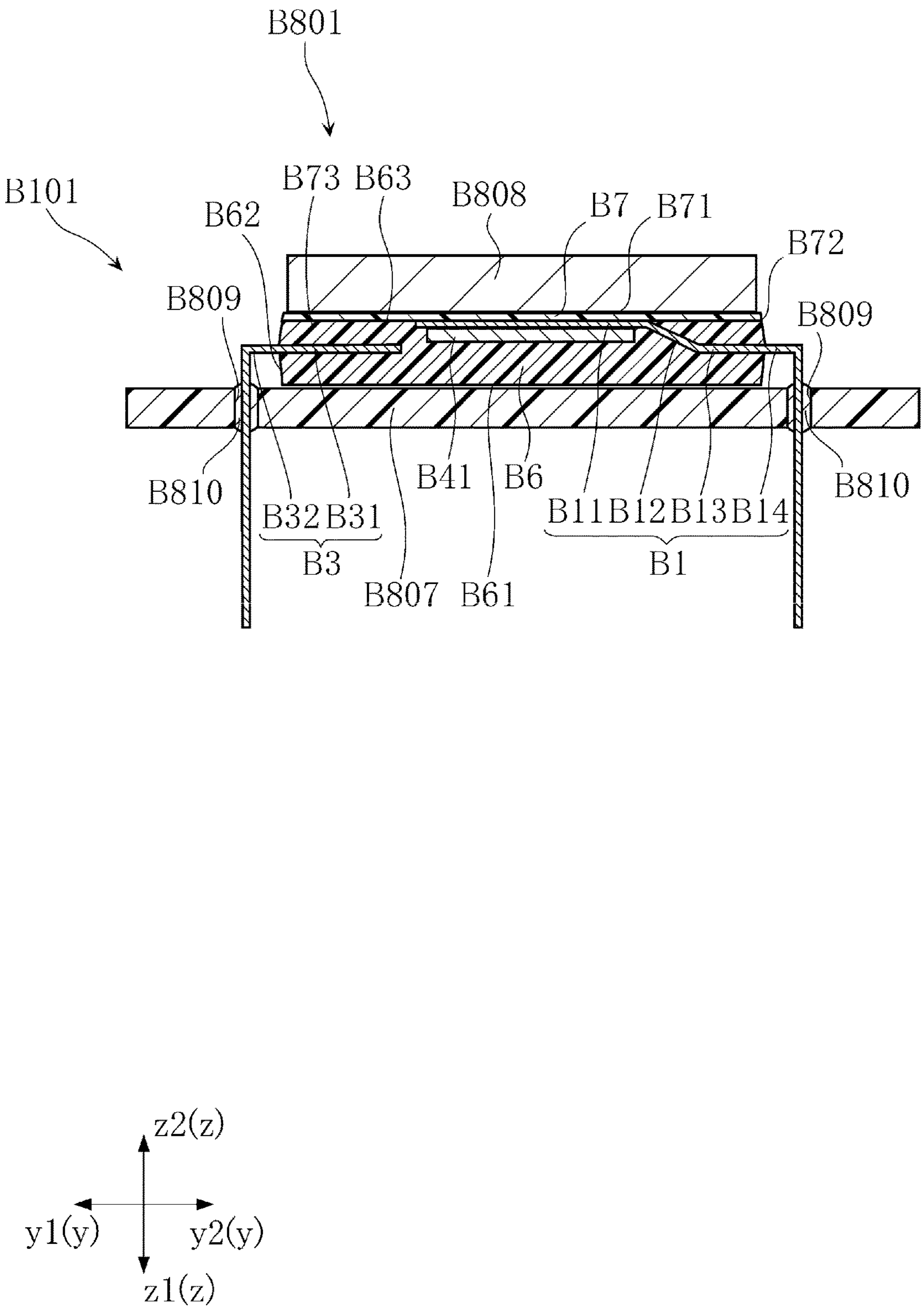
FIG. 45 is a section view illustrating a mounting structure of a semiconductor device according to a fourth embodiment of the present disclosure.

FIG. 45 is a section view illustrating a semiconductor device mounting structure according to a fourth embodiment.

The semiconductor device mounting structure B801 shown in FIG. 45 includes a semiconductor device B101, a substrate B807 and a heat radiation member B808.

A plurality of electronic parts is mounted on the substrate B807. The substrate B807 is made of an insulating material. A wiring pattern not shown is formed in the substrate B807. A plurality of holes B809 is formed in the substrate B807. The heat radiation member B808 is made of a material having relatively high heat conductivity, e.g., a metal such as aluminum. The heat radiation member B808 is fixed with respect to the substrate B807 by a support member not shown. The semiconductor device B101 is mounted on the substrate B807. In the present embodiment, the semiconductor device B101 is a product called an IPM (Intelligent Power Module). The semiconductor device B101 can find its application in, e.g., an air conditioner or a motor control device.

Figure 46:
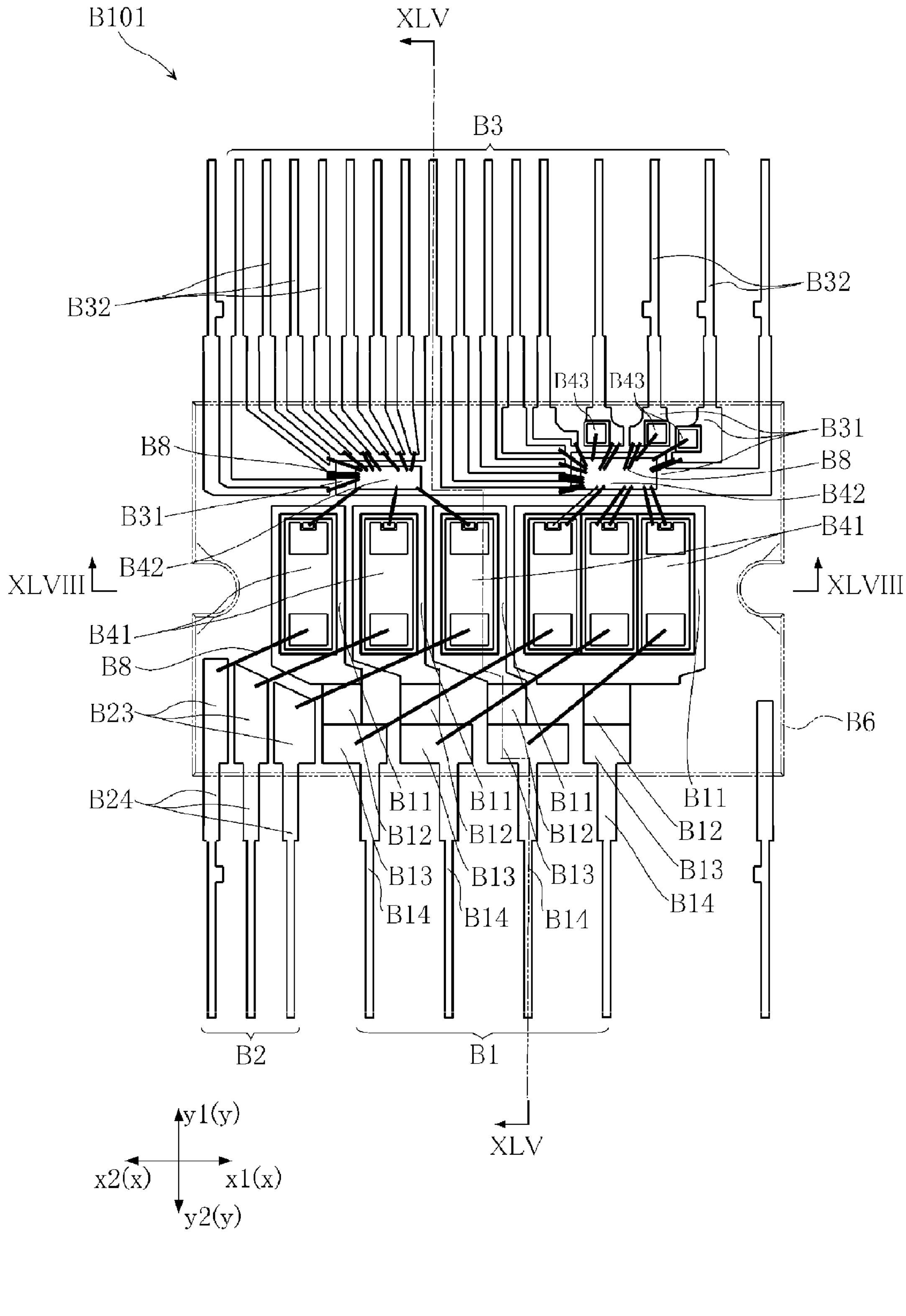
FIG. 46 is a (partially cut away) plan view of the semiconductor device according to the fourth embodiment of the present disclosure prior to bending the leads.
Figure 47:
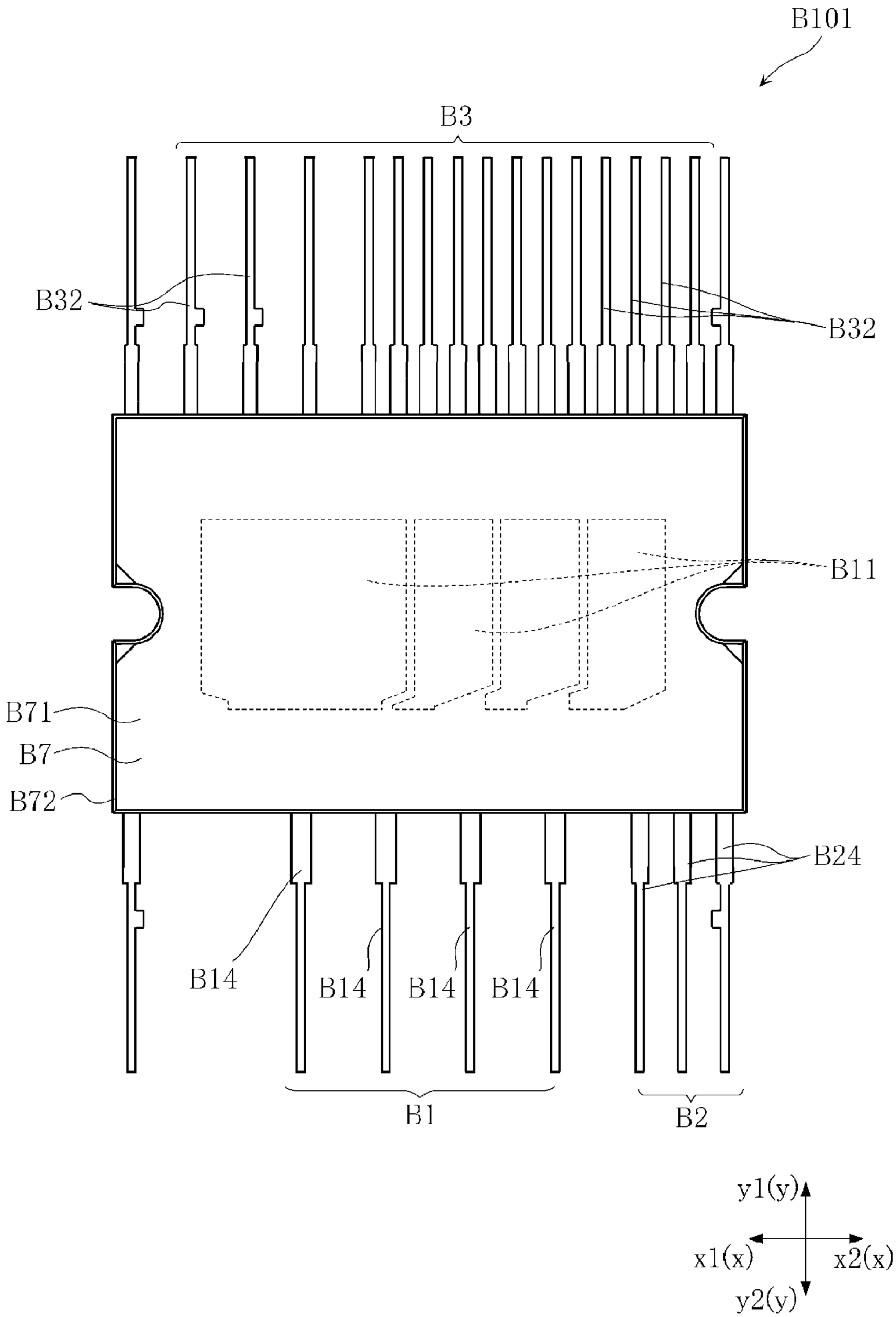
FIG. 47 is a bottom view of the semiconductor device according to the fourth embodiment of the present disclosure prior to bending the leads.
Figure 48:
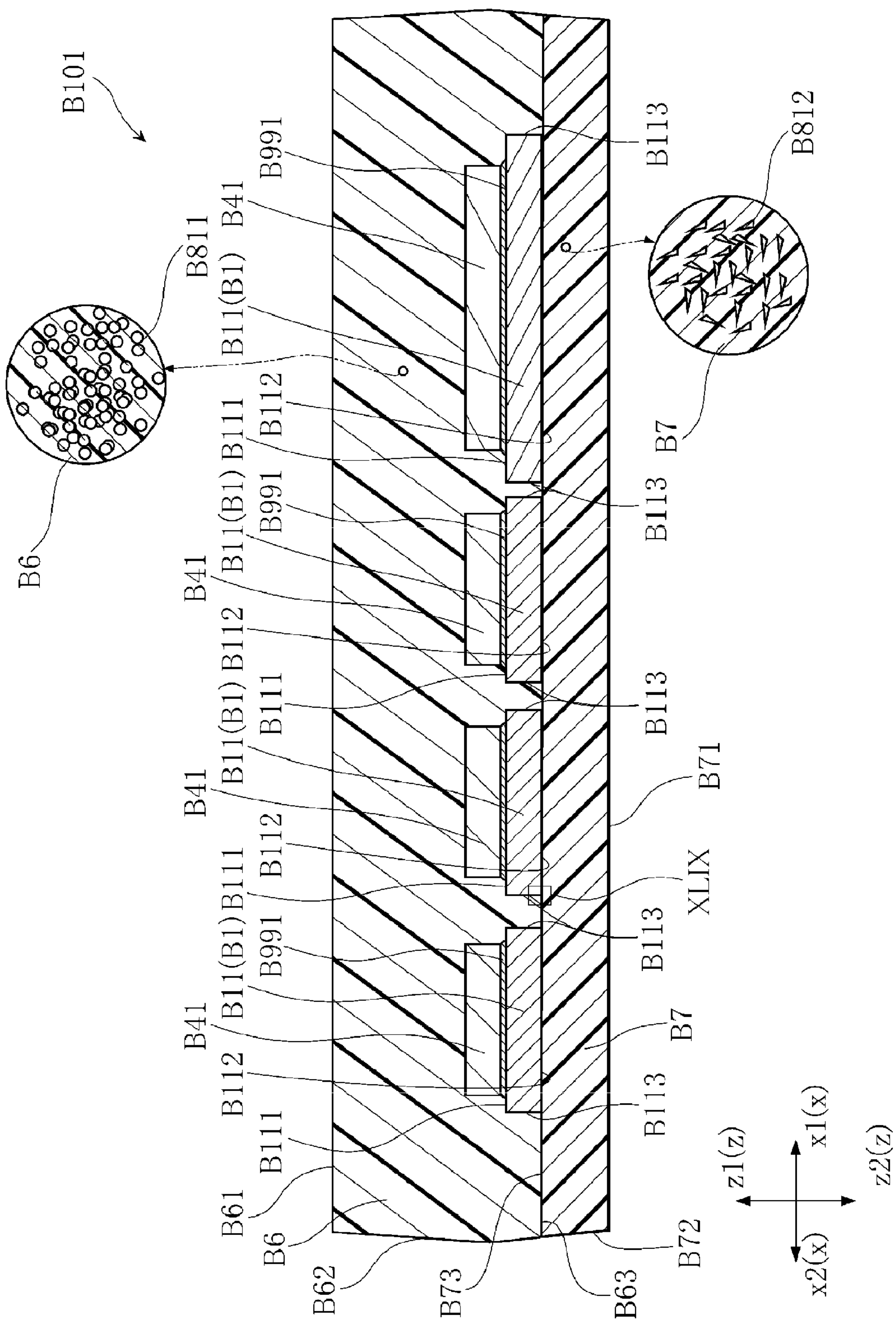
FIG. 48 is a section view taken along line XLVIII-XLVIII in FIG. 46.
Figure 49:
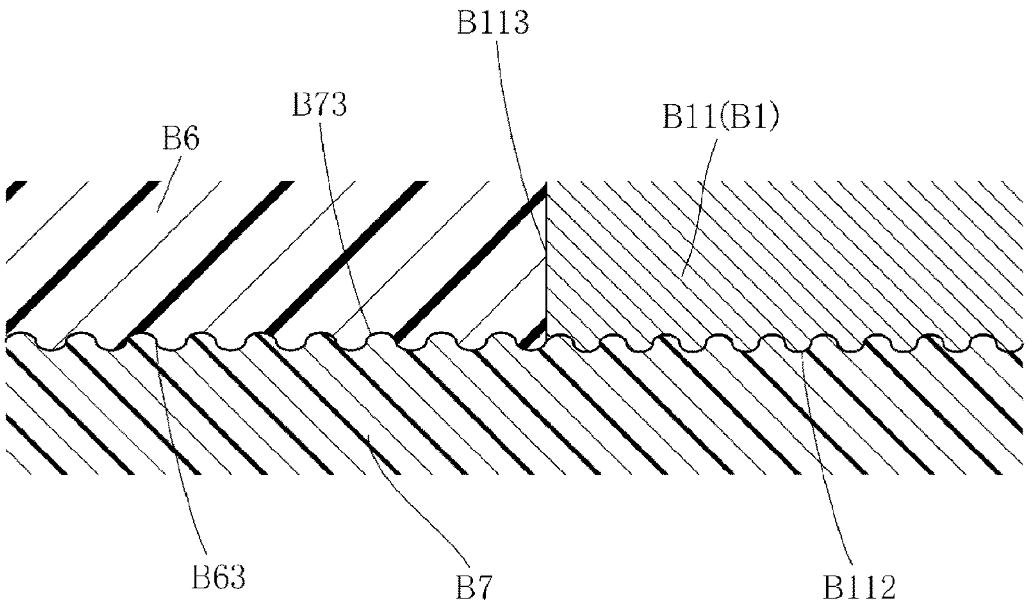
FIG. 49 is a partially enlarged view of the region XLIX in FIG. 48.

FIG. 46 is a (partially cut away) plan view of the semiconductor device according to the fourth embodiment of the present disclosure prior to bending the leads. FIG. 47 is a bottom view of the semiconductor device according to the fourth embodiment of the present disclosure prior to bending the leads. FIG. 48 is a section view taken along line XLVIII-XLVIII in FIG. 46. FIG. 49 is a partially enlarged view of the region XLIX in FIG. 48.

The semiconductor device B101 shown in these figures includes first electrode portions B1, second electrode portions B2, third electrode portions B3, semiconductor chips B41 and B42, passive chips B43, a first resin encapsulation portion B6, a second resin encapsulation portion B7, wires B8 and a joining layer B991. In FIG. 46, the first resin encapsulation portion B6 is not shown and is indicated by a double-dot chain line. The semiconductor device shown in FIG. 45 corresponds to the section view taken along line XLV-XLV in FIG. 46.

As shown in FIG. 46, the semiconductor chips B41 and B42 and the passive chips B43 have a rectangular shape when seen in a plan view. The semiconductor chips B41 are, e.g., power chips such as an IGBT, a MOS and a diode. The semiconductor chips B42 are, e.g., LSI chips such as a control IC. The passive chips B43 are, e.g., passives such as a resistor and a capacitor.

The first electrode portions B1, the second electrode portions B2 and the third electrode portions B3 shown in FIGS. 45 through 48 have electric conductivity. In other words, the first electrode portions B1, the second electrode portions B2 and the third electrode portions B3 are all made of an electrically conductive material. The electrically conductive material may be, e.g., copper. The electrode portion shown in the right lower region in FIG. 46 is connected to the ground.

Each of the first electrode portions B1 (four first electrode portions B1 in the present embodiment) includes a die pad section B11 (see FIGS. 45 through 48), a connecting section B12 (see FIGS. 45 and 46), a wire bonding section B13 (see FIGS. 45 and 46) and a lead B14 (see FIGS. 45 through 46). The first electrode portions B1 are spaced apart from one another in the direction x.

Each of the die pad sections B11 is formed into a plate-like shape to extend along the x-y plane. Each of the semiconductor chips B41 is arranged in each of the die pad sections B11.

Each of the die pad sections B11 has a die pad major surface B111, a die pad rear surface B112 and a die pad side surface B113. The die pad major surface B111 faces in the direction z1. The die pad rear surface B112 faces in the direction z2. That is to say, the die pad major surface B111 and the die pad rear surface B112 face in opposite directions. Each of the semiconductor chips B41 is arranged in the die pad major surface B111. The joining layer B991 (to be described later) exists between the die pad major surface B111 and each of the semiconductor chips B41. As shown in FIG. 49, die pad rear surface B112 has a concave-convex section. The height difference of the concave-convex shape of the die pad rear surface B112 (the height difference between the top and bottom ends) is in some embodiments, e.g., from 0.01 μm to 1 μm. In the present embodiment, the die pad rear surface B112 is an irregular surface having a fine concave-convex shape. The die pad rear surface B112 is converted to an irregular surface by subjecting the die pad sections B11 to a blasting process (to be described later). The die pad rear surface B112 may be wholly or partially formed into a concave-convex shape. As shown in FIG. 48, the die pad side surface B113 faces toward the direction intersecting the thickness direction (the z direction) of the die pad sections B11. The die pad side surfaces B113 of two mutually-adjoining die pad sections B11 have mutually-opposing sections.

As shown in FIGS. 45 and 46, each of the connecting sections B12 is positioned between each of the die pad sections B11 and each of the wire bonding sections B13 and is joined to each of the die pad sections B11 and each of the wire bonding sections B13. Each of the connecting sections B12 is shaped to extend along a surface inclined with respect to the x-y plane. Each of the connecting sections B12 is inclined with respect to the x-y plane such that each of the connecting sections B12 extends in the direction z1 as it goes away from each of the die pad sections B11.

Each of the wire bonding sections B13 shown in FIGS. 45 and 46 is shaped to extend along the x-y plane. Each of the wire bonding sections B13 is positioned in the z1 direction with respect to each of the die pad sections B11 in the z direction. The wires B8 are bonded to each of the wire bonding sections B13 and each of the semiconductor chips B41, whereby each of the wire bonding sections B13 and each of the semiconductor chips B41 are electrically connected to each other. Each of the leads B14 is joined to each of the wire bonding sections B13. Each of the leads B14 extends along the direction y. In the present embodiment, the leads B14 are used for the insertion-mounting purpose. As shown in FIG. 45, when the semiconductor device B101 is mounted on the substrate B807, each of the leads B14 is bent and inserted into each of the holes B809. A solder layer B810 fills each of the holes B809 in order to fix the leads B14 to the substrate B807.

As shown in FIG. 46, each of the second electrode portions B2 (three second electrode portions B2 in the present embodiment) includes a wire bonding section B23 and a lead B24. The second electrode portions B2 are spaced apart from one another in the direction x.

Each of the wire bonding sections B23 is shaped to extend along the x-y plane. Each of the wire bonding sections B23 is positioned in the z1 direction with respect to each of the die pad sections B11 in the z direction. The wires B8 are bonded to each of the wire bonding sections B23 and each of the semiconductor chips B41, whereby each of the wire bonding sections B23 and each of the semiconductor chips B41 are electrically connected to each other. Each of the leads B24 is joined to each of the wire bonding sections B23. Each of the leads B24 extends along the y direction. In the present embodiment, the leads B24 are used for an insertion-mounting purpose. While not shown in the drawings, just like the leads B14, each of the leads B24 is inserted into each of the holes B809 when the semiconductor device B101 is mounted on the substrate B807.

The third electrode portions B3 shown in FIGS. 45 and 46 include a plurality of control die pad sections B31 and a plurality of leads B32. The control die pad sections B31 and the leads B32 are all arranged in the same position in the z direction. The semiconductor chips B42 or the passive chips B43 are arranged in the respective control die pad sections B31. A joining layer (not shown) exists between the control die pad sections B31 and the semiconductor chips B42 and between the control die pad sections B31 and the passive chips B43.

In the present embodiment, the leads B32 are used for an insertion-mounting purpose. As shown in FIG. 45, the leads B32 are inserted into the holes B809 when the semiconductor device B101 is mounted on the substrate B807. As described above with respect to the leads B14, a solder layer B810 fills the holes B809 to fix the leads B32 to the substrate B807. The wires B8 are bonded to each of the leads B32 and each of the semiconductor chips B42, whereby each of the leads B32 and each of the semiconductor chips B42 are electrically connected to each other. The wires B8 are also bonded to each of the semiconductor chips B42 and each of the passive chips B43.

As shown in FIG. 48, the joining layer B991 exists between each of the die pad sections B11 and each of the semiconductor chips B41. The joining layer B991 is made of, e.g., an electrically conductive material. The electrically conductive material may be, e.g., a silver paste or a solder. The solder may be relatively high in heat conductivity. If the solder is used as the joining layer B991, it becomes possible to efficiently transfer heat from each of the semiconductor chips B41 to each of the die pad sections B11. The joining layer B991 may be made of an insulating material instead of the electrically conductive material.

The first resin encapsulation portion B6 shown in FIGS. 45 and 48 covers the semiconductor chips B41 and B42, the passive chips B43, the first electrode portions B1, the second electrode portions B2, the third electrode portions B3, the joining layer B991 and the wires B8. More specifically, the first resin encapsulation portion B6 covers the die pad sections B11 of the first electrode portions B1, the connecting sections B12 of the first electrode portions B1, the wire bonding sections B13 of the first electrode portions B1, the wire bonding sections B23 of the second electrode portions B2 and the control die pad sections B31 of the third electrode portions B3. Even more specifically, the first resin encapsulation portion B6 covers the die pad major surfaces B111 and the die pad side surfaces B113 of the die pad sections B11. The first resin encapsulation portion B6 covers a portion of the leads B14, a portion of the leads B24 and a portion of the leads B32. All the leads B14, the leads B24 and the leads B32 are provided with a section protruding from the first resin encapsulation portion B6. The die pad rear surfaces B112 of the die pad sections B11 are exposed from the first resin encapsulation portion B6.

The first resin encapsulation portion B6 is made of an insulating resin. Examples of the insulating resin include a thermosetting resin, a thermoplastic resin, a potting and a composite. The heat conductivity of the first resin encapsulation portion B6 may be smaller than the heat conductivity of the second resin encapsulation portion B7. The heat conductivity of the first resin encapsulation portion B6 is, e.g., 0.1 W/mK to 1 W/mK. It is preferred in some embodiments that it would be difficult for the first resin encapsulation portion B6 to thermally expand. This is because, if the first resin encapsulation portion B6 thermally expands when the semiconductor device B101 is in use, there may a possible disconnection of the wires B8 and the semiconductor chips B41 or a disconnection of the wires B8 and the wire bonding sections B13.

As shown in FIG. 48, the first resin encapsulation portion B6 includes a resin major surface B61, a resin side surface B62 and a first resin surface B63.

The resin major surface B61 faces the same direction as the die pad major surface B111 faces (namely, the z1 direction). The resin major surface B61 is smooth. The resin side surface B62 surrounds the semiconductor chips B41 and B42 and the passive chips B43. The resin side surface B62 is inclined with respect to the resin major surface B61 so as to form an obtuse angle with the resin major surface B61. The first resin surface B63 faces the same direction as the die pad rear surface B112 faces (namely, the z2 direction). In the present embodiment, the first resin surface B63 is flush with the die pad rear surface B112. As shown in FIG. 49, the first resin surface B63 has a concave-convex section. The height difference of the concave-convex section of the first resin surface B63 is in some embodiments, e.g., from 0.1 μm to 1 μm.

The second resin encapsulation portion B7 shown in FIGS. 45 and 48 covers the die pad sections B11. More specifically, the second resin encapsulation portion B7 covers the die pad rear surface B112. The second resin encapsulation portion B7 makes direct contact with the die pad rear surface B112. In the present embodiment, the second resin encapsulation portion B7 makes direct contact with all the die pad rear surfaces B112. As shown in FIG. 49, the second resin encapsulation portion B7 makes direct contact with the concave-convex sections of the die pad rear surfaces B112. The second resin encapsulation portion B7 makes direct contact with the first resin surface B63. When seen in the thickness direction z of the die pad sections B11, the die pad sections B11 are arranged in the region occupied by the second resin encapsulation portion B7.

The second resin encapsulation portion B7 is made of an insulating resin. Examples of the insulating resin include a thermosetting resin, a thermoplastic resin, a potting and a composite. The heat conductivity of the second resin encapsulation portion B7 may be larger than the heat conductivity of the first resin encapsulation portion B6. The heat conductivity of the second resin encapsulation portion B7 is, e.g., 2 W/mK to 5 W/mK. Unlike the present embodiment, the material making up the second resin encapsulation portion B7 may be the same as the material making up the first resin encapsulation portion B6.

As shown in FIG. 48, the second resin encapsulation portion B7 includes a resin bottom surface B71, a resin wall surface B72 and a second resin surface B73.

The resin bottom surface B71 faces the same direction as the die pad rear surface B112 faces (namely, the z2 direction). The resin bottom surface B71 is exposed toward the direction toward which the die pad rear surface B112 faces. The resin bottom surface B71 overlaps with each of the die pad sections B11 when seen in the thickness direction z of the die pad sections B11. In the present embodiment, as shown in FIG. 47, the resin bottom surface B71 has a section protruding from the die pad sections B11 when seen in the z direction. The resin bottom surface B71 is smooth. When the semiconductor device B101 is mounted on the substrate B807, the resin bottom surface B71 directly faces the heat radiation member B808. The resin bottom surface B71 is in some embodiments spaced apart 100 μm to 250 μm from the die pad rear surface B112. The clearance, in some embodiments, between the resin bottom surface B71 and the die pad rear surface B112 may be equal to or larger than 100 μm. This makes it possible to prevent the die pad sections B11 from being electrically connected to each other by way of the second resin encapsulation portion B7. The clearance between the resin bottom surface B71 and the die pad rear surface B112 may in some embodiments be equal to or smaller than 250 μm. This makes it easy to dissipate the heat generated in the semiconductor chips B41 from the die pad sections B11 outside of the semiconductor device B101 via the resin bottom surface B71.

When seen in the z direction, the resin wall surface B72 is shaped to surround the semiconductor chips B41 and B42 and the passive chips B43. The resin wall surface B72 is inclined with respect to the resin bottom surface B71 so as to form an obtuse angle with the resin bottom surface B71. As shown in FIGS. 48 and 49, the second resin surface B73 makes direct contact with the first resin surface B63 and the die pad rear surface B112. In the present embodiment, each of the first resin surface B63 and the die pad rear surface B112 has a concave-convex section. Likewise, the second resin surface B73 has a concave-convex section.

As shown in FIG. 48, a plurality of low-thermal-expansion fillers B811 is dispersed in the first resin encapsulation portion B6. The thermal expansion coefficient of the material making up the respective low-thermal-expansion fillers B811 is smaller than the thermal expansion coefficient of the material making up the first resin encapsulation portion B6. The thermal expansion coefficient, in some embodiments, of the material making up the respective low-thermal-expansion fillers B811 is, e.g., from 5 ppm/degree C. to 100 ppm/degree C. The material making up the respective low-thermal-expansion fillers B811 may be, e.g., silicon dioxide. The low-thermal-expansion fillers B811 may have a spherical shape. If the low-thermal-expansion fillers B811 has a spherical shape, no sharp portion exists in the low-thermal-expansion fillers B811. It is therefore possible to prevent the low-thermal-expansion fillers B811 from hurting the semiconductor chips B41 and B42 and the passive chips B43.

As shown in FIG. 48, a plurality of heat radiating fillers B812 is dispersed in the second resin encapsulation portion B7. The heat conductivity of the material making up the heat radiating fillers B812 is larger than the heat conductivity of the material making up the second resin encapsulation portion B7. In the present embodiment, the heat radiating fillers B812 are pulverized fillers. The pulverized fillers are made of, e.g., alumina, silicon dioxide or boron nitride. The pulverized fillers are fillers formed by pulverizing a material. Since the pulverized fillers have edges, irregularities are easily formed on the surface of the resin containing the pulverized fillers. The pulverized fillers are superior in heat conductivity to spherical fillers. On the other hand, the spherical fillers are fillers formed by melting a pulverized material into a round shape. The surface of the resin containing the spherical fillers is smoother than the surface of the resin containing the pulverized fillers.

Next, description will be made on a manufacturing method of the semiconductor device B101. In the following description, the components identical with or similar to those described above will be designated by like reference symbols and description on the identical or similar components will be omitted, if appropriate.

Figure 50:
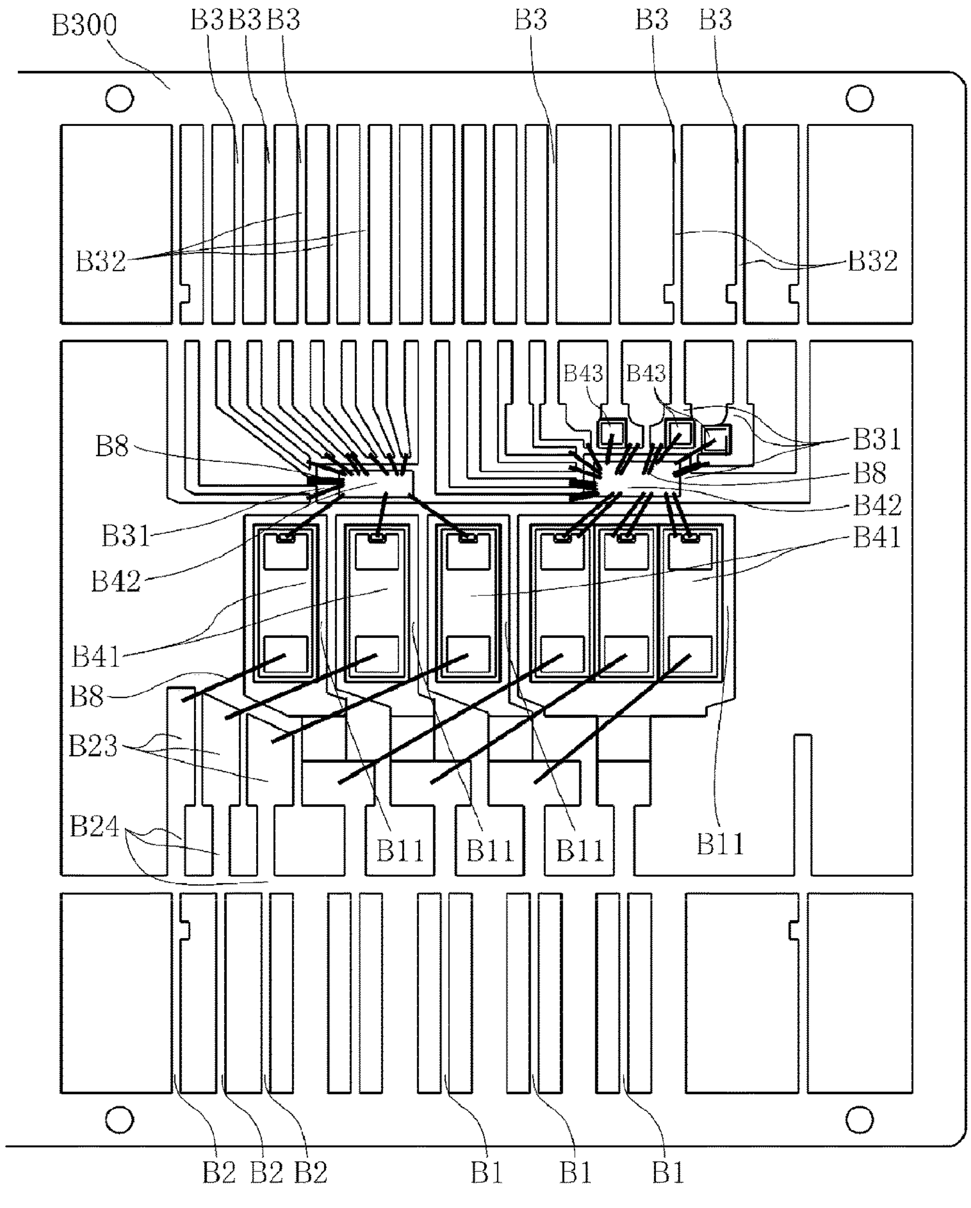
FIG. 50 is a plan view illustrating one process of a manufacturing method of the semiconductor device according to the fourth embodiment of the present disclosure.

As shown in FIG. 50, the lead frame B300 including the die pad sections B11 and B31, the semiconductor chips B41 and B42 and the passive chips B43 are prepared first. Then, as shown in FIG. 50, each of the semiconductor chips B41 is arranged in one of the die pad sections B11 with the joining layer (not shown) interposed therebetween. Similarly, each of the semiconductor chips B42 and each of the passive chips B43 are arranged in one of the control die pad sections B31 with the joining layer (not shown) interposed therebetween. Subsequently, as shown in FIG. 50, the wires B8 are bonded to the respective semiconductor chips B41 and B42 and so forth.

Figure 51:
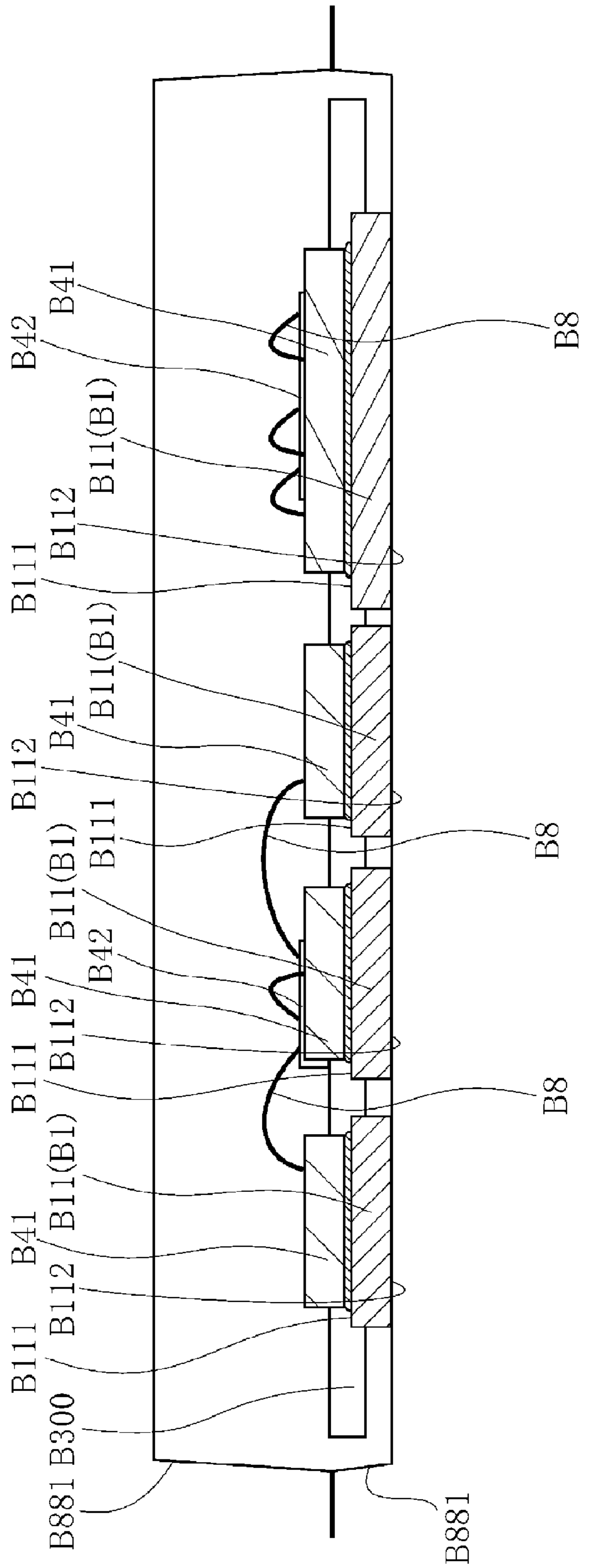
FIG. 51 is a section view illustrating a process subsequent to the process shown in FIG. 50.
Figure 52:
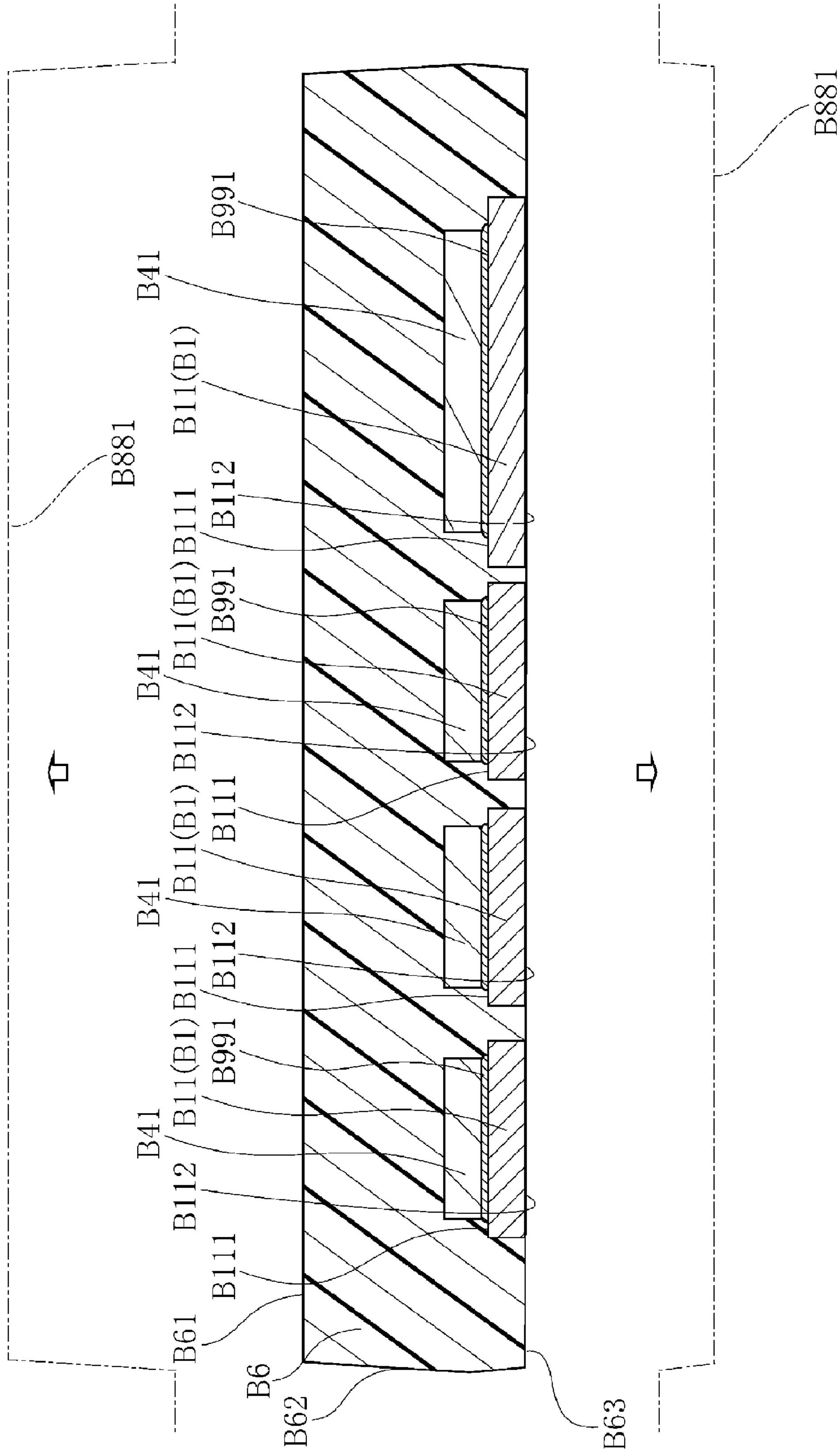
FIG. 52 is a section view illustrating a process subsequent to the process shown in FIG. 51.

Subsequently, as shown in FIGS. 51 and 52, the first resin encapsulation portion B6 is formed. As shown in FIG. 51, the first resin encapsulation portion B6 is formed by a transfer molding method using a first mold B881. As shown in FIG. 51, the lead frame B300 is pressed by the first mold B881. Then, a resin material is injected into the first mold B881 and is cured. Once the resin material is cured, the first mold B881 is removed from the lead frame B300 and so forth as shown in FIG. 52. This makes it possible to form the first resin encapsulation portion B6.

When forming the first resin encapsulation portion B6, the smooth surface of the first mold B881 positioned at the lower side in FIG. 52 makes contact with the die pad rear surface B112. For that reason, the first resin surface B63 flush with the die pad rear surface B112 is formed in the first resin encapsulation portion B6. On the other hand, the first mold B881 positioned at the upper side in FIG. 52 is formed into an inverted taper shape so that the first mold B881 positioned at the upper side in FIG. 52 can be easily removed from the first resin encapsulation portion B6. Therefore, as set forth above, the resin side surface B62 is inclined with respect to the resin major surface B61.

In order to obtain the semiconductor device B101 in which the low-thermal-expansion fillers B811 are dispersed in the first resin encapsulation portion B6, the low-thermal-expansion fillers B811 are mixed in the resin material for the formation of the first resin encapsulation portion B6.

Thin resin burrs covering the die pad sections B11 are sometimes formed after formation of the first resin encapsulation portion B6. In order to remove the resin burrs, the die pad sections B11 are subjected to a blasting process (not shown). The blasting process refers to a method for roughening a surface by sputtering non-metallic particles, such as silica sands, or metallic particles at a high speed. As a consequence, the die pad rear surface B112 of each of the die pad sections B11 and the first resin surface B63 of the first resin encapsulation portion B6 become irregular surfaces having a fine concave-convex shape as shown in FIG. 49.

Figure 53:
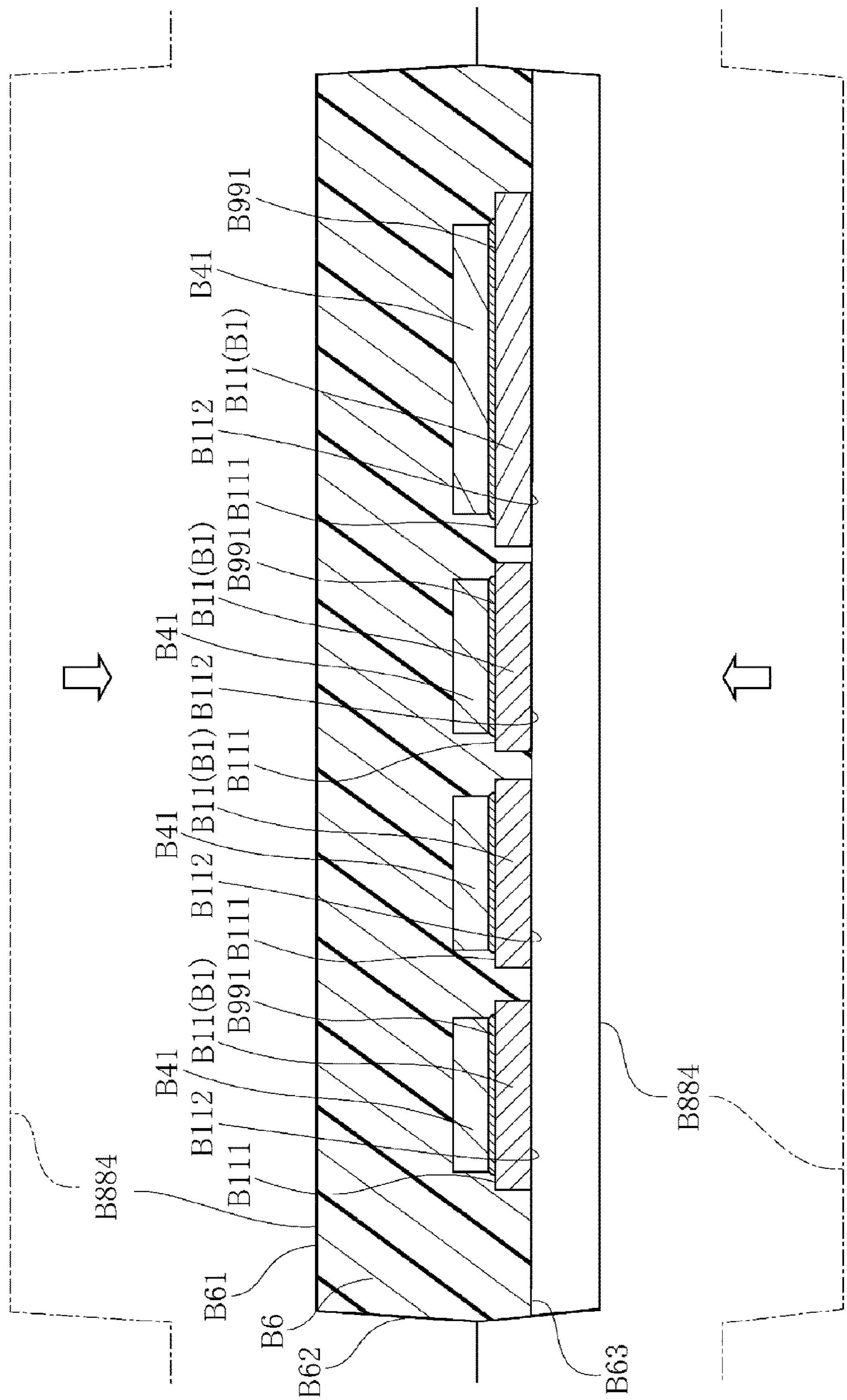
FIG. 53 is a section view illustrating a process subsequent to the process shown in FIG. 52.

Next, the second resin encapsulation portion B7 is formed. As shown in FIG. 53, the second resin encapsulation portion B7 is formed by a transfer molding method using a second mold B884. As shown in FIG. 53, a resin material is injected into the second mold B884 and is cured. Once the resin material is cured, the second mold B884 is removed from the lead frame B300 and so forth. This makes it possible to form the second resin encapsulation portion B7.

When forming the second resin encapsulation portion B7, the second mold B884 positioned at the lower side in FIG. 53 is formed into an inverted taper shape so that the second mold B884 positioned at the lower side in FIG. 53 can be easily removed from the second resin encapsulation portion B7. Therefore, as set forth above, the resin wall surface B72 is inclined with respect to the resin bottom surface B71.

In order to obtain the semiconductor device B101 in which the heat radiating fillers B812 are dispersed in the second resin encapsulation portion B7, the heat radiating fillers B812 are mixed in the resin material for the formation of the second resin encapsulation portion B7.

Subsequently, the lead frame B300 shown in FIG. 50 is appropriately diced to thereby manufacture the semiconductor device B101 shown in FIG. 46 and other figures.

Next, description will be made on the operations and effects of the present embodiment.

In the semiconductor device B101, the die pad rear surface B112 has a concave-convex section with which the second resin encapsulation portion B7 makes direct contact. With this configuration, it is possible to increase the joining area between the die pad rear surface B112 and the second resin encapsulation portion B7. If the joining area between the die pad rear surface B112 and the second resin encapsulation portion B7 grows larger, the die pad rear surface B112 and the second resin encapsulation portion B7 are strongly joined together. Therefore, the second resin encapsulation portion B7 is hardly separated from the die pad rear surface B112. In addition, if the joining area between the die pad rear surface B112 and the second resin encapsulation portion B7 grows larger, the heat transferred from the semiconductor chips B41 to the die pad sections B11 can be readily transferred from the die pad sections B11 to the second resin encapsulation portion B7. For that reason, the heat generated in the semiconductor chips B41 can be efficiently transferred outside of the semiconductor device B101 (to the heat radiation member B808 in the present embodiment) by way of the resin bottom surface B71. The semiconductor device B101 is superior in heat dissipation. With the present embodiment, it is possible to provide a semiconductor device B101 capable of suppressing exfoliation of the second resin encapsulation portion B7 and performing superior heat dissipation.

In the semiconductor device B101, the material making up the second resin encapsulation portion B7 is higher in heat conductivity than the material making up the first resin encapsulation portion B6. With this configuration, the heat generated in the semiconductor chips B41 is hardly transferred to the first resin encapsulation portion B6 but can be easily transferred outside of the semiconductor device B101 via the die pad sections B11 and the second resin encapsulation portion B7. That is to say, with the present embodiment, the heat generated in the semiconductor chips B41 can be efficiently transferred outside of the semiconductor device B101.

In the semiconductor device B101, the first resin encapsulation portion B6 has the first resin surface B63 that makes direct contact with the second resin encapsulation portion B7. The first resin surface B63 has a concave-convex section. With this configuration, it is possible to increase the joining area between the second resin encapsulation portion B7 and the first resin encapsulation portion B6. If the joining area between the second resin encapsulation portion B7 and the first resin encapsulation portion B6 grows larger, it is possible to suppress exfoliation of the second resin encapsulation portion B7 from the first resin encapsulation portion B6.

The semiconductor device B101 includes the heat radiating fillers B812. The thermal conductivity of the material making up the heat radiating fillers B812 is larger than the heat conductivity of the resin material making up the second resin encapsulation portion B7. With this configuration, the heat generated in the semiconductor chips B41 can be efficiently transferred outside of the semiconductor device B101.

In the semiconductor device B101, the heat radiating fillers B812 are pulverized fillers. The pulverized fillers are often higher in heat conductivity than the spherical fillers. For that reason, with the present embodiment, the heat generated in the semiconductor chips B41 can be efficiently transferred outside of the semiconductor device B101. The second resin encapsulation portion B7 does not make contact with the semiconductor chips B41. Therefore, the pulverized fillers dispersed in the second resin encapsulation portion B7 do not make contact with the semiconductor chips B41. It is therefore possible to avoid a possibility that the semiconductor chips B41 are damaged by the pulverized fillers.

In the manufacturing method of the semiconductor device B101, the concave-convex section is formed on the die pad rear surface B112. When forming the concave-convex section on the die pad rear surface B112, the die pad rear surface B112 is subjected to a blasting process. Forming the concave-convex section on the die pad rear surface B112 is performed after forming the first resin encapsulation portion B6. Forming the second resin encapsulation portion B7 is performed after forming the concave-convex section on the die pad rear surface B112. With this configuration, when performing the blasting process, the semiconductor chips B41 are covered with first resin encapsulation portion B6. For that reason, the non-metallic particles or the metallic particles sputtered toward the die pad rear surface B112 to perform the blasting process do not impinge on the semiconductor chips B41 but impinge on the first resin encapsulation portion B6 and the die pad sections B11. This makes it possible to prevent the non-metallic particles or the metallic particles from impinging on the semiconductor chips B41 and damaging the semiconductor chips B41 when performing the blasting process. For the same reason, it is possible to prevent the semiconductor chips B42, the passive chips B43 and the wires B8 from being damaged when performing the blasting process.

In the manufacturing method of the semiconductor device B101, the blasting process is performed with respect to the first resin encapsulation portion B6 while performing the blasting process with respect to the die pad rear surface B112. With this configuration, it is not necessary to form the concave-convex section on the first resin surface B63 of the first resin encapsulation portion B6 independently of the formation of the concave-convex section on the die pad rear surface B112. Accordingly, this configuration assists in enhancing the manufacturing efficiency of the semiconductor device.

Fifth Embodiment

A fifth embodiment of the present disclosure will be described with reference to FIGS. 54 and 55.

Figure 54:
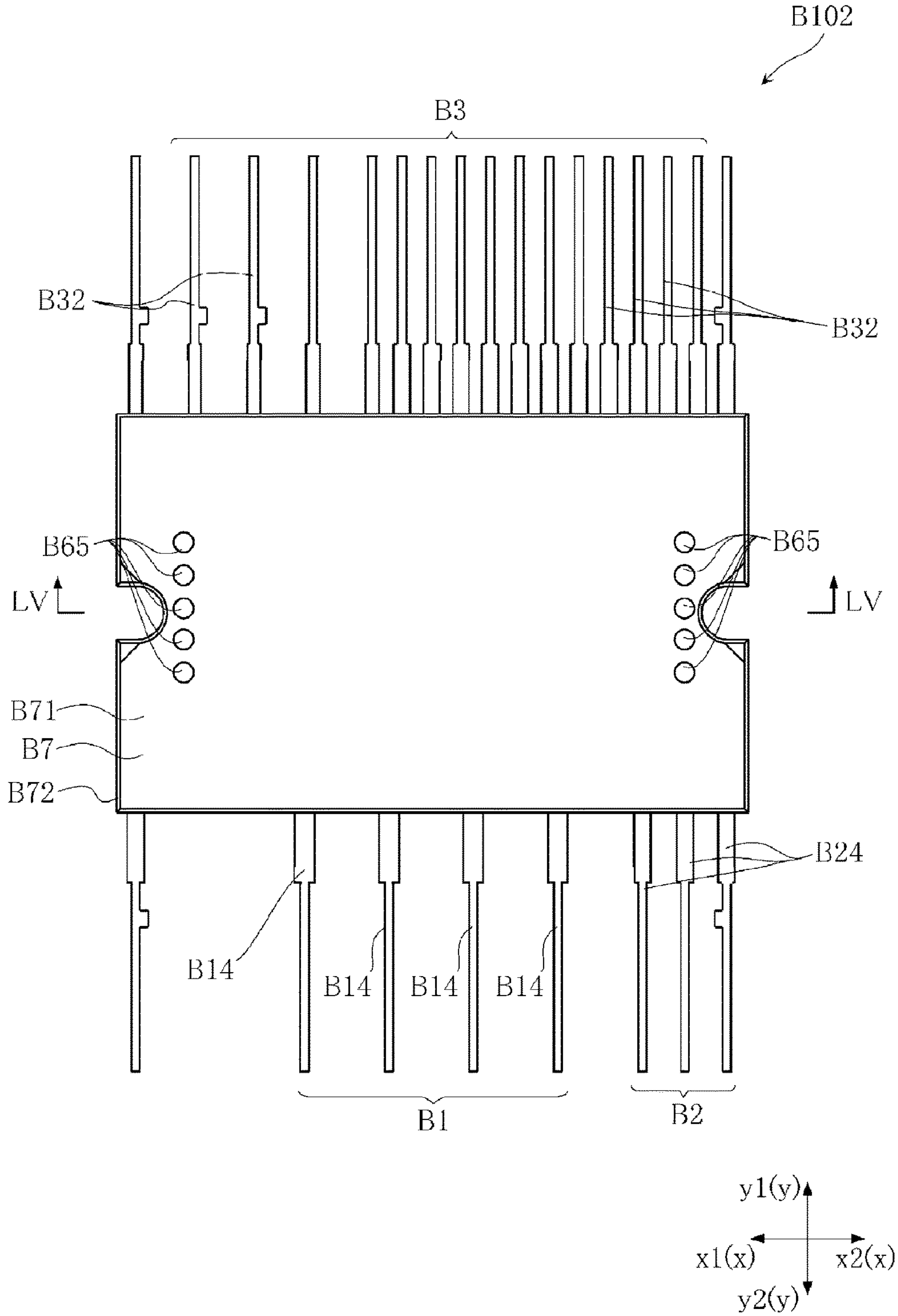
FIG. 54 is a bottom view of a semiconductor device according to a fifth embodiment of the present disclosure prior to bending the leads.
Figure 55:
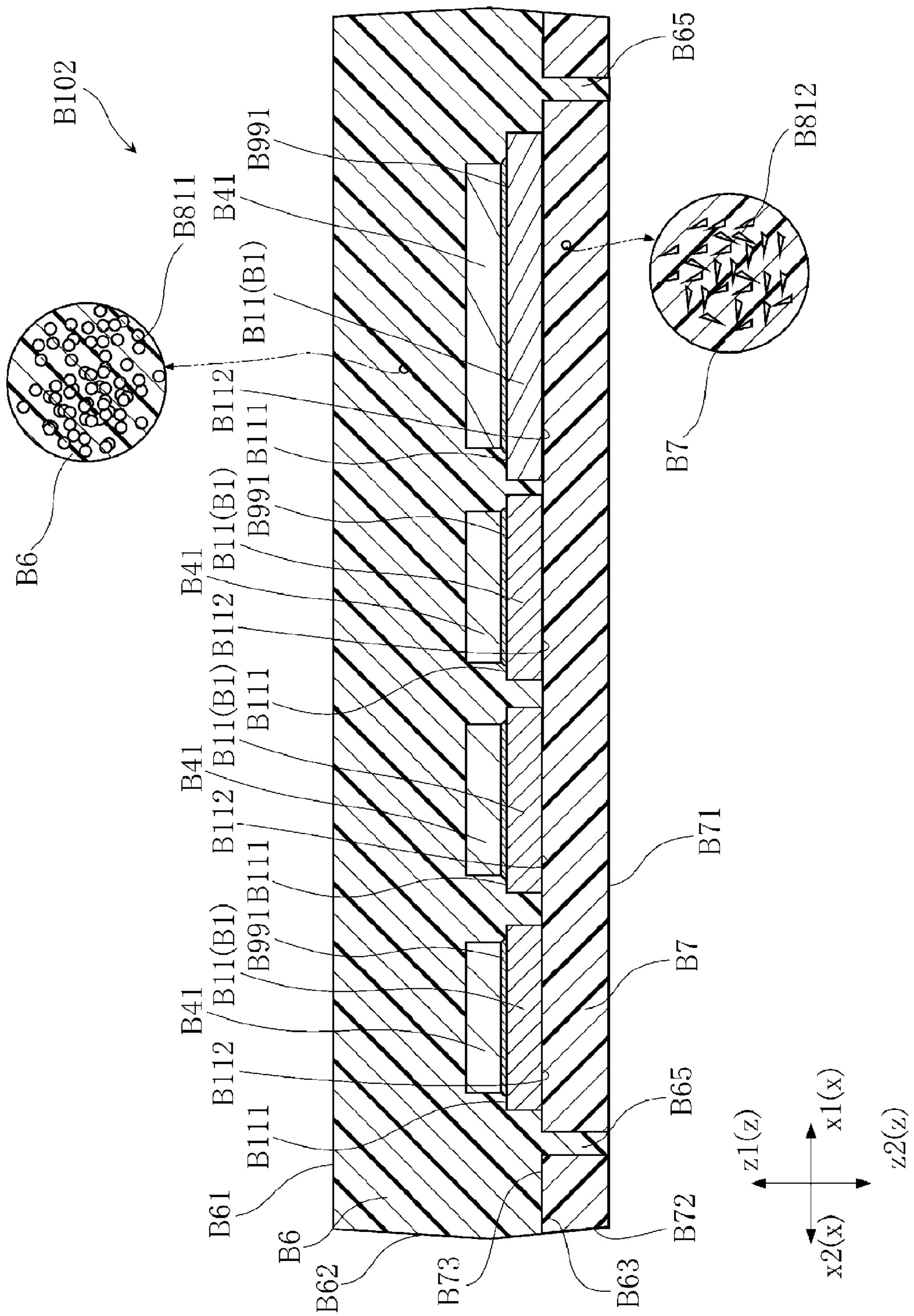
FIG. 55 is a section view taken along line LV-LV in FIG. 54.

FIG. 54 is a bottom view of a semiconductor device according to a fifth embodiment of the present disclosure prior to bending the leads. FIG. 55 is a section view taken along line LV-LV in FIG. 54.

The semiconductor device B102 shown in these figures includes first electrode portions B1, second electrode portions B2, third electrode portions B3, semiconductor chips B41 and B42, passive chips B43, a first resin encapsulation portion B6, a second resin encapsulation portion B7, wires B8 and a joining layer B991. Except for the first resin encapsulation portion B6 and the second resin encapsulation portion B7, the respective components of the semiconductor device B102 including the first electrode portions B1, the second electrode portions B2, the third electrode portions B3, the semiconductor chips B41 and B42, the passive chips B43, the wires B8 and the joining layer B991 are the same as the respective components of the semiconductor device B101 described above and, therefore, will not be described.

The first resin encapsulation portion B6 remains the same as the configuration of the semiconductor device B101 described above except that the first resin encapsulation portion B6 further includes a plurality of protrusion sections B65. Each of the protrusion sections B65 is shaped to protrude from the first resin surface B63. The protrusion sections B65 may have a circular columnar shape or a rectangular columnar shape. The protrusion sections B65 extends into the second resin encapsulation portion B7. In the present embodiment, the protrusion sections B65 penetrate the second resin encapsulation portion B7, whereby the protrusion sections B65 are exposed from the resin bottom surface B71. Each of the protrusion sections B65 has a surface flush with the resin bottom surface B71. The protrusion sections B65 need not necessarily penetrate the second resin encapsulation portion B7.

The second resin encapsulation portion B7 remains the same as the configuration of the semiconductor device B101 except that the protrusion sections B65 extend into the second resin encapsulation portion B7. Therefore, no description will be made on the second resin encapsulation portion B7.

Next, description will be made on the operations and effects of the present embodiment.

In the semiconductor device B102, the die pad rear surface B112 has a concave-convex section making direct contact with the second resin encapsulation portion B7. With this configuration, for the same reason as described with respect to the fourth embodiment, it is possible to provide the semiconductor device B102 capable of suppressing exfoliation of the second resin encapsulation portion B7 and performing superior heat dissipation.

In the semiconductor device B102, the first resin encapsulation portion B6 includes the protrusion sections B65 extending into the second resin encapsulation portion B7. With this configuration, the joining area between the first resin encapsulation portion B6 and the second resin encapsulation portion B7 in the semiconductor device B101 can be increased just as much as the area substantially equal to the joining area between the protrusion sections B65 and the second resin encapsulation portion B7. Accordingly, it is possible to strongly join the second resin encapsulation portion B7 and the first resin encapsulation portion B6 and to prevent exfoliation of the second resin encapsulation portion B7 from the first resin encapsulation portion B6.

In the semiconductor device B102, the material making up the second resin encapsulation portion B7 is higher in heat conductivity than the material making up the first resin encapsulation portion B6. With this configuration, for the same reason as described with respect to the fourth embodiment, the heat generated in the semiconductor chips B41 can be efficiently transferred outside of the semiconductor device B102.

In the semiconductor device B102, the first resin encapsulation portion B6 has the first resin surface B63 that makes direct contact with the second resin encapsulation portion B7. The first resin surface B63 has the concave-convex section. With this configuration, for the same reason as described with respect to the fourth embodiment, it is possible to restrain the second resin encapsulation portion B7 from being separated from the first resin encapsulation portion B6.

The semiconductor device B102 includes the heat radiating fillers B812. The thermal conductivity of the material making up the heat radiating fillers B812 is larger than the heat conductivity of the resin material making up the second resin encapsulation portion B7. With this configuration, the heat generated in the semiconductor chips B41 can be efficiently transferred outside of the semiconductor device B102.

In the semiconductor device B102, the heat radiating fillers B812 are pulverized fillers. The pulverized fillers are often higher in heat conductivity than the spherical fillers. For that reason, with the present embodiment, the heat generated in the semiconductor chips B41 can be efficiently transferred outside of the semiconductor device B102. The second resin encapsulation portion B7 does not make contact with the semiconductor chips B41. Therefore, the pulverized fillers dispersed in the second resin encapsulation portion B7 do not make contact with the semiconductor chips B41. It is therefore possible to avoid a possibility that the semiconductor chips B41 are damaged by the pulverized fillers.

While not shown in the drawings, the concave-convex section is formed on the die pad rear surface B112 in the manufacturing method of the semiconductor device B102. When forming the concave-convex section on the die pad rear surface B112, the die pad rear surface B112 is subjected to a blasting process. Forming the concave-convex section on the die pad rear surface B112 is performed after forming the first resin encapsulation portion B6. Forming the second resin encapsulation portion B7 is performed after forming the concave-convex section on the die pad rear surface B112. With this configuration, for the same reason as described with respect to the fourth embodiment, it is possible to prevent the non-metallic particles or the metallic particles from impinging on the semiconductor chips B41 and consequently damaging the semiconductor chips B41 when performing the blasting process. For the same reason, it is possible to prevent the semiconductor chips B42, the passive chips B43 and the wires B8 from being damaged when performing the blasting process.

In the manufacturing method of the semiconductor device B102, while not shown in the drawings, the blasting process is performed with respect to the first resin encapsulation portion B6 while performing the blasting process with respect to the die pad rear surface B112. With this configuration, for the same reason as described with respect to the fourth embodiment, it is possible to enhance the manufacturing efficiency of the semiconductor device.

Sixth Embodiment

A sixth embodiment of the present disclosure will be described with reference to FIGS. 56 and 57.

Figure 56:
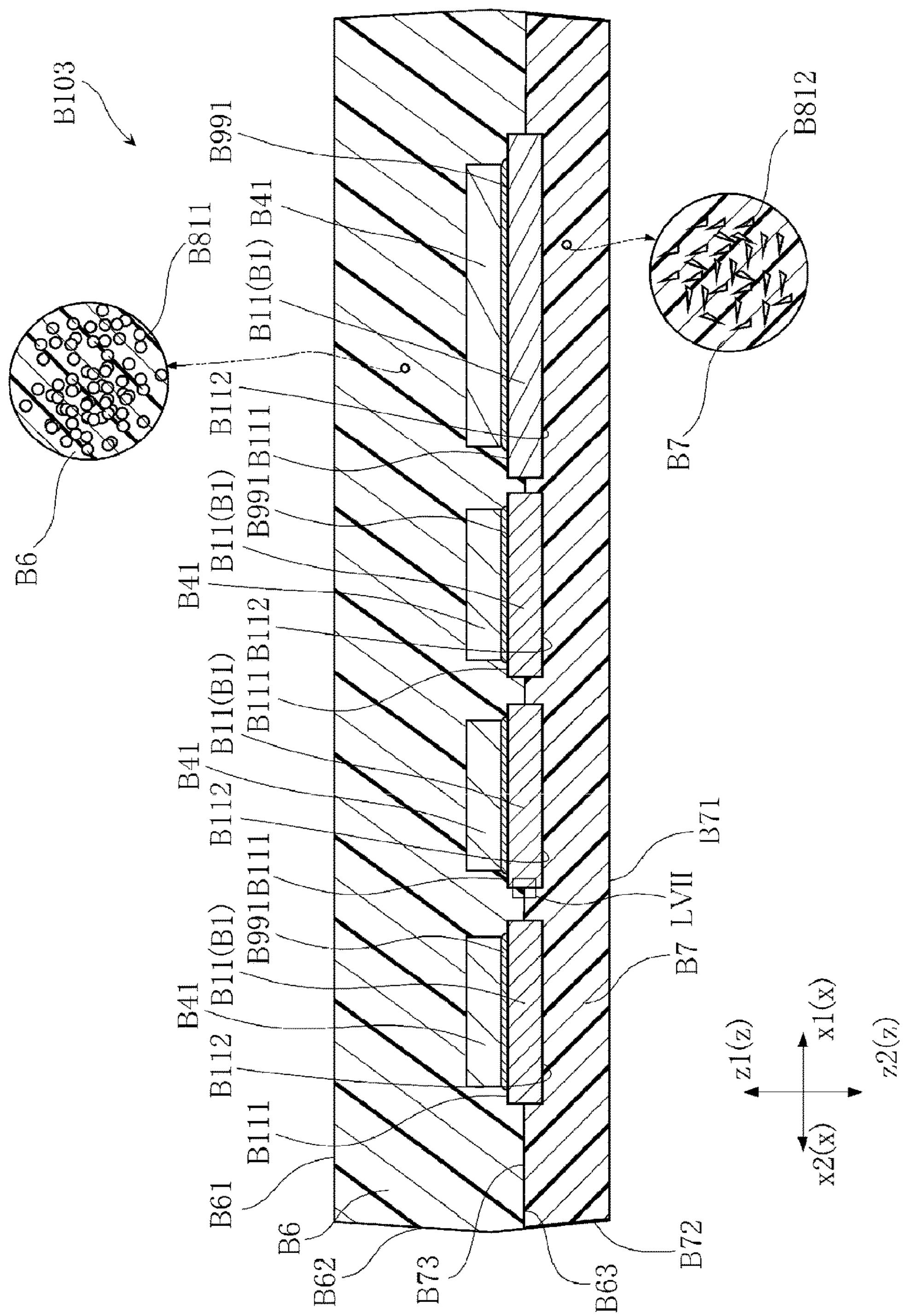
FIG. 56 is a section view illustrating a semiconductor device according to a sixth embodiment of the present disclosure.
Figure 57:
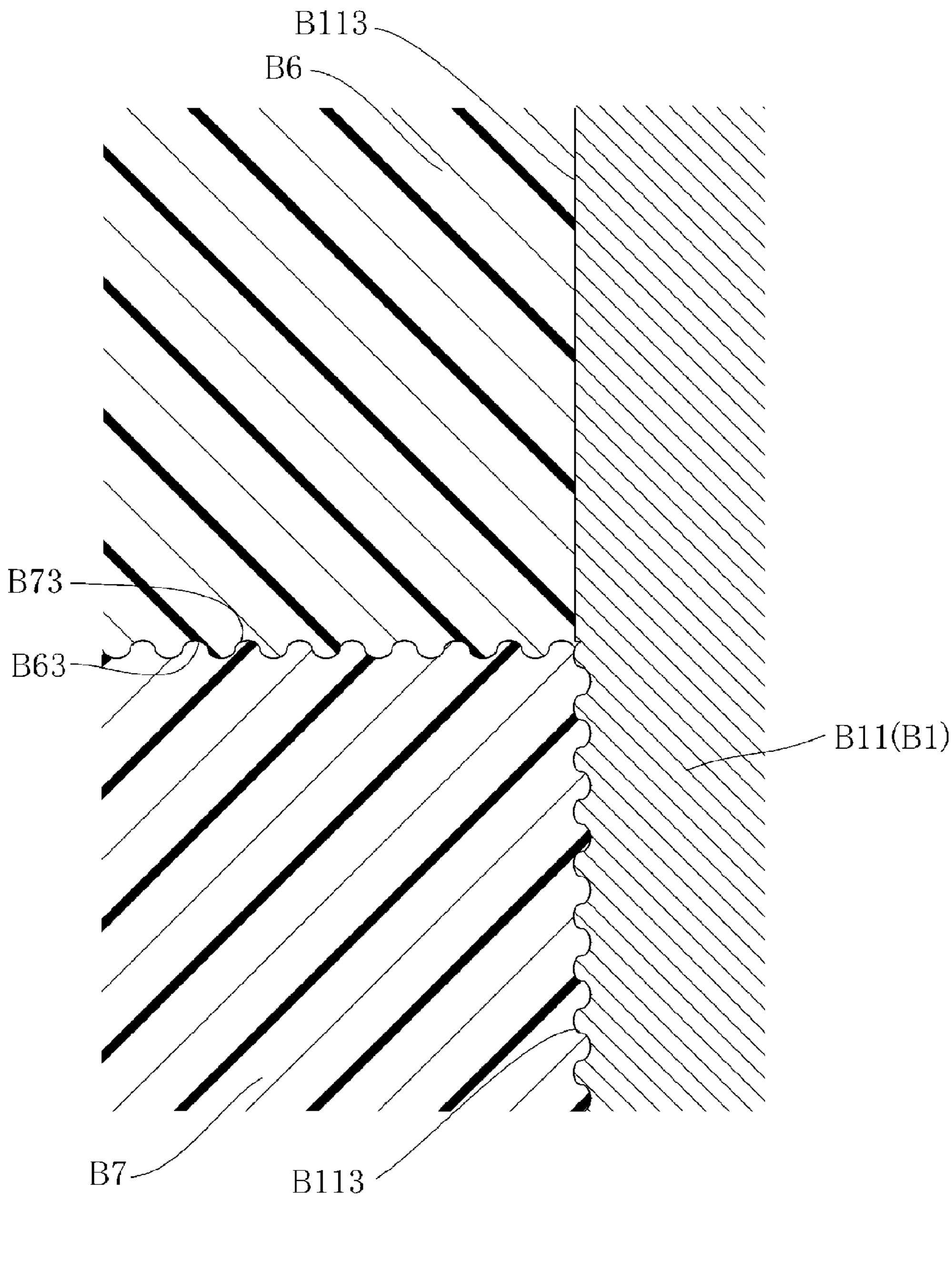
FIG. 57 is a partially enlarged view of the region LVII in FIG. 56.

FIG. 56 is a section view illustrating a semiconductor device according to a sixth embodiment of the present disclosure. FIG. 57 is a partially enlarged view of the region LVII in FIG. 56.

The semiconductor device B103 shown in these figures includes first electrode portions B1, second electrode portions B2, third electrode portions B3, semiconductor chips B41 and B42, passive chips B43, a first resin encapsulation portion B6, a second resin encapsulation portion B7, wires B8 and a joining layer B991. Except for the first electrode portions B1, the first resin encapsulation portion B6 and the second resin encapsulation portion B7, the respective components of the semiconductor device B103 including the second electrode portions B2, the third electrode portions B3, the semiconductor chips B41 and B42, the passive chips B43, the wires B8 and the joining layer B991 are the same as the respective components of the semiconductor device B101 described above and, therefore, will not be described. The second electrode portions B2, the third electrode portions B3, the semiconductor chips B42, the passive chips B43 and the wires B8 are not shown.

Each of the first electrode portions B1 includes die pad sections B11, connecting sections B12, wire bonding sections B13 and leads B14. The configurations of the connecting sections B12, the wire bonding sections B13 and the leads B14 remain the same as those of the aforementioned semiconductor device B101 and, therefore, will not be shown and described.

Each of the die pad sections B11 is formed into a plate-like shape to extend along the x-y plane. The semiconductor chips B41 are arranged in the die pad sections B11.

Each of the die pad sections B11 has a die pad major surface B111, a die pad rear surface B112 and a die pad side surface B113. The die pad major surface B111 and the die pad rear surface B112 are the same as those of the aforementioned semiconductor device B101 and, therefore, will not be described.

The die pad side surface B113 faces toward the direction intersecting the thickness direction of the die pad sections B11 (the z direction). The die pad side surfaces B113 of two mutually-adjoining die pad sections B11 have mutually-opposing sections. In the present embodiment, as shown in FIG. 57, the die pad side surface B113 is provided with a section having a fine concave-convex shape. The concave-convex section of the die pad side surface B113 is joined to the die pad rear surface B112. The region of the die pad side surface B113 existing at the die pad major surface B111 is covered by the first resin encapsulation portion B6. The region of the die pad side surface B113 existing at the die pad major surface B111 makes direct contact with the first resin encapsulation portion B6. On the other hand, the region of the die pad side surface B113 existing at the die pad rear surface B112 is covered by the second resin encapsulation portion B7. The region of the die pad side surface B113 existing at the die pad rear surface B112 makes direct contact with the second resin encapsulation portion B7. The concave-convex section of the die pad side surface B113 is a region of the die pad side surface B113 making direct contact with the second resin encapsulation portion B7. The height difference, in some embodiments, of the concave-convex section of the die pad side surface B113 is, e.g., from 0.01 μm to 1 μm. The concave-convex section is formed on the die pad side surface B113 by performing the blasting process to the die pad sections B11 (described above).

The first resin surface B63 of the first resin encapsulation portion B6 is positioned between the die pad major surface B111 and the die pad rear surface B112 in the z direction. Except for this point, the first resin encapsulation portion B6 is the same as the configuration of the aforementioned semiconductor device B101 and, therefore, will not be described.

The second resin surface B73 of the second resin encapsulation portion B7 is positioned between the die pad major surface B111 and the die pad rear surface B112 in the z direction. Except for this point, the second resin encapsulation portion B7 is the same as the configuration of the aforementioned semiconductor device B101 and, therefore, will not be described.

Next, description will be made on the operations and effects of the present embodiment.

In the semiconductor device B103, the die pad side surface B113 has the concave-convex section making direct contact with the second resin encapsulation portion B7. With this configuration, it is possible to increase the joining area between the second resin encapsulation portion B7 and the die pad sections B11. For the same reason as described with respect to the fourth embodiment, it is possible to enhance heat dissipation and to prevent exfoliation of the second resin encapsulation portion B7.

In the semiconductor device B103, the die pad rear surface B112 has a concave-convex section with which the second resin encapsulation portion B7 makes direct contact. With this configuration, for the same reason as described with respect to the fourth embodiment, there is provided the semiconductor device B103 capable of suppressing exfoliation of the second resin encapsulation portion B7 and performing superior heat dissipation.

In the semiconductor device B103, the material making up the second resin encapsulation portion B7 is higher in heat conductivity than the material making up the first resin encapsulation portion B6. With this configuration, for the same reason as described with respect to the fourth embodiment, the heat generated in the semiconductor chips B41 can be efficiently transferred outside of the semiconductor device B103.

In the semiconductor device B103, the first resin encapsulation portion B6 has the first resin surface B63 that makes direct contact with the second resin encapsulation portion B7. The first resin surface B63 has a concave-convex section. With this configuration, for the same reason as described with respect to the fourth embodiment, it is possible to restrain the second resin encapsulation portion B7 from being separated from the first resin encapsulation portion B6.

The semiconductor device B103 includes the heat radiating fillers B812. The thermal conductivity of the material making up the heat radiating fillers B812 is larger than the heat conductivity of the resin material making up the second resin encapsulation portion B7. With this configuration, the heat generated in the semiconductor chips B41 can be efficiently transferred outside of the semiconductor device B103.

In the semiconductor device B103, the heat radiating fillers B812 are pulverized fillers. The pulverized fillers are often higher in heat conductivity than the spherical fillers. For that reason, with the present embodiment, the heat generated in the semiconductor chips B41 can be efficiently transferred outside of the semiconductor device B103. The second resin encapsulation portion B7 does not make contact with the semiconductor chips B41. Therefore, the pulverized fillers dispersed in the second resin encapsulation portion B7 do not make contact with the semiconductor chips B41. It is therefore possible to avoid the possibility that the semiconductor chips B41 are damaged by the pulverized fillers.

While not shown in the drawings, the concave-convex sections are formed on the die pad rear surface B112 and the die pad side surface B113 in the manufacturing method of the semiconductor device B103. Forming the concave-convex section on the die pad rear surface B112, the die pad rear surface B112 and the die pad side surface B113 are subjected to a blasting process. Forming the concave-convex section on the die pad rear surface B112 is performed after forming the first resin encapsulation portion B6. Forming the second resin encapsulation portion B7 is performed after forming the concave-convex sections on the die pad rear surface B112 and the die pad side surface B113. With this configuration, for the same reason as described with respect to the fourth embodiment, it is possible to prevent the non-metallic particles or the metallic particles from impinging on the semiconductor chips B41 and consequently damaging the semiconductor chips B41 when performing the blasting process. For the same reason, it is possible to prevent the semiconductor chips B42, the passive chips B43 and the wires B8 from being damaged when performing the blasting process.

The configuration of the semiconductor device B103 may be combined with the configuration of the semiconductor device B102.

The method of forming the concave-convex section on the die pad rear surface B112 is not limited to the blasting process. Alternatively, the concave-convex section may be formed on the die pad rear surface B112 when forming the lead frame B300. In addition, irregularities may be formed on the surface of the mold B811 for forming the first resin surface B63 or the second resin surface B73.

Additionally, some other configurations of the present disclosure and the variations thereof will now be enumerated as appendices.

APPENDIX 23

A semiconductor device, including:

an electrically conductive die pad section having a die pad major surface and a die pad rear surface, both of which face toward the opposite sides from each other;

a semiconductor chip arranged in the die pad major surface;

a first encapsulating resin portion covering the die pad major surface and the semiconductor chip; and a second encapsulating resin portion making direct contact with the first encapsulating resin portion, the second encapsulating resin portion having a resin bottom surface exposed toward a side toward which the die pad rear surface faces, the resin bottom surface overlapping with the die pad section when seen in a thickness direction of the die pad section, the die pad rear surface having a concave-convex section with which the second encapsulating resin portion makes direct contact.

APPENDIX 24

The device of Appendix 23, wherein the heat conductivity of a material making up the second encapsulating resin portion is larger than the heat conductivity of a material making up the first encapsulating resin portion.

APPENDIX 25

The device of Appendix 23 or 24, further including a plurality of heat radiating fillers dispersed in the second encapsulating resin portion, the heat radiating fillers being pulverized fillers.

APPENDIX 26

The device of Appendix 25, wherein the pulverized fillers are made of alumina, silicon dioxide or boron nitride.

APPENDIX 27

The device of any one of Appendices 23 to 26, further including a plurality of low-thermal-expansion fillers dispersed in the first encapsulating resin portion, the low-thermal-expansion fillers being spherical fillers.

APPENDIX 28

The device of any one of Appendices 23 to 27, wherein the first encapsulating resin portion has a first resin surface with which the second encapsulating resin portion makes direct contact, the first resin surface having a concave-convex section.

APPENDIX 29

The device of Appendix 28, wherein the first resin surface is flush with the die pad rear surface.

APPENDIX 30

The device of Appendix 28, wherein the first resin surface is positioned between the die pad rear surface and the die pad major surface in the thickness direction of the die pad section.

APPENDIX 31

The device of any one of Appendices 23 to 30, wherein the first encapsulating resin portion includes a protrusion section extending into the second encapsulating resin portion.

APPENDIX 32

The device of any one of Appendices 23 to 31, wherein the second encapsulating resin portion overlaps with the entirety of the die pad section when seen in the thickness direction of the die pad section.

APPENDIX 33

The device of any one of Appendices 23 to 32, wherein the first encapsulating resin portion has a resin major surface facing toward the same direction as a direction toward which the die pad major surface faces, the resin major surface overlapping with the die pad section when seen in the thickness direction of the die pad section.

APPENDIX 34

The device of Appendix 33, wherein the first encapsulating resin portion has a resin side surface surrounding the semiconductor chip, the resin side surface inclined with respect to the resin major surface so as to form an obtuse angle with the resin major surface.

APPENDIX 35

The device of any one of Appendices 23 to 34, wherein the resin bottom surface is 100 μm to 250 μm spaced apart from the die pad rear surface.

APPENDIX 36

The device of Appendix 35, wherein the heat conductivity of the second encapsulating resin portion is from 2 W/mK to 5 W/mK.

APPENDIX 37

The device of any one of Appendices 23 to 36, wherein the second encapsulating resin portion has a resin wall surface shaped to surround the die pad section when seen in the thickness direction of the die pad section, the resin wall surface inclined with respect to the resin bottom surface so as to form an obtuse angle with the resin bottom surface.

APPENDIX 38

A semiconductor device mounting structure, including:

the semiconductor device of any one of Appendices 23 to 37;

a substrate to which the semiconductor device is mounted; and a radiator member directly facing the resin bottom surface.

APPENDIX 39

A semiconductor device manufacturing method, including the steps of:

preparing a semiconductor chip and a die pad section having a die pad major surface and a die pad rear surface;

arranging the semiconductor chip in the die pad major surface;

forming a first encapsulating resin portion covering the die pad major surface and the semiconductor chip;

forming a concave-convex section on the die pad rear surface; and forming a second encapsulating resin portion covering the concave-convex section of the die pad rear surface.

APPENDIX 40

The method of Appendix 39, wherein the die pad rear surface is subjected to a blasting process in the step of forming the concave-convex section.

APPENDIX 41

The method of Appendix 40, further including the step of: simultaneously subjecting the die pad rear surface and the first encapsulating resin portion to the blasting process.

APPENDIX 42

A power semiconductor device, including:

a power chip having a heat generating portion;

an LSI chip configured to control the power chip, the power chip and the LSI chip encapsulated by a resin;

a first encapsulating resin portion covering the power chip and the LSI chip; and a second encapsulating resin portion making direct contact with the first encapsulating resin portion, the first encapsulating resin portion and the second encapsulating resin portion provided with contact surfaces having concave-convex sections rougher than surfaces exposed to the outside.

While certain embodiments have been described, these embodiments have been presented by way of example only, and are not intended to limit the scope of the disclosures. Indeed, the novel devices, structures and methods described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:

a die pad section;

a semiconductor chip joined to the die pad section;

a heat radiation plate spaced apart from the die pad section; and an encapsulating resin portion configured to cover at least semiconductor-chip-side regions of the die pad section, the semiconductor chip and the heat radiation plate, the encapsulating resin portion including an intermediate section existing between the heat radiation plate and the die pad section, the intermediate section being in direct contact with the heat radiation plate and the die pad section, wherein the die pad section has a major surface and a rear surface, the semiconductor chip is joined to the major surface of the die pad section, wherein the heat radiation plate has a major surface and a side surface, the major surface of the heat radiation plate directly facing the rear surface of the die pad section and the side surface of the heat radiation plate being perpendicular to the major surface of the heat radiation plate in direct contact with the encapsulating resin portion, wherein the heat radiation plate includes a dropout prevention portion protruding from the side surface of the heat radiation plate, the dropout prevention portion has a major surface, and the major surface of the dropout prevention portion is integrally formed with the major surface of the heat radiation plate, and wherein a concave-convex portion is formed integrally on the major surface of the dropout prevention portion and the major surface of the heat radiation plate.

2. The semiconductor device of claim 1, wherein the heat radiation plate has a rear surface on an opposite side of the major surface of the heat radiation plate, the rear surface of the heat radiation plate exposed from the encapsulating resin portion.

3. The semiconductor device of claim 2, wherein the encapsulating resin portion has a bottom surface, the bottom surface of the encapsulating resin portion faces toward a same direction as a facing direction of the rear surface of the heat radiation plate, the heat radiation plate having a section protruding toward the facing direction of the rear surface of the heat radiation plate beyond the bottom surface of the encapsulating resin portion.

4. The semiconductor device of claim 1, wherein the heat radiation plate is made of an electrically conductive material.

5. The semiconductor device of claim 4, wherein the electrically conductive material comprises aluminum, copper, copper alloy or iron.

6. The semiconductor device of claim 4, further comprising: a spacer existing between the die pad section and the heat radiation plate, the spacer being made of an insulating material.

7. The semiconductor device of claim 1, wherein the heat radiation plate is made of an insulating material.

8. The semiconductor device of claim 7, wherein the insulating material comprises ceramic.

9. The semiconductor device of claim 8, wherein the ceramic comprises alumina, aluminum nitride or silicon nitride.

10. The semiconductor device of claim 1, further comprising: a joining layer existing between the semiconductor chip and the die pad section to join the semiconductor chip and the die pad section together.

11. A semiconductor device mounting structure, comprising:

the semiconductor device of claim 1;

a substrate to which the semiconductor device is mounted; and a radiator member fixed with respect to the substrate and configured to directly face the heat radiation plate.

12. The semiconductor device of claim 1, wherein the semiconductor chip is a power chip, and further comprising an LSI chip configured to control the power chip, wherein the heat radiation plate is arranged at a rear surface side of the die pad section to which the power chip is mounted, and wherein the semiconductor device is an IPM semiconductor device.

13. A semiconductor device, comprising:

a die pad section;

a semiconductor chip joined to the die pad section;

a heat radiation plate in direct contact with the die pad section; and an encapsulating resin portion configured to cover at least semiconductor-chip-side regions of the die pad section, the semiconductor chip and the heat radiation plate, wherein the die pad section has a major surface and a rear surface, the semiconductor chip is joined to the major surface of the die pad section, wherein the heat radiation plate has a major surface and a side surface, the major surface of the heat radiation plate directly facing the rear surface of the die pad section and the side surface of the heat radiation plate being perpendicular to the major surface of the heat radiation plate in direct contact with the encapsulating resin portion, wherein the heat radiation plate includes a dropout prevention portion protruding from the side surface of the heat radiation plate, the dropout prevention portion has a major surface, and the major surface of the dropout prevention portion is integrally formed with the major surface of the heat radiation plate, and wherein a concave-convex portion is formed integrally on the major surface of the dropout prevention portion and the major surface of the heat radiation plate.

* * * * *